US009825235B2

(12) United States Patent
Kadoma et al.

(10) Patent No.: US 9,825,235 B2
(45) Date of Patent: Nov. 21, 2017

(54) ORGANIC COMPOUND, LIGHT-EMITTING ELEMENT, DISPLAY MODULE, LIGHTING MODULE, LIGHT-EMITTING DEVICE, DISPLAY DEVICE, LIGHTING DEVICE, AND ELECTRONIC DEVICE

(71) Applicant: Semiconductor Energy Laboratory Co., Ltd., Kanagawa-ken (JP)

(72) Inventors: Hiroshi Kadoma, Kanagawa (JP); Satomi Mitsumori, Kanagawa (JP); Yuko Kawata, Kanagawa (JP); Takao Hamada, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 688 days.

(21) Appl. No.: 14/333,061

(22) Filed: Jul. 16, 2014

(65) Prior Publication Data

US 2015/0021577 A1    Jan. 22, 2015

(30) Foreign Application Priority Data

Jul. 19, 2013  (JP) ................................. 2013-150305

(51) Int. Cl.
| | |
|---|---|
| *H01L 51/00* | (2006.01) |
| *H01L 51/50* | (2006.01) |
| *C09K 11/06* | (2006.01) |

(52) U.S. Cl.
CPC .......... *H01L 51/0067* (2013.01); *C09K 11/06* (2013.01); *H01L 51/0072* (2013.01);
(Continued)

(58) Field of Classification Search
None
See application file for complete search history.

(56) References Cited

U.S. PATENT DOCUMENTS

| 6,603,007 B1 | 8/2003 | Shintou |
| 6,953,628 B2 | 10/2005 | Kamatani et al. |

(Continued)

FOREIGN PATENT DOCUMENTS

| JP | 2001-97950 | 4/2001 |
| JP | 2007-15933 | 1/2007 |

(Continued)

OTHER PUBLICATIONS

"Aryl." Merriam-Webster.com. Merriam-Webster, n.d. Web. Mar. 27, 2017.*

(Continued)

*Primary Examiner* — Dawn Garrett
(74) *Attorney, Agent, or Firm* — Husch Blackwell LLP

(57) ABSTRACT

A novel organic compound that can be used as a carrier-transport material, a host material, or a light-emitting material in a light-emitting element is provided. Specifically, an organic compound that can give a light-emitting element having favorable characteristics even when the organic compound is used in a light-emitting element emitting phosphorescence is provided. The organic compound has a bipyridine skeleton formed by two pyridine skeletons to each of which a dibenzothiophenyl group or a dibenzofuranyl group is bonded via an arylene group.

19 Claims, 36 Drawing Sheets

(52) U.S. Cl.
CPC ...... *H01L 51/0073* (2013.01); *H01L 51/0074* (2013.01); *H01L 51/5056* (2013.01); *H01L 51/5072* (2013.01); *H01L 51/5088* (2013.01); *H01L 51/5092* (2013.01)

(56) References Cited

U.S. PATENT DOCUMENTS

| | | | |
|---|---|---|---|
| 7,224,118 B2 | 5/2007 | Yamazaki et al. | |
| 7,420,203 B2 | 9/2008 | Tsutsui et al. | |
| 7,867,629 B2 | 1/2011 | Yamamoto et al. | |
| 8,084,145 B2 | 12/2011 | Inoue et al. | |
| 8,142,911 B2 | 3/2012 | Kadoma et al. | |
| 8,168,307 B2 | 5/2012 | Iida et al. | |
| 8,247,086 B2 | 8/2012 | Inoue et al. | |
| 9,203,037 B2 * | 12/2015 | Langer | H01L 51/0072 |
| 2007/0141387 A1 | 6/2007 | Nakano et al. | |
| 2008/0093981 A1 | 4/2008 | Nakamura et al. | |
| 2009/0066223 A1 | 3/2009 | Yabe et al. | |
| 2009/0085479 A1 * | 4/2009 | Ushikubo | H01L 51/5072 313/506 |
| 2009/0167162 A1 | 7/2009 | Lin et al. | |
| 2010/0187978 A1 | 7/2010 | Yu et al. | |
| 2010/0283043 A1 | 11/2010 | Nishimura et al. | |
| 2012/0061714 A1 | 3/2012 | Osaka et al. | |
| 2012/0104369 A1 | 5/2012 | Kawata et al. | |
| 2012/0126692 A1 | 5/2012 | Ise et al. | |
| 2013/0214260 A1 | 8/2013 | Kadoma et al. | |
| 2015/0076483 A1 * | 3/2015 | Tsurutani | H01L 51/0035 257/40 |
| 2015/0131302 A1 * | 5/2015 | Inoue | H01L 51/0072 362/382 |

FOREIGN PATENT DOCUMENTS

| | | | |
|---|---|---|---|
| JP | 4474493 B1 | | 6/2010 |
| JP | 5182441 B1 | * | 4/2013 |
| JP | 2013131518 | * | 7/2013 |
| JP | 5609641 B2 | * | 10/2014 |
| WO | WO 01/19815 A1 | | 3/2001 |
| WO | WO 2006/080229 A1 | | 8/2006 |
| WO | WO 2006/095539 A1 | | 9/2006 |
| WO | WO 2010/004877 A1 | * | 1/2010 |

OTHER PUBLICATIONS

Machine translation for JP 5609641 B2 (dated Oct. 2014).*

Yu, S.C. et al. "Synthesis and Characterization of Poly(benzobisoxazole)s and Poly(benzobisthiazole)s with 2,2'-Bipyridyl Units in the Backbone," Macromolecules, 1998, vol. 31, No. 17, pp. 5639-5646.

* cited by examiner

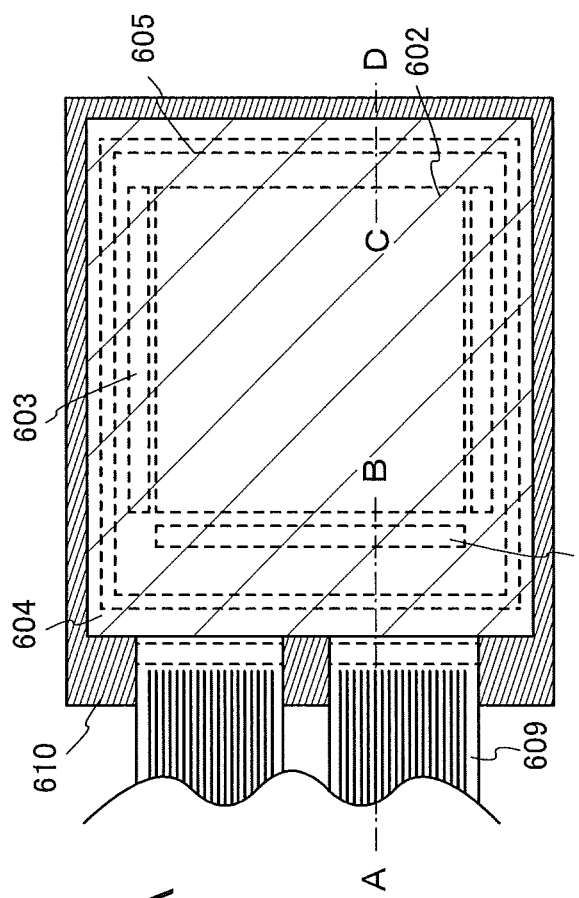
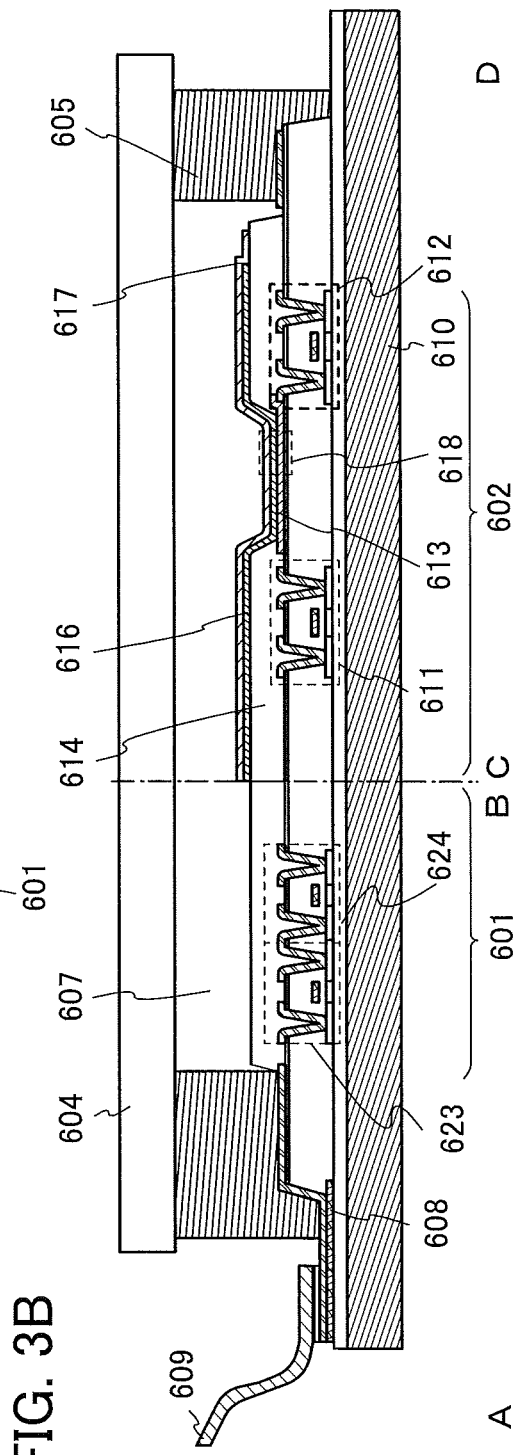
FIG. 3A
FIG. 3B

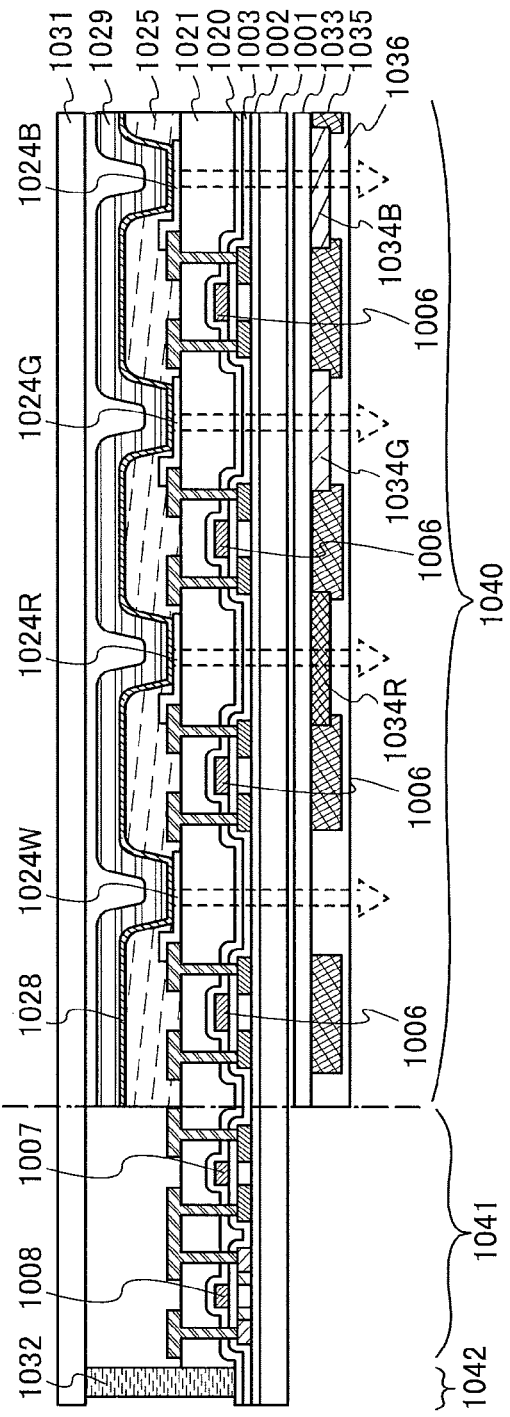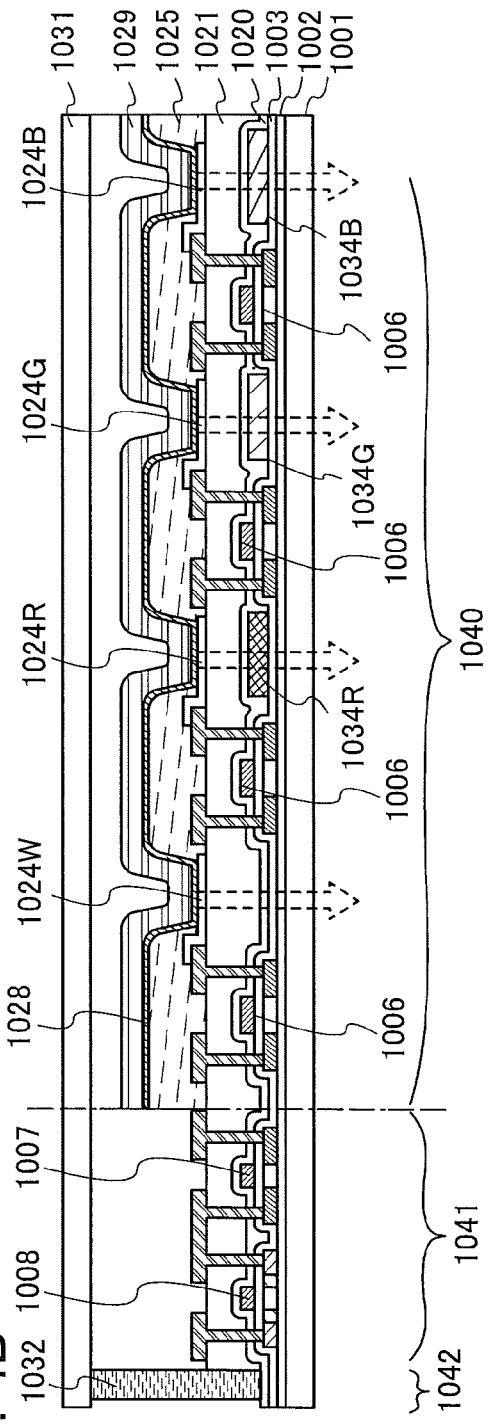

ORGANIC COMPOUND, LIGHT-EMITTING ELEMENT, DISPLAY MODULE, LIGHTING MODULE, LIGHT-EMITTING DEVICE, DISPLAY DEVICE, LIGHTING DEVICE, AND ELECTRONIC DEVICE

BACKGROUND OF THE INVENTION

1. Field of the Invention

The present invention relates to an organic compound that can be used as a light-emitting element material. The present invention relates to a light-emitting element, a display module, a lighting module, a light-emitting device, a display device, a lighting device, and an electronic device each using the organic compound.

2. Description of the Related Art

As next generation lighting devices or display devices, display devices using light-emitting elements (organic EL elements) in which organic compounds are used as light-emitting substances have been rapidly developed because of their potential for thinness, lightness, high speed response to input signals, low power consumption, and the like.

In an organic EL element, voltage application between electrodes, between which a light-emitting layer is interposed, causes recombination of electrons and holes injected from the electrodes, which brings a light-emitting substance into an excited state, and the return from the excited state to the ground state is accompanied by light emission. Since the wavelength of light emitted from a light-emitting substance depends on the light-emitting substance, use of different types of organic compounds as light-emitting substances makes it possible to obtain light-emitting elements which exhibit various wavelengths, i.e., various colors.

In the case of display devices which are used to display images, such as displays, at least three-color light, i.e., red light, green light, and blue light is necessary for reproduction of full-color images. Furthermore, in application to lighting devices, it is ideal to obtain light having wavelength components evenly spreading in the visible light region for obtaining a high color rendering property, but in reality, light obtained by mixing two or more kinds of light having different wavelengths is used for lighting application in many cases. It is known that, with a mixture of three-color light, i.e., red light, green light, and blue light, white light having a high color rendering property can be obtained.

Light emitted from a light-emitting substance is peculiar to the substance as described above. However, important performances as a light-emitting element, such as a lifetime, power consumption, and even emission efficiency, are not only dependent on the light-emitting substance but also greatly dependent on layers other than the light-emitting layer, an element structure, properties of an emission center substance and a host material, compatibility between them, carrier balance, and the like. Therefore, there is no doubt that many kinds of light-emitting element materials are necessary for a growth in this field. For the above-described reasons, light-emitting element materials with a variety of molecular structures have been suggested (e.g., see Patent Document 1).

As is generally known, the generation ratio of a singlet excited state to a triplet excited state in a light-emitting element using electroluminescence is 1:3. Therefore, a light-emitting element in which a phosphorescent material capable of converting the triplet excited state to light emission is used as an emission center substance can theoretically obtain higher emission efficiency than a light-emitting element in which a fluorescent material capable of converting the singlet excited state to light emission is used as an emission center substance.

As a host material in a host-guest type light-emitting layer or a substance contained in each transport layer in contact with a light-emitting layer, a substance having a wider band gap or a higher triplet level ($T_1$, a larger energy difference between a triplet excited state and a singlet ground state) than an emission center substance is used for efficient conversion of excitation energy into light emission from the emission center substance.

However, most substances that are used as a host material of the light-emitting element are fluorescent materials, in which electron transition between different states is forbidden. The triplet excited state of the material is at a lower energy level than the singlet excited state of the material, which means that a host material for obtaining phosphorescence needs to have a wider band gap than a host material for obtaining fluorescence of the same wavelength.

Therefore, a host material and a carrier-transport material each having a further wider band gap are necessary in order to efficiently obtain phosphorescence. However, it is extremely difficult to develop a substance to be a light-emitting element material which has such a wide band gap while enabling a balance between important characteristics of a light-emitting element, such as low driving voltage and high emission efficiency.

REFERENCE

Patent Document

[Patent Document 1] Japanese Published Patent Application No. 2007-15933

SUMMARY OF THE INVENTION

In view of the above, another object of one embodiment of the present invention is to provide a novel organic compound that can be used as a carrier-transport material, a host material, or a light-emitting material in a light-emitting element. Specifically, an object of one embodiment of the present invention is to provide an organic compound that can give a light-emitting element having favorable characteristics even when the organic compound is used in a light-emitting element emitting phosphorescence.

Another object of one embodiment of the present invention is to provide an organic compound which has a high $T_1$ level.

Another object of one embodiment of the present invention is to provide an organic compound having a high carrier-transport property.

Another object of one embodiment of the present invention is to provide a light-emitting element containing the organic compound.

Another object of one embodiment of the present invention is to provide a display module, a lighting module, a light-emitting device, a lighting device, a display device, and an electronic device each using the organic compound and achieving low power consumption.

It is only necessary that at least one of the above-described objects be achieved in the present invention.

In one embodiment of the present invention, an organic compound is provided in which two aryl groups are bonded to a pyridine skeleton or a bipyridine skeleton and a dibenzothiophenyl group or a dibenzofuranyl group is bonded to each of the aryl groups.

That is, one embodiment of the present invention is an organic compound represented by General Formula (G0).

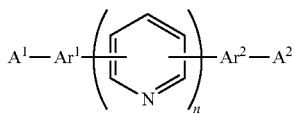
(G0)

In the formula, $A^1$ and $A^2$ separately represent any one of a dibenzofuranyl group and a dibenzothiophenyl group, and $Ar^1$ and $Ar^2$ separately represent an arylene group having 6 to 13 carbon atoms. Furthermore, n is 1 or 2.

In the organic compound represented by General Formula (G0), n is preferably 2, in which case the organic compound enables a light-emitting element to have low driving voltage. That is, another embodiment of the present invention is an organic compound represented by General Formula (G1).

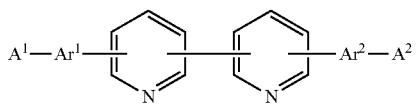
(G1)

In the formula, $A^1$ and $A^2$ separately represent any one of a dibenzothiophenyl group and a dibenzofuranyl group, and $Ar^1$ and $Ar^2$ separately represent an arylene group having 6 to 13 carbon atoms. Note that the organic compound represented by General Formula (G1) may have a substituent other than that illustrated in General Formula (G1). Specifically, $A^1$ and $A^2$ may separately represent any one of a substituted dibenzothiophenyl group and a substituted dibenzofuranyl group, and $Ar^1$ and $Ar^2$ may separately represent a substituted arylene group having 6 to 13 carbon atoms. Furthermore, the bipyridine skeleton in General Formula (G1) may have a substituent. Examples of the substituent include an alkyl group having 1 to 6 carbon atoms and an aryl group having 6 to 13 carbon atoms.

Furthermore, in the organic compound represented by General Formula (G1), the arylene groups are preferably bonded to the 4-positions of the dibenzofuranyl and/or dibenzothiophenyl groups. That is, another embodiment of the present invention is an organic compound represented by General Formula (G2).

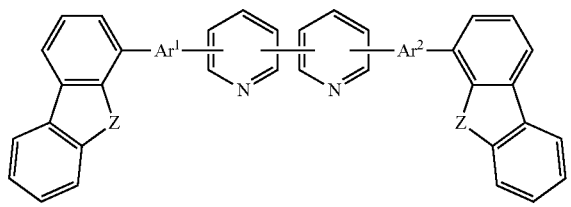
(G2)

In the formula, $Ar^1$ and $Ar^2$ separately represent an arylene group having 6 to 13 carbon atoms, and Z represents any one of an oxygen atom and a sulfur atom. Note that the organic compound represented by General Formula (G2) may have a substituent other than that illustrated in General Formula (G2). Examples of the substituent include an alkyl group having 1 to 6 carbon atoms and an aryl group having 6 to 13 carbon atoms.

Furthermore, in the organic compound represented by General Formula (G2), the bipyridine skeleton is preferably a 2,2'-bipyridine skeleton. That is, another embodiment of the present invention is an organic compound represented by General Formula (G3).

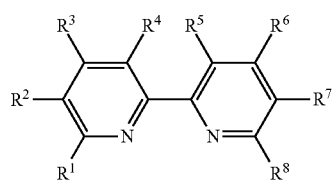
(G3)

In the formula, one of $R^1$ to $R^4$ is a group represented by General Formula (A-1) and the others of $R^1$ to $R^4$ separately represent any one of hydrogen, an alkyl group having 1 to 6 carbon atoms, and an aryl group having 6 to 13 carbon atoms; and one of $R^5$ to $R^8$ is a group represented by General Formula (A-2) and the others of $R^5$ to $R^8$ separately represent any one of hydrogen, an alkyl group having 1 to 6 carbon atoms, and an aryl group having 6 to 13 carbon atoms.

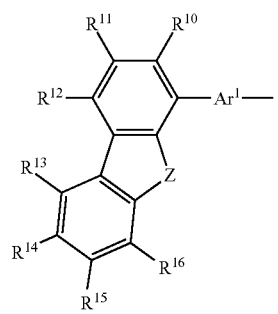
(A-1)

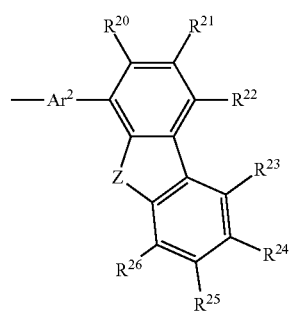
(A-2)

In General Formulae (A-1) and (A-2), $R^{10}$ to $R^{16}$ and $R^{20}$ to $R^{26}$ separately represent any one of hydrogen, an alkyl group having 1 to 6 carbon atoms, and an aryl group having 6 to 13 carbon atoms. Furthermore, $Ar^1$ and $Ar^2$ separately represent an arylene group having 6 to 13 carbon atoms, and Z represents any one of an oxygen atom and a sulfur atom.

In the organic compound represented by General Formula (G3), it is preferable that $Ar^1$ and $Ar^2$ be each an m-phenylene group. That is, another embodiment of the present invention is an organic compound represented by General Formula (G4).

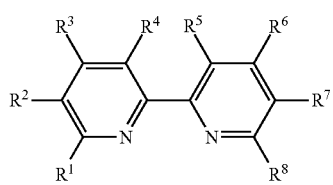

(G4)

In the formula, one of $R^1$ to $R^4$ is a group represented by General Formula (A-3) and the others of $R^1$ to $R^4$ separately represent any one of hydrogen, an alkyl group having 1 to 6 carbon atoms, and an aryl group having 6 to 13 carbon atoms; and one of $R^5$ to $R^8$ is a group represented by General Formula (A-4) and the others of $R^5$ to $R^8$ separately represent any one of hydrogen, an alkyl group having 1 to 6 carbon atoms, and an aryl group having 6 to 13 carbon atoms.

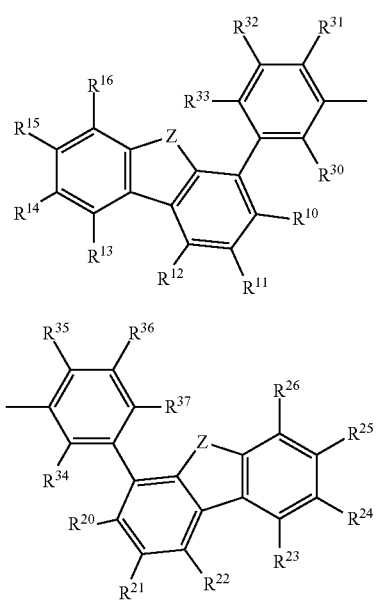

(A-3)

(A-4)

In General Formulae (A-3) and (A-4), $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

In General Formula (G4), it is preferable that the groups represented by General Formulae (A-3) and (A-4) be bonded to the 4-position and the 4'-position of the bipyridine skeleton. That is, another embodiment of the present invention is an organic compound represented by General Formula (G5).

In General Formula (G5), $R^1$, $R^2$, $R^4$, $R^5$, $R^7$, $R^8$, $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

An organic compound represented by General Formula (G0) in which n is 1 can be represented by General Formula (G6).

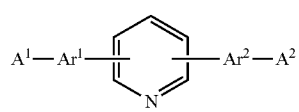

(G6)

In the formula, $A^1$ and $A^2$ separately represent any one of a dibenzofuranyl group and a dibenzothiophenyl group, and $Ar^1$ and $Ar^2$ separately represent an arylene group having 6 to 13 carbon atoms. Note that the organic compound represented by General Formula (G6) may have a substituent other than that illustrated in General Formula (G6). Examples of the substituent include an alkyl group having 1 to 6 carbon atoms and an aryl group having 6 to 13 carbon atoms.

Furthermore, in the organic compound represented by General Formula (G6), the arylene groups are preferably bonded to the 4-positions of the dibenzofuranyl and/or dibenzothiophenyl groups. That is, another embodiment of the present invention is an organic compound represented by General Formula (G7).

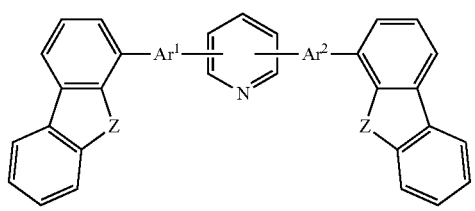

(G7)

In the formula, $Ar^1$ and $Ar^2$ separately represent an arylene group having 6 to 13 carbon atoms, and Z represents any one of an oxygen atom and a sulfur atom. Note that the organic compound represented by General Formula (G7) may have a substituent other than that illustrated in General Formula (G7). Examples of the substituent include an alkyl group having 1 to 6 carbon atoms and an aryl group having 6 to 13 carbon atoms.

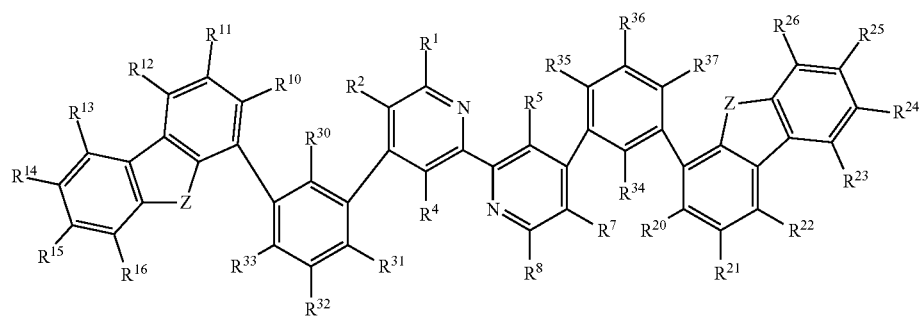

(G5)

The organic compound represented by General Formula (G7) can also be represented by General Formula (G8).

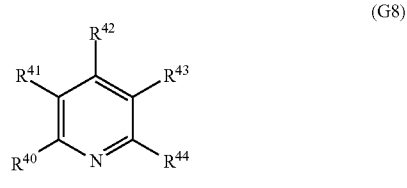
(G8)

In the formula, one of $R^{40}$ to $R^{44}$ is a group represented by General Formula (A-1), another of $R^{40}$ to $R^{44}$ is a group represented by General Formula (A-2), and the others of $R^{40}$ to $R^{44}$ separately represent any one of hydrogen, an alkyl group having 1 to 6 carbon atoms, and an aryl group having 6 to 13 carbon atoms.

nylene group. That is, another embodiment of the present invention is an organic compound represented by General Formula (G9).

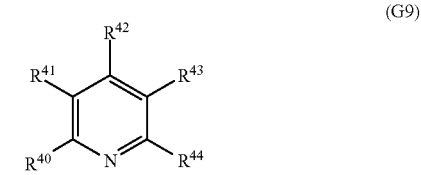
(G9)

In the formula, one of $R^{40}$ to $R^{44}$ is a group represented by General Formula (A-3), another of $R^{40}$ to $R^{44}$ is a group represented by General Formula (A-4), and the others of $R^{40}$ to $R^{44}$ separately represent any one of hydrogen, an alkyl group having 1 to 6 carbon atoms, and an aryl group having 6 to 13 carbon atoms.

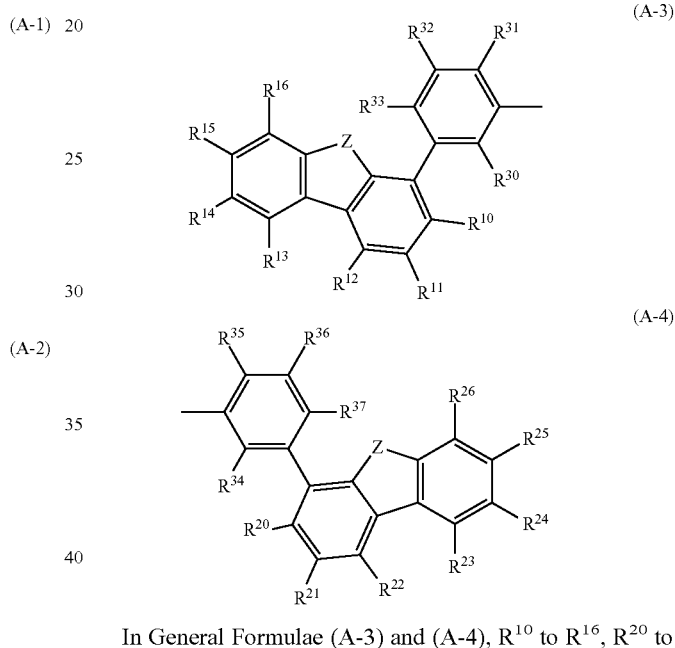

In General Formulae (A-1) and (A-2), $R^{10}$ to $R^{16}$ and $R^{20}$ to $R^{26}$ separately represent any one of hydrogen, an alkyl group having 1 to 6 carbon atoms, and an aryl group having 6 to 13 carbon atoms. Furthermore, $Ar^1$ and $Ar^2$ separately represent an arylene group having 6 to 13 carbon atoms, and Z represents any one of an oxygen atom and a sulfur atom.

In the organic compound represented by General Formula (G8), it is preferable that $Ar^1$ and $Ar^2$ be each an m-phe- In General Formulae (A-3) and (A-4), $R^{10}$ to $R^{16}$, $R^{20}$ to $R^{26}$, and $R^{30}$ to $R^{37}$ to separately represent any one of hydrogen, an alkyl group having 1 to 6 carbon atoms, and an aryl group having 6 to 13 carbon atoms. Furthermore, Z represents any one of an oxygen atom and a sulfur atom.

In General Formula (G9), it is preferable that the group represented by General Formula (A-3) and the group represented by General Formula (A-4) be bonded to the 3-position and the 5-position of the pyridine at the center. That is, another embodiment of the present invention is an organic compound represented by General Formula (G10).

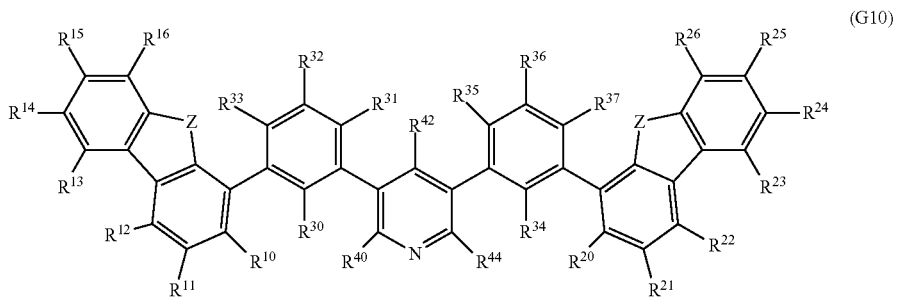
(G10)

In the formula, $R^{40}$, $R^{42}$, $R^{44}$, $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

Another embodiment of the present invention is an organic compound represented by Structural Formula (100).

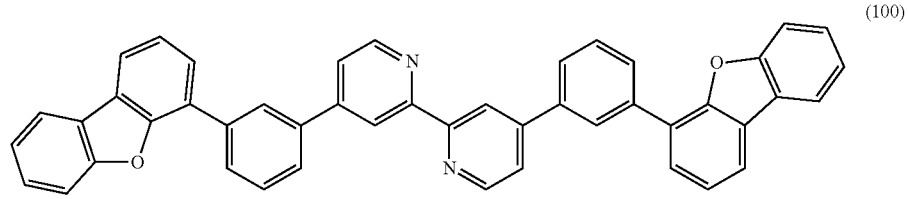

(100)

Another embodiment of the present invention is an organic compound represented by Structural Formula (200).

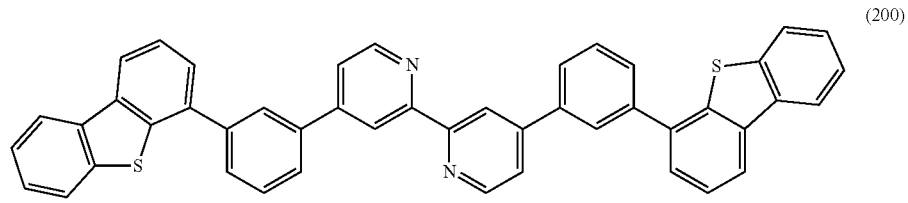 [SMILES: c1cc(-c2ccnc(-c3cc(-c4cccc(-c5cccc6c5oc5ccccc56)c4)ccn3)c2)cc(-c2cccc3c2oc2ccccc23)c1]

(200)

Another embodiment of the present invention is an organic compound represented by Structural Formula (300).

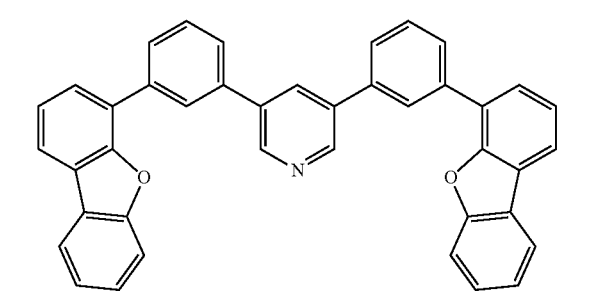

(300)

Another embodiment of the present invention is an organic compound represented by Structural Formula (400).

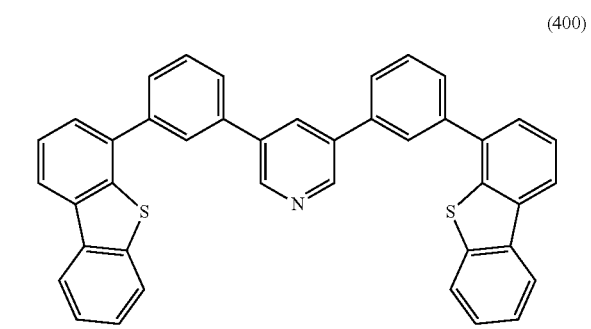

(400)

Another embodiment of the present invention is a light-emitting element that includes a pair of electrodes and a layer containing an organic compound between the pair of electrodes. The layer containing the organic compound contains any one of the above organic compounds.

Another embodiment of the present invention is a light-emitting element that includes a pair of electrodes and a layer containing an organic compound between the pair of electrodes. The layer containing the organic compound includes at least a light-emitting layer. The light-emitting layer contains any one of the above organic compounds.

Another embodiment of the present invention is a display module including the light-emitting element with any one of the above structures.

Another embodiment of the present invention is a lighting module including the light-emitting element with any one of the above structures.

Another embodiment of the present invention is a light-emitting device including the light-emitting element with any one of the above structures and a unit for controlling the light-emitting element.

Another embodiment of the present invention is a display device including the light-emitting element with any one of the above structures in a display portion, and a unit for controlling the light-emitting element.

Another embodiment of the present invention is a lighting device including the light-emitting element with any one of the above structures in a lighting portion, and a unit for controlling the light-emitting element.

Another embodiment of the present invention is an electronic device including the light-emitting element with any one of the above structures.

A light-emitting element of the present invention has high emission efficiency.

The organic compound of the present invention has a wide band gap. Furthermore, the organic compound has a high carrier-transport property. Accordingly, the organic compound can be suitably used in a light-emitting element, as a material of a transport layer, a host material in a light-emitting layer, or an emission center substance in the light-emitting layer.

Another embodiment of the present invention can provide a display module, a lighting module, a light-emitting device, a lighting device, a display device, and an electronic device each using the organic compound and achieving low power consumption.

BRIEF DESCRIPTION OF THE DRAWINGS

FIGS. 3A and 3B are conceptual diagrams of an active matrix light-emitting device.

FIGS. 4A and 4B are conceptual diagrams of an active matrix light-emitting device.

DETAILED DESCRIPTION OF THE INVENTION

Figure 1A:
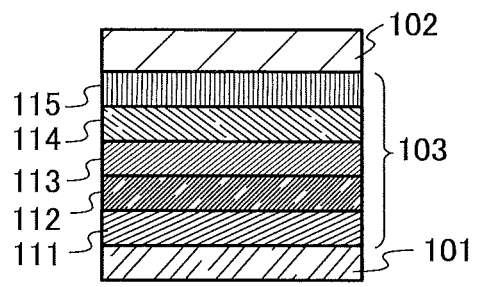
FIGS. 1A and 1B are conceptual diagrams of light-emitting elements.

Embodiments of the present invention will be described below. It is easily understood by those skilled in the art that modes and details disclosed herein can be modified in various ways without departing from the spirit and the scope of the present invention. Therefore, the present invention is not interpreted as being limited to the description of the following embodiments.

(Embodiment 1)

In an organic compound in this embodiment, two aryl groups are bonded to a pyridine skeleton or a bipyridine skeleton and a dibenzothiophenyl group or a dibenzofuranyl group is bonded to each of the aryl groups. The organic compound has a wide band gap and a high triplet level. Moreover, the organic compound has a high carrier-transport property. Note that this organic compound can be regarded as an organic compound in which two dibenzothiophenyl groups, two dibenzofuranyl groups, or a dibenzothiophenyl group and a dibenzofuranyl group are bonded to a pyridine skeleton or a bipyridine skeleton via arylene groups.

Therefore, a light-emitting element containing the organic compound can have a high emission efficiency.

The arylene group of the above organic compound is preferably an arylene group having 6 to 13 carbon atoms. Examples of the arylene group having 6 to 13 carbon atoms include a phenylene group, a naphthalenediyl group, a biphenyldiyl group, and a fluorenediyl group, and in particular, a phenylene group, a biphenyldiyl group, and a fluorenediyl group are preferable to give a high triplet level.

Among these groups, a phenylene group, specifically, an m-phenylene group is favorable.

When the central skeleton is a bipyridine skeleton, it is preferably a 2,2'-bipyridine skeleton.

In the organic compound of one embodiment of the present invention in which the central skeleton is a 2,2'-bipyridine skeleton, the arylene groups to each of which a dibenzothiophenyl group or a dibenzofuranyl group is bonded are preferably bonded to the 4-position and the 4'-position of the 2,2'-bipyridine skeleton.

When the central skeleton is a pyridine skeleton, the arylene groups to each of which a dibenzothiophenyl group or a dibenzofuranyl group is bonded are preferably bonded to the 3-position and the 5-position of the pyridine skeleton, in which case the use of the organic compound as a material of a light-emitting element leads to a reduction in driving voltage.

In the organic compound, the arylene groups are preferably bonded to the 4-positions of the dibenzothiophenyl and/or dibenzofuranyl groups.

Note that each of these organic compounds may have a substituent, and the substituent can be an alkyl group having 1 to 6 carbon atoms, an aryl group having 6 to 13 carbon atoms, or the like.

Since the organic compound with such a structure has a wide band gap, in a light-emitting element, the organic compound can be suitably used as a host material in a light-emitting layer whose emission center substance emits blue fluorescence or fluorescence having a shorter wavelength than blue fluorescence, or can be suitably used for a carrier-transport layer that is adjacent to the light-emitting layer. Since the organic compound also has a high triplet level, the organic compound can be suitably used as a host material in a light-emitting layer whose emission center substance emits phosphorescence, or can be suitably used for a carrier-transport layer that is adjacent to the light-emitting layer. The organic compound has a wide band gap or a high triplet level ($T_1$ level), so that the energy of carriers that recombine at a host material can be effectively transferred to an emission center substance. Thus, a light-emitting element having a high emission efficiency can be manufactured.

The organic compound can be suitably used as a host material or for a carrier-transport layer in a light-emitting element due to its high carrier-transport property. Since the organic compound has a high carrier-transport property, a light-emitting element with low driving voltage can be manufactured. Furthermore, in the case where the organic compound is used for a carrier-transport layer closer to a light-emitting region in a light-emitting layer, loss of excitation energy of an emission center substance can be suppressed because of a wide band gap or a high triplet level of the organic compound, so that a light-emitting element having a high emission efficiency can be obtained.

The above organic compound of one embodiment of the present invention can also be represented by General Formula (G0).

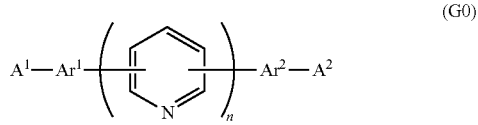

(G0)

In the formula, $A^1$ and $A^2$ separately represent any one of a dibenzofuranyl group and a dibenzothiophenyl group, and $Ar^1$ and $Ar^2$ separately represent an arylene group having 6 to 13 carbon atoms. Furthermore, n is 1 or 2. Note that the organic compound represented by General Formula (G0) may be substituted or unsubstituted; when the organic compound has a substituent, the substituent is an alkyl group having 1 to 6 carbon atoms or an aryl group having 6 to 13 carbon atoms.

In the organic compound represented by General Formula (G0), n is preferably 2, in which case the organic compound enables a light-emitting element to have low driving voltage. This organic compound can be represented by General Formula (G1).

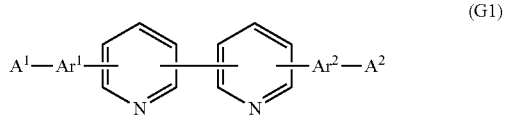

(G1)

In the formula, $A^1$ and $A^2$ separately represent any one of a dibenzothiophenyl group and a dibenzofuranyl group, and $Ar^1$ and $Ar^2$ separately represent an arylene group having 6 to 13 carbon atoms. Note that the organic compound represented by General Formula (G1) may be substituted or unsubstituted; when the organic compound has a substituent, the substituent is an alkyl group having 1 to 6 carbon atoms or an aryl group having 6 to 13 carbon atoms.

In the organic compound represented by General Formula (G1), $Ar^1$ and $Ar^2$ are preferably bonded to the 4-positions of the dibenzothiophenyl and/or dibenzofuranyl groups, and an organic compound having such a structure can be represented by General Formula (G2).

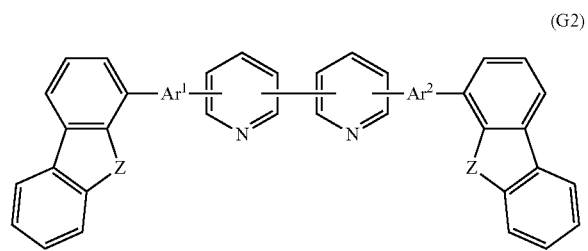

(G2)

In the formula, $Ar^1$ and $Ar^2$ separately represent an arylene group having 6 to 13 carbon atoms. Furthermore, Z represents any one of an oxygen atom and a sulfur atom. Note that the organic compound represented by General Formula (G2) may be substituted or unsubstituted; when the organic compound has a substituent, the substituent is an alkyl group having 1 to 6 carbon atoms or an aryl group having 6 to 13 carbon atoms.

In the organic compound represented by General Formula (G2), $Ar^1$ and $Ar^2$ are bonded to the 4-positions of the dibenzofuranyl and/or dibenzothiophenyl groups. By having this structure, the organic compound represented by General Formula (G2) can be easily synthesized and highly cost-effective.

The above organic compound can also be represented by General Formula (G3).

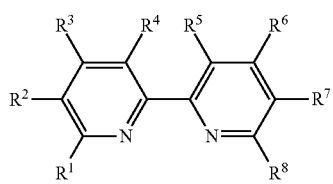

(G3)

In General Formula (G3), one of $R^1$ to $R^4$ is a group represented by General Formula (A-1) and the others of $R^1$ to $R^4$ separately represent any one of hydrogen, an alkyl group having 1 to 6 carbon atoms, and an aryl group having 6 to 13 carbon atoms. Moreover, one of $R^5$ to $R^8$ is a group represented by General Formula (A-2) and the others of $R^5$ to $R^8$ separately represent any one of hydrogen, an alkyl group having 1 to 6 carbon atoms, and an aryl group having 6 to 13 carbon atoms.

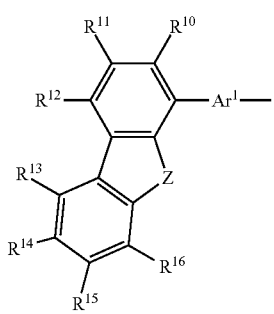

(A-1)

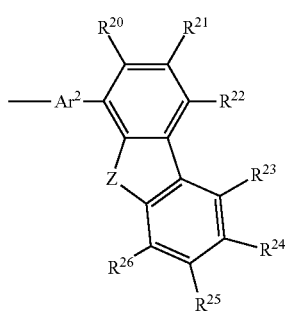

(A-2)

In General Formulae (A-1) and (A-2), $R^{10}$ to $R^{16}$ and $R^{20}$ to $R^{26}$ separately represent any one of hydrogen, an alkyl group having 1 to 6 carbon atoms, and an aryl group having 6 to 13 carbon atoms. Furthermore, $Ar^1$ and $Ar^2$ separately represent an arylene group having 6 to 13 carbon atoms, and Z represents any one of an oxygen atom and a sulfur atom.

In the organic compound of one embodiment of the present invention described in this embodiment, the arylene group is preferably any of a phenylene group and a biphenyldiyl group, and in particular, the phenylene group is further preferable.

It is preferable that the bipyridine skeleton and the dibenzofuranyl and/or dibenzothiophenyl groups be bonded by $Ar^1$ and $Ar^2$ not linearly to each other but bonded to each other so as to form a folded structure. This is because an interaction between orbits of the two skeletons can be decreased, the band gap width can be increased, and the triplet level can be increased. For example, when $Ar^1$ and $Ar^2$ are each a phenylene group, an m-phenylene group is preferred to a p-phenylene group. When $Ar^1$ and $Ar^2$ are each a biphenyldiyl group, a 1,1'-biphenyl-3,3'-diyl group is preferable.

That is, the above organic compound can be represented by General Formula (G4).

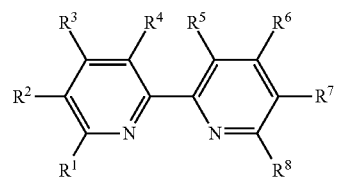

(G4)

In General Formula (G4), one of $R^1$ to $R^4$ is a group represented by General Formula (A-3) and the others of $R^1$ to $R^4$ separately represent any one of hydrogen, an alkyl group having 1 to 6 carbon atoms, and an aryl group having 6 to 13 carbon atoms; and one of $R^5$ to $R^8$ is a group represented by General Formula (A-4) and the others of $R^5$ to $R^8$ separately represent any one of hydrogen, an alkyl group having 1 to 6 carbon atoms, and an aryl group having 6 to 13 carbon atoms.

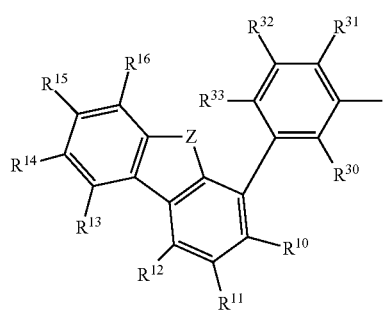

(A-3)

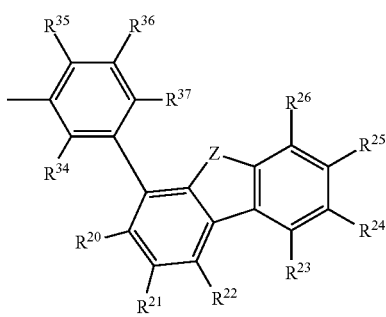

(A-4)

In General Formulae (A-3) and (A-4), $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

In the organic compound represented by General Formula (G4), it is preferable that the group represented by General Formula (A-3) and the group represented by General Formula (A-4) be bonded to the 4-position and the 4'-position of the bipyridine skeleton. That is, an organic compound represented by General Formula (G5) is preferable.

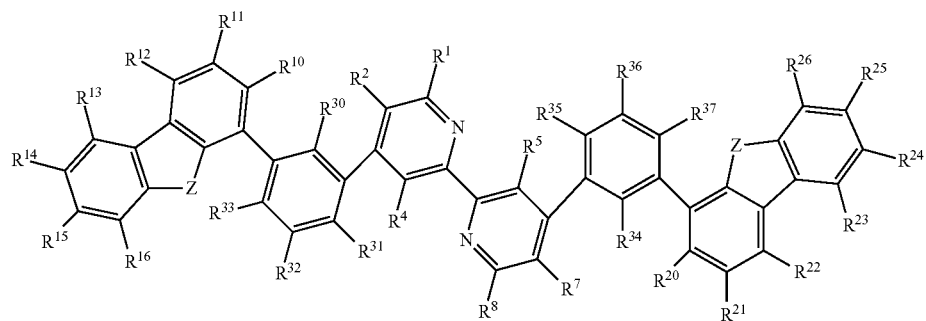

(G5)

In General Formula (G5), $R^1$, $R^2$, $R^4$, $R^5$, $R^7$, $R^8$, $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

In the organic compound represented by General Formula (G5), the phenyl groups to which the dibenzofuranyl and/or dibenzothiophenyl groups are bonded are bonded to the 4-position and the 4'-position of the 2,2'-bipyridine skeleton.

Note that each of $R^1$ to $R^8$, $R^{10}$ to $R^{16}$, $R^{20}$ to $R^{26}$, and $R^{30}$ to $R^{37}$ is preferably hydrogen, because synthesis can be carried out at low cost due to the easiness in synthesis and availability of a raw material.

An organic compound represented by General Formula (G0) in which n is 1 can also be represented by General Formula (G6).

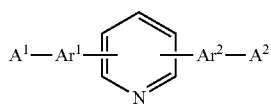

(G6)

In the general formula, $A^1$ and $A^2$ separately represent any one of a dibenzofuranyl group and a dibenzothiophenyl group, and $Ar^1$ and $Ar^2$ separately represent an arylene group having 6 to 13 carbon atoms. Note that the organic compound represented by General Formula (G6) may have a substituent other than that illustrated in General Formula (G6). Examples of the substituent include an alkyl group having 1 to 6 carbon atoms and an aryl group having 6 to 13 carbon atoms.

In the above organic compound, $Ar^1$ and $Ar^2$ are preferably bonded to the 4-positions of the dibenzothiophenyl and/or dibenzofuranyl groups, and an organic compound having such a structure can be represented by General Formula (G7).

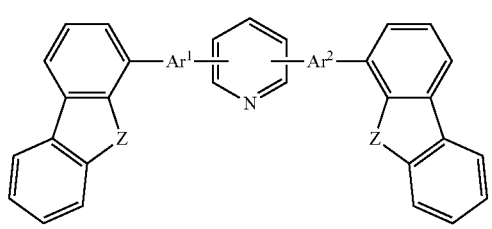

(G7)

In the general formula, $Ar^1$ and $Ar^2$ separately represent an arylene group having 6 to 13 carbon atoms, and Z represents any one of an oxygen atom and a sulfur atom. Note that the organic compound represented by General Formula (G7) may have a substituent other than that illustrated in General Formula (G7). Examples of the substituent include an alkyl group having 1 to 6 carbon atoms and an aryl group having 6 to 13 carbon atoms.

The organic compound represented by General Formula (G7) can also be represented by General Formula (G8).

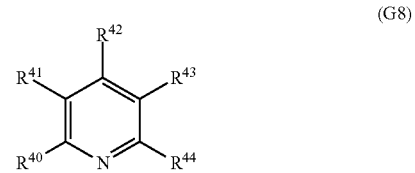

(G8)

In General Formula (G8), one of $R^{40}$ to $R^{44}$ is a group represented by General Formula (A-1), another of $R^{40}$ to $R^{44}$ is a group represented by General Formula (A-2), and the others of $R^{40}$ to $R^{44}$ separately represent any one of hydrogen, an alkyl group having 1 to 6 carbon atoms, and an aryl group having 6 to 13 carbon atoms.

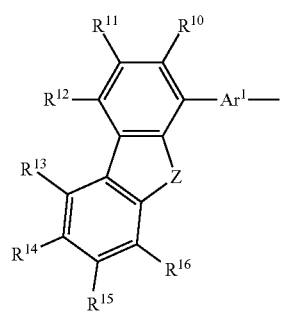

(A-1)

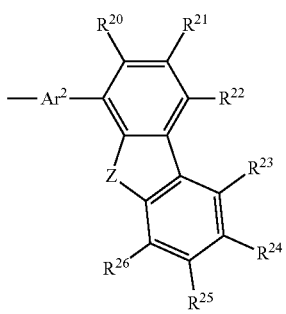

(A-2)

In General Formulae (A-1) and (A-2), $R^{10}$ to $R^{16}$ and $R^{20}$ to $R^{26}$ separately represent any one of hydrogen, an alkyl group having 1 to 6 carbon atoms, and an aryl group having 6 to 13 carbon atoms. Furthermore, $Ar^1$ and $Ar^2$ separately represent an arylene group having 6 to 13 carbon atoms, and Z represents any one of an oxygen atom and a sulfur atom.

In the organic compound represented by General Formula (G8), it is preferable that $Ar^1$ and $Ar^2$ be each an m-phenylene group because a triplet level is not easily reduced. That is, an organic compound represented by General Formula (G9) is preferable.

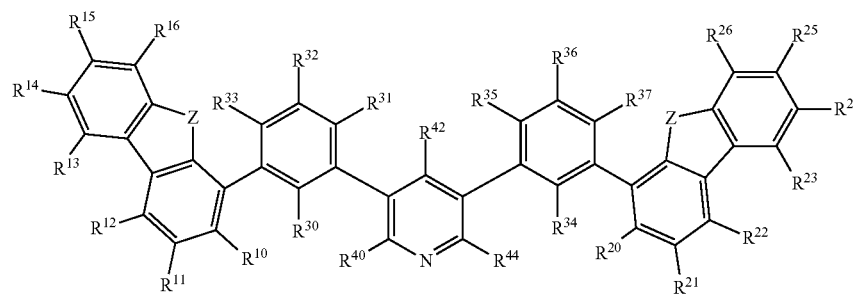

(G10)

In General Formula (G9), it is preferable that the group represented by General Formula (A-3) and the group represented by General Formula (A-4) be bonded to the 3-position and the 5-position of the pyridine skeleton. That is, an organic compound represented by General Formula (G10) is preferable.

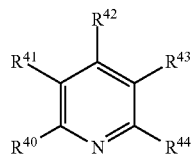

(G9)

In the general formula, one of $R^{40}$ to $R^{44}$ is a group represented by General Formula (A-3), another of $R^{40}$ to $R^{44}$ is a group represented by General Formula (A-4), and the others of $R^{40}$ to $R^{44}$ separately represent any one of hydrogen, an alkyl group having 1 to 6 carbon atoms, and an aryl group having 6 to 13 carbon atoms.

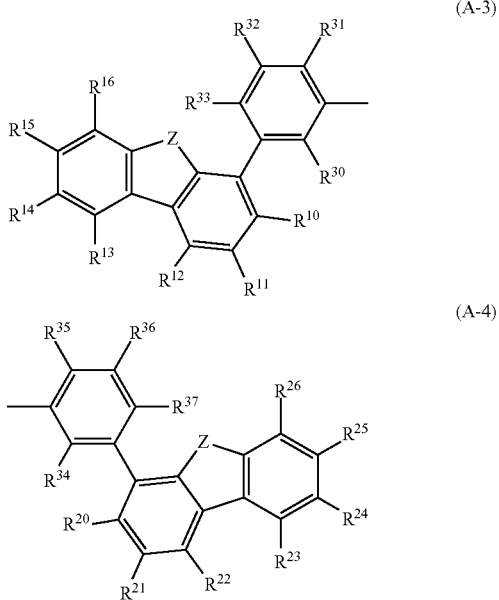

In General Formulae (A-3) and (A-4), $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

In General Formula (G10), $R^{40}$, $R^{42}$, $R^{44}$, $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms. Furthermore, Z represents any one of an oxygen atom and a sulfur atom.

Note that in the explanation of the organic compounds represented by General Formulae (G0) to (G10), specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group. Specific examples of the aryl group having 6 to 13 carbon atoms include a phenyl group, a biphenyl group, a fluorenyl group, and a naphthyl group. Note that such substituents may be bonded to each other and form a ring. As an example of such a case, a spirofluorene skeleton is formed in such a manner that a carbon atom at the 9-position of a fluorenyl group has two phenyl groups as substituents and these phenyl groups are bonded to each other.

Specific examples of the arylene groups having 6 to 13 carbon atoms that are represented by $Ar^1$ and $Ar^2$ include a phenylene group, a naphthalenediyl group, a biphenyldiyl group, and a fluorenediyl group, and in particular, a phenylene group, a biphenyldiyl group, and a fluorenediyl group are preferable to give a high triplet level.

Specific examples of structures of the organic compounds represented by General Formulae (G0) to (G10) are represented by Structural Formulae (100) to (127), (200) to (227), (300) to (327), and (400) to (427).

(100)
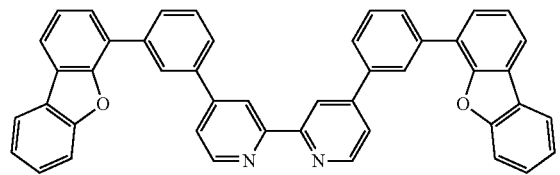
(101)
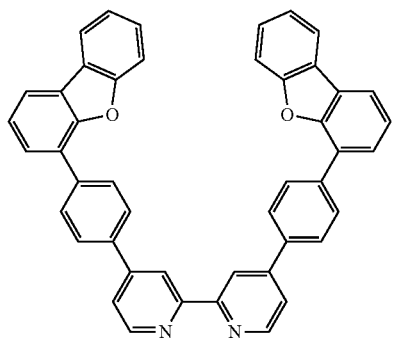
(102)
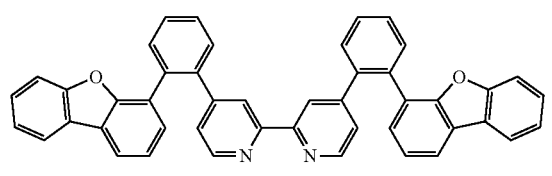
(103)
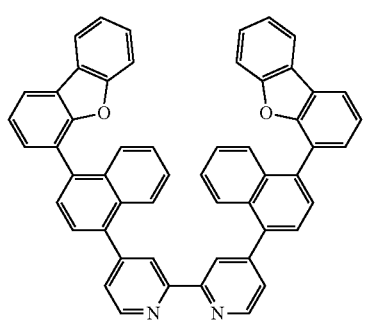
(104)
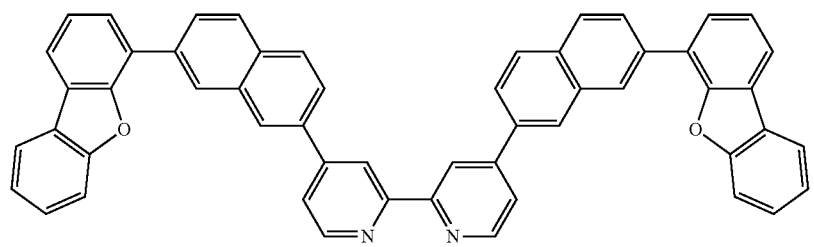
(105)
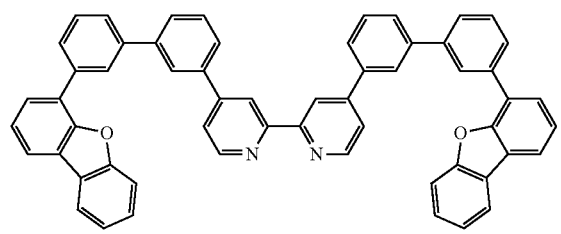
(106)
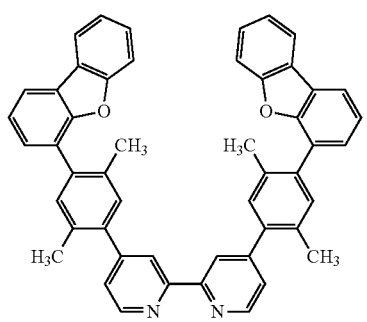
(107)
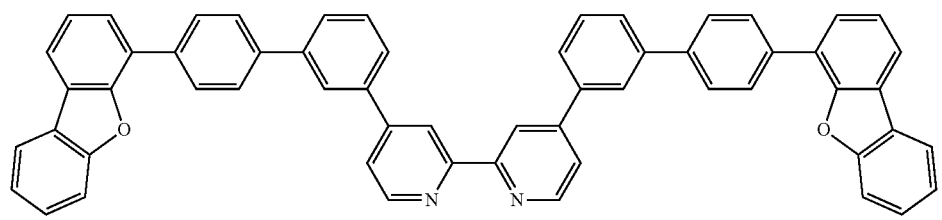

(108)
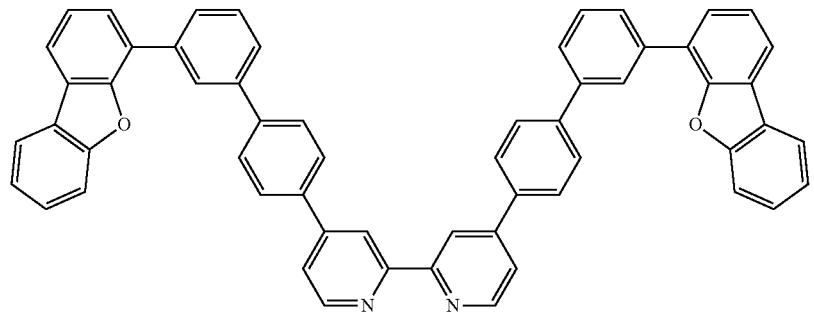
(109)
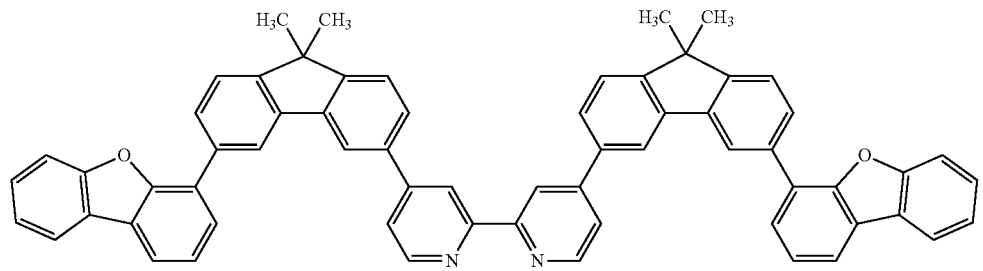
(110)
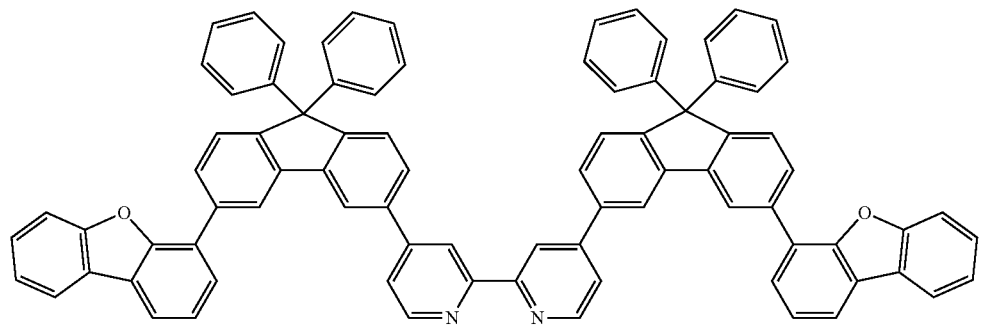
(111)
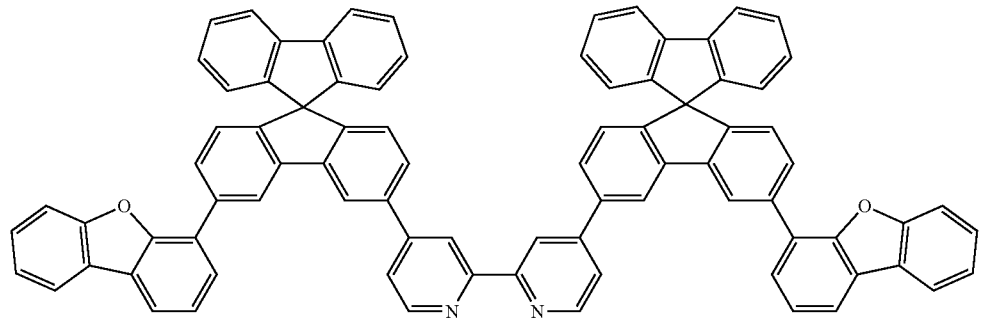
(112)
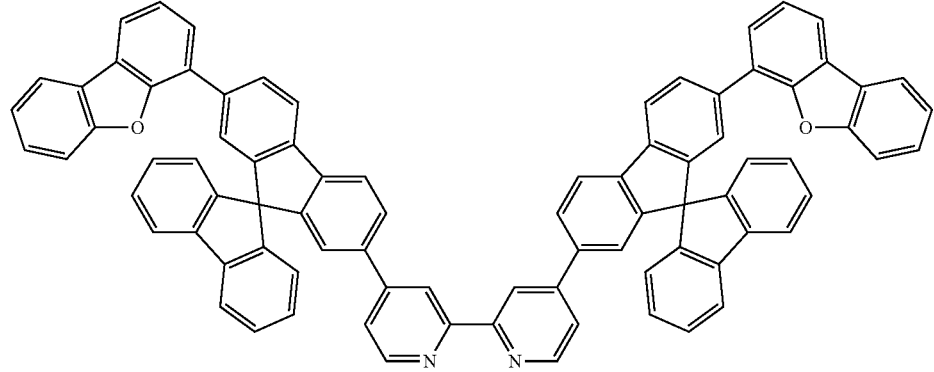

(113) 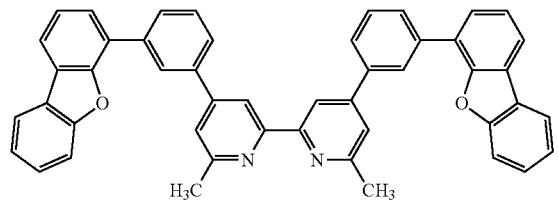
(114) 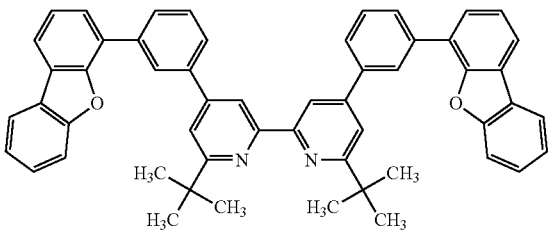
(115) 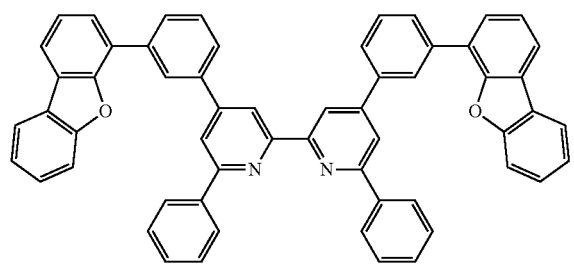
(116) 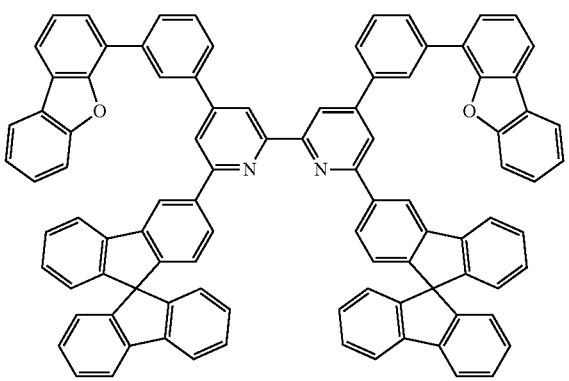
(117) 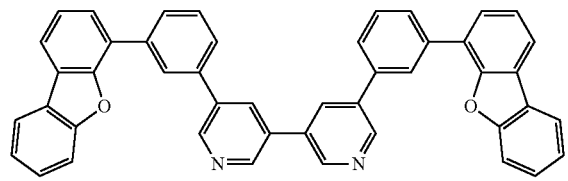
(118) 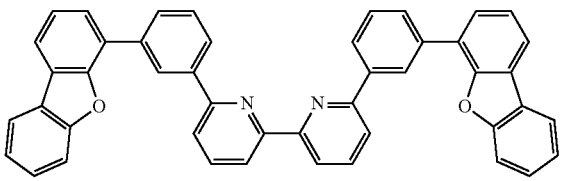
(119) 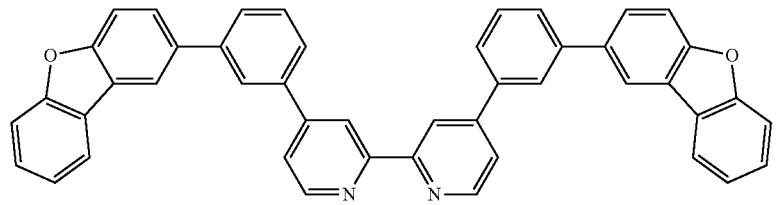
(120) 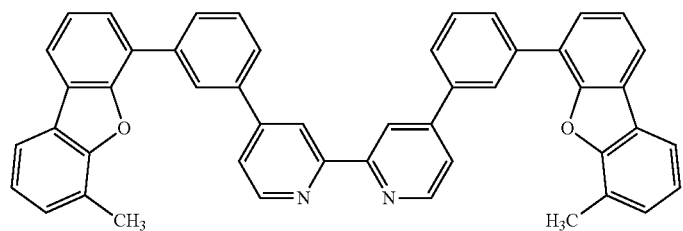
(121) 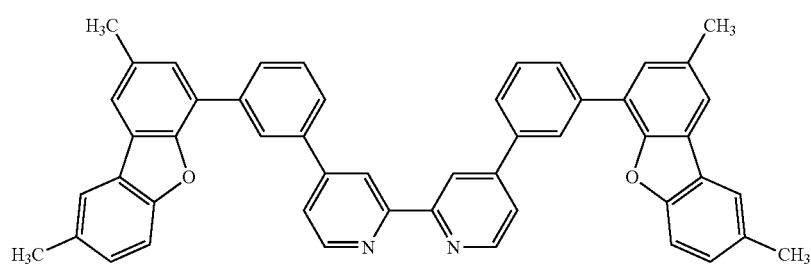

(122)
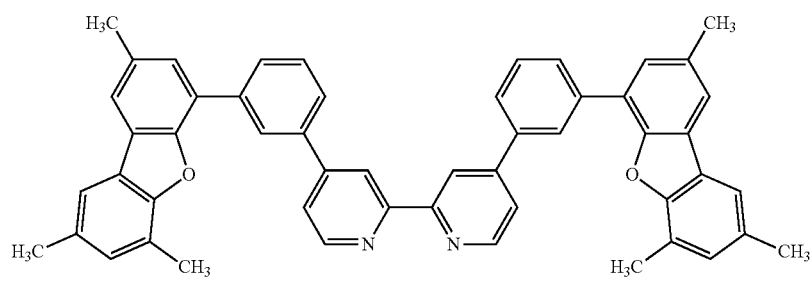
(123)
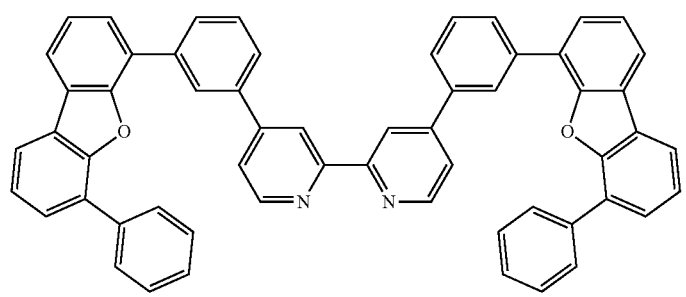
(124)
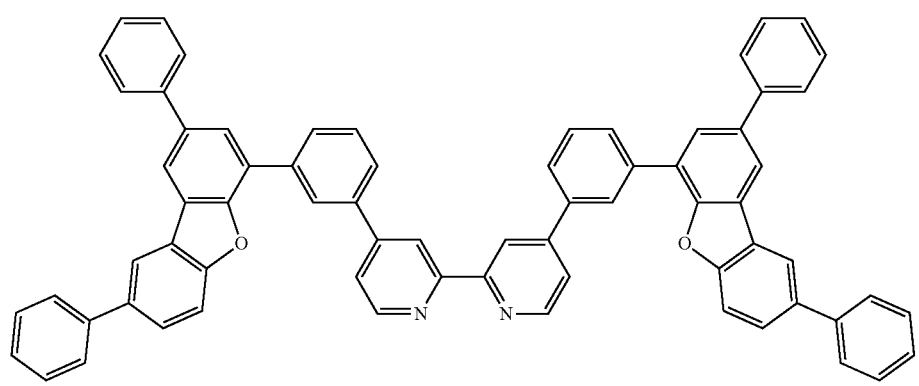
(125)
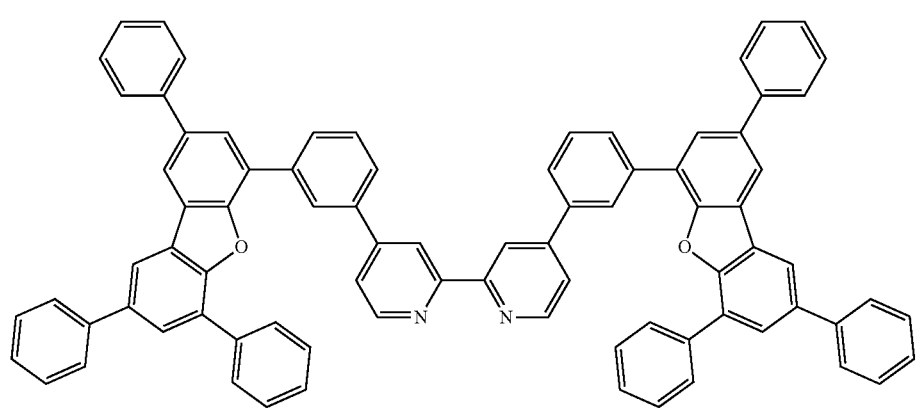

-continued
(126) 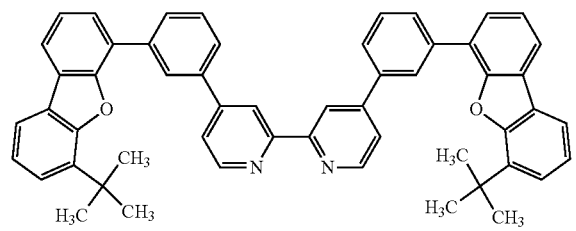
(127) 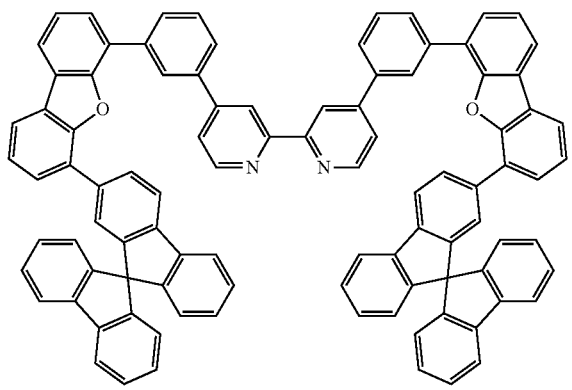
(200) 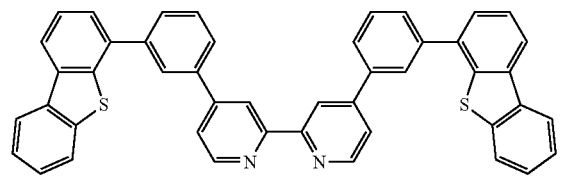
(201) 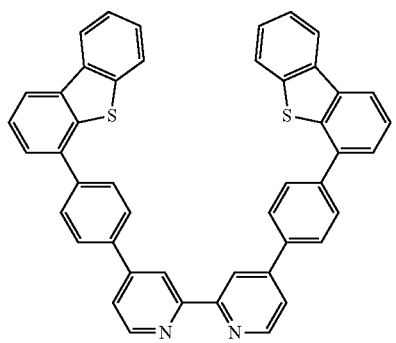
(202) 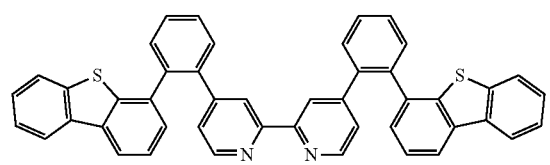
(203) 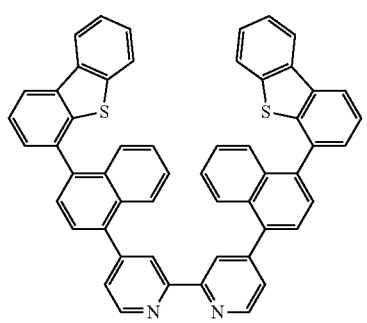
(204) 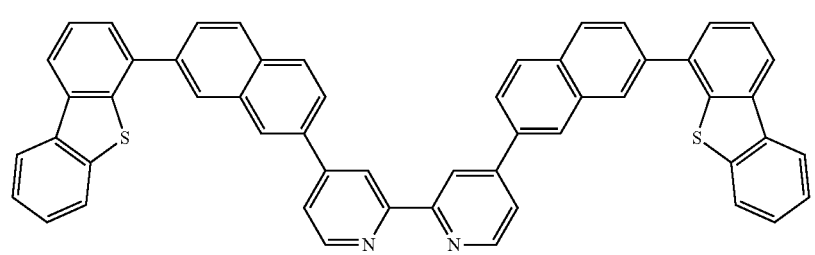

-continued
(205)
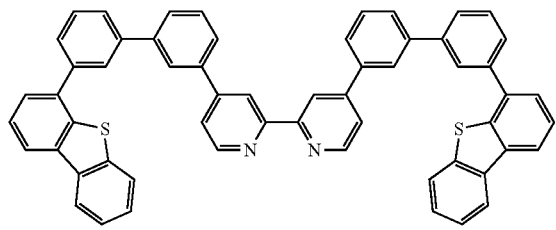
(206)
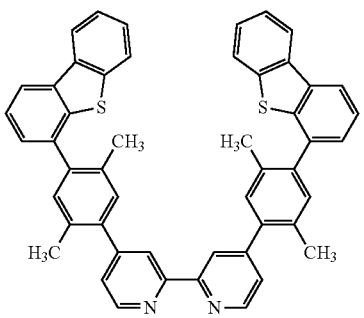
(207)
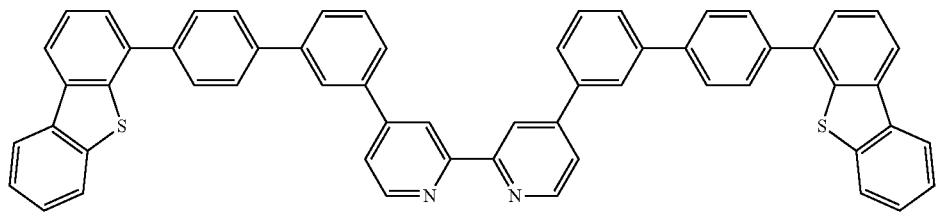
(208)
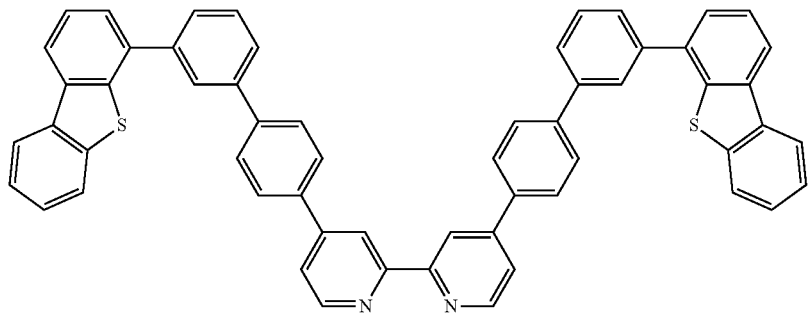
(209)
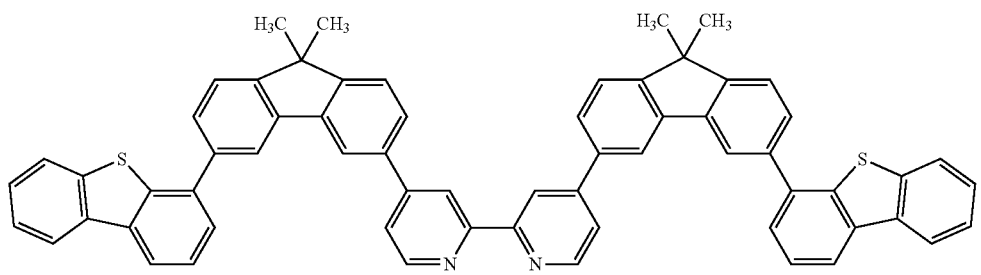
(210)
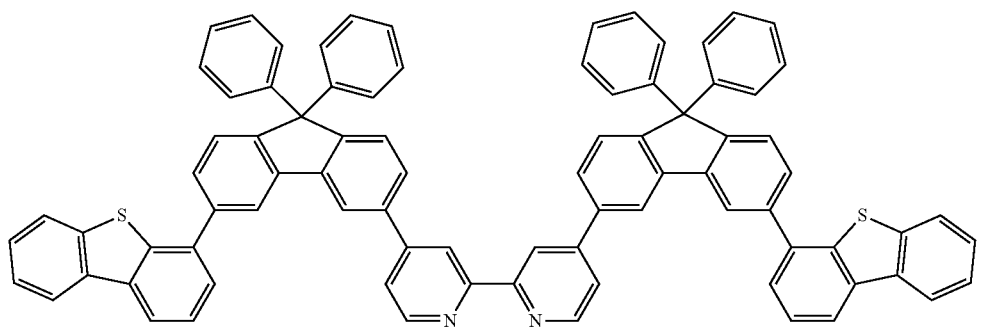

-continued
(211)
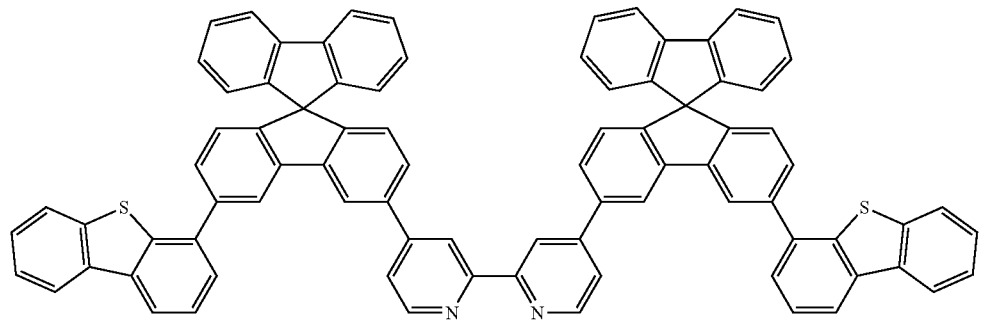
(212)
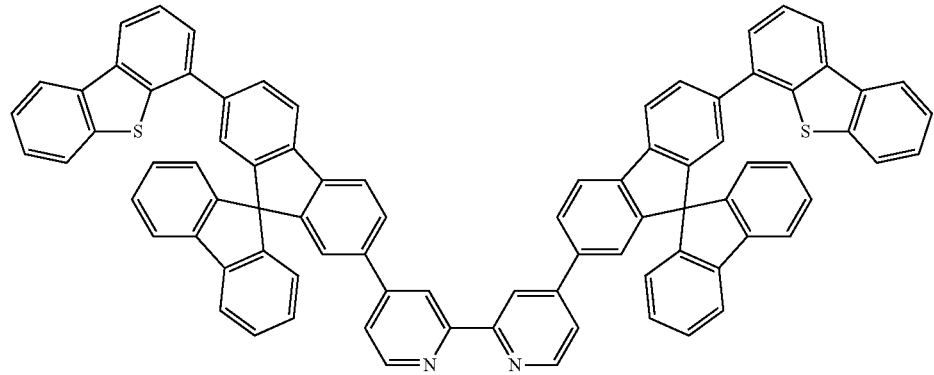
(213)
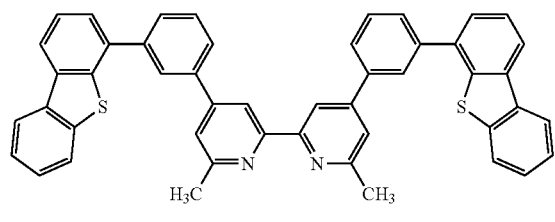
(214)
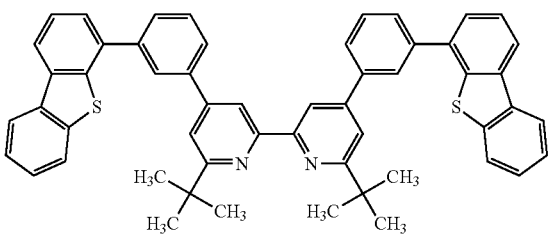
(215)
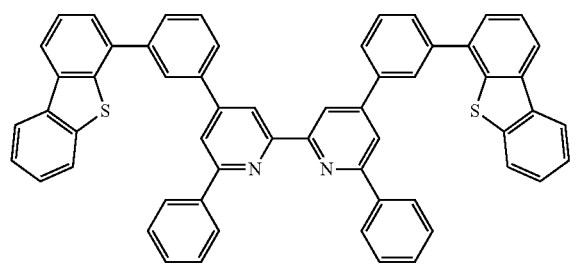
(216)
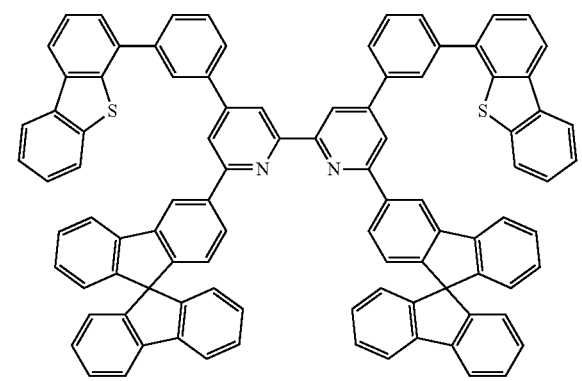
(217)
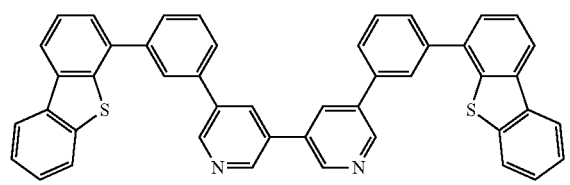
(218)
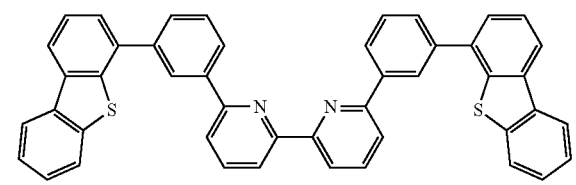

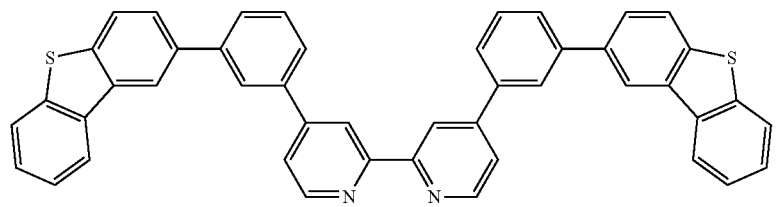
(219)
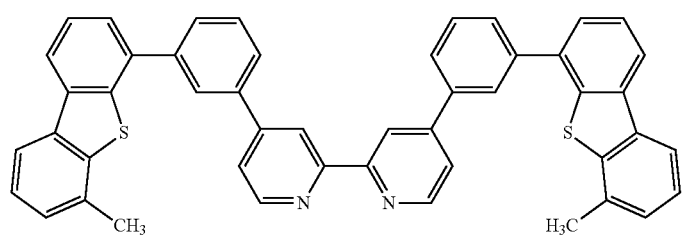
(220)
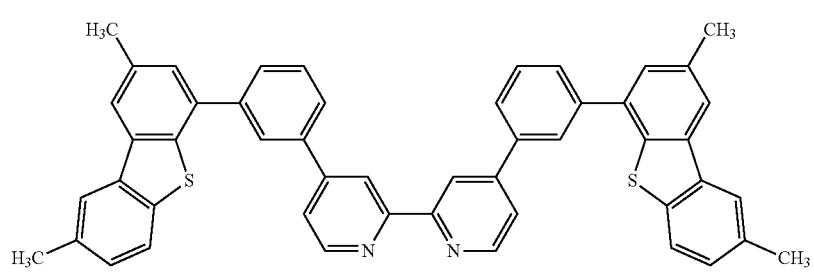
(221)
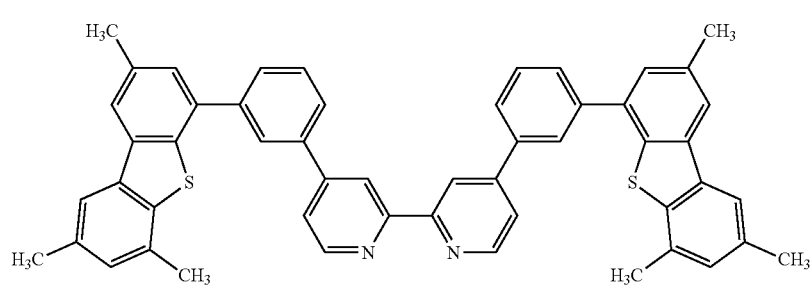
(222)
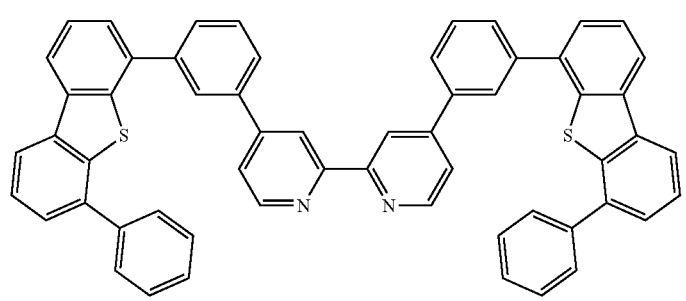
(223)

-continued
(224)
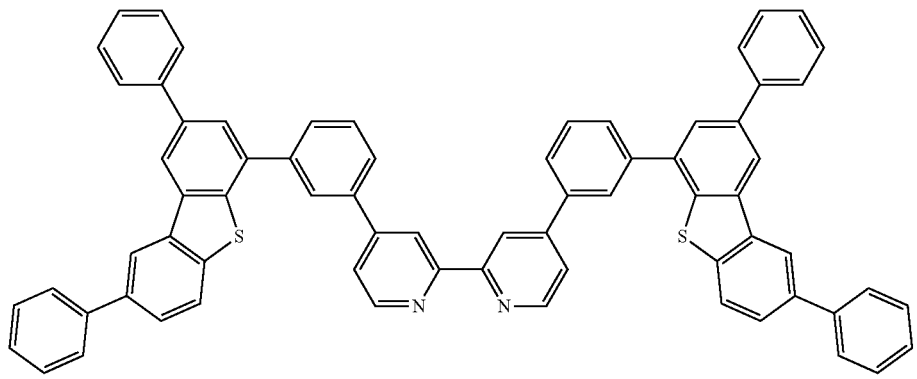
(225)
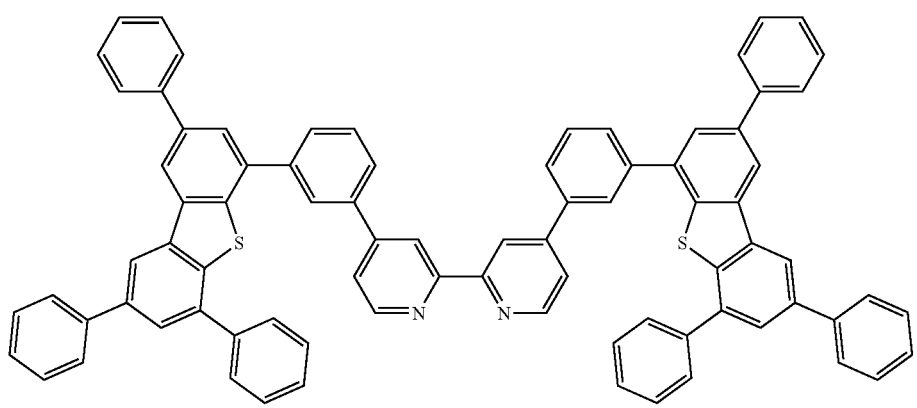
(226)
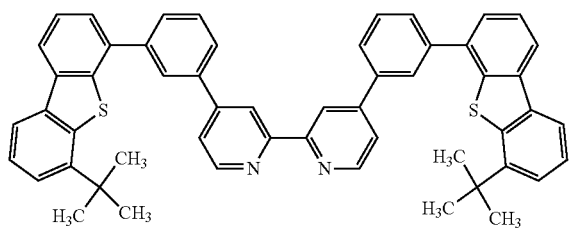
(227)
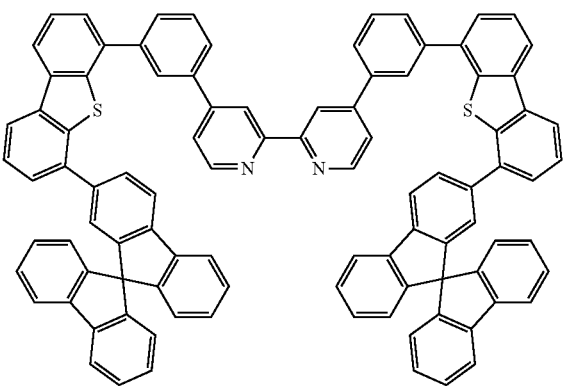
(300)
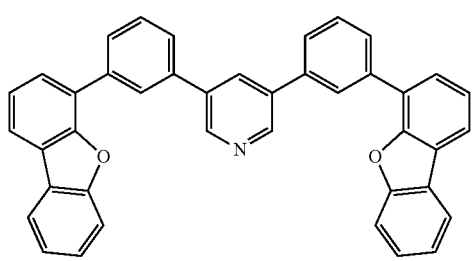
(301)
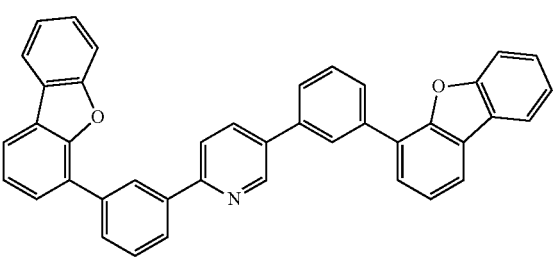

-continued
(302)
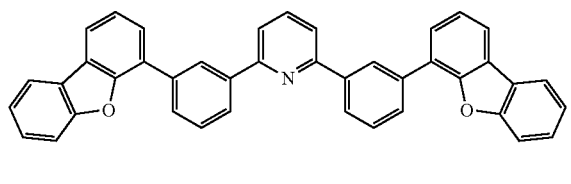
(303)
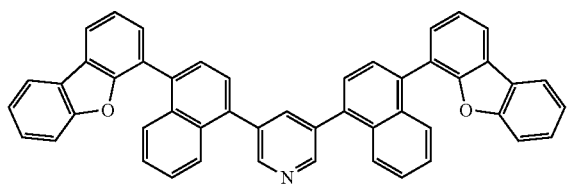
(304)
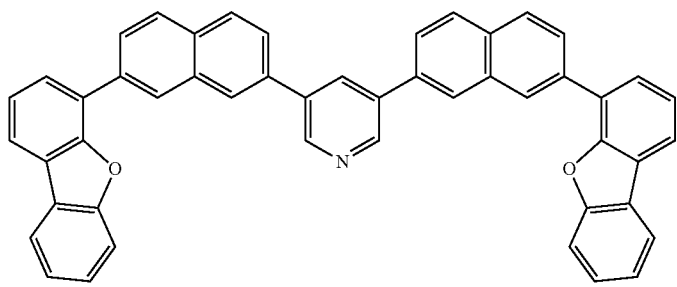
(305)
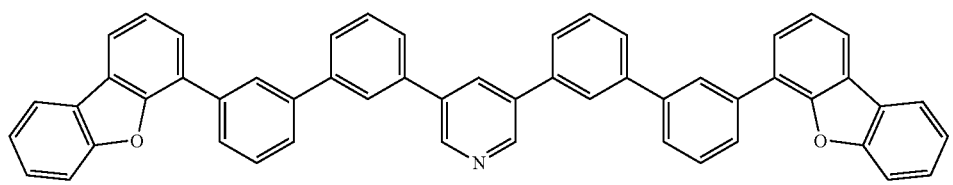
(306)
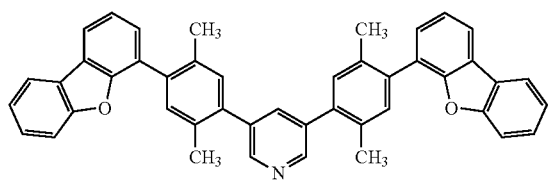
(307)
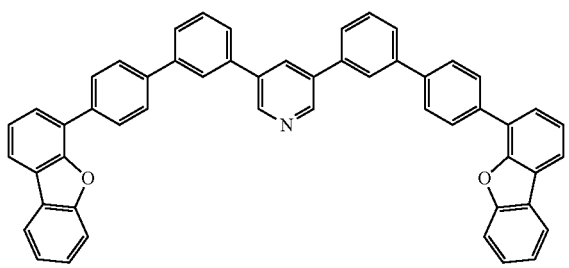
(308)
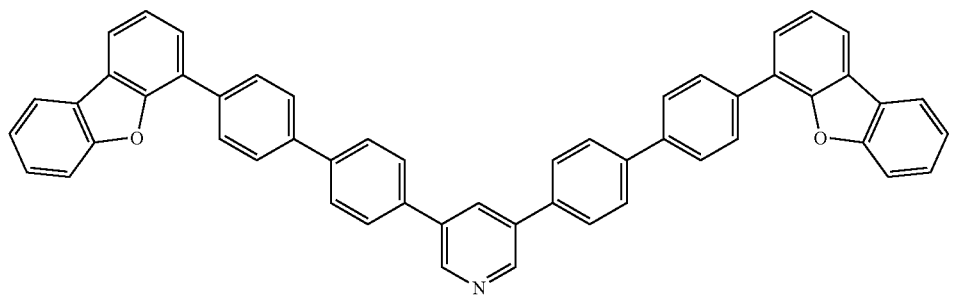
(309)
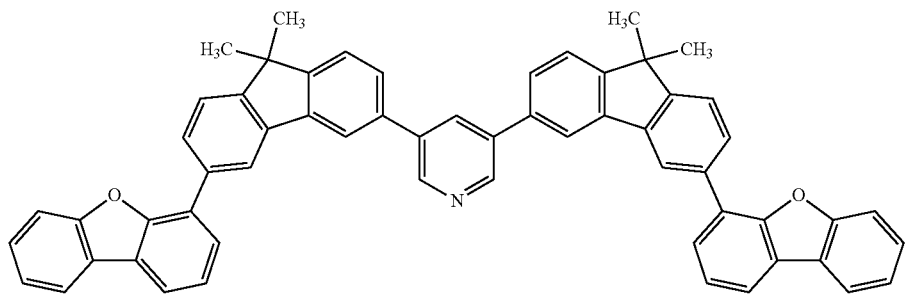

(310)
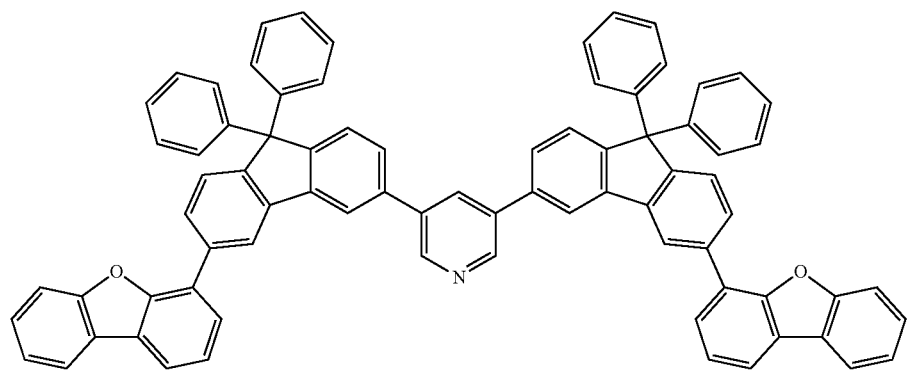
(311)
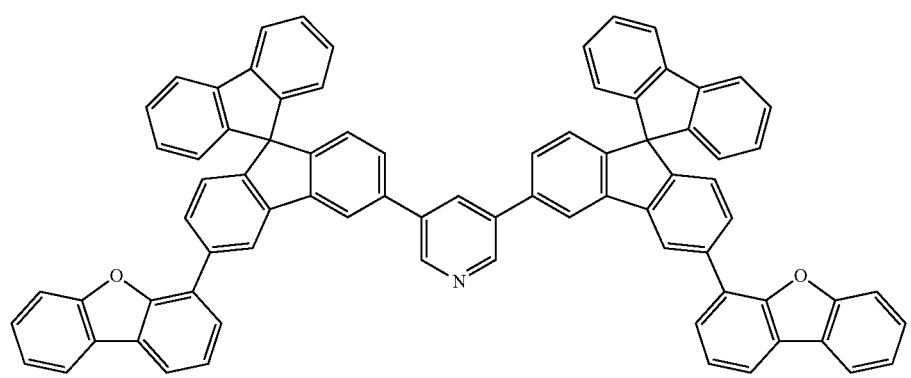
(312)
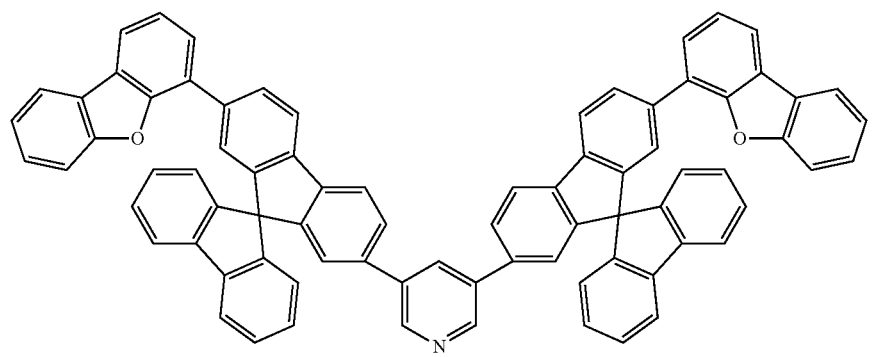
(313)
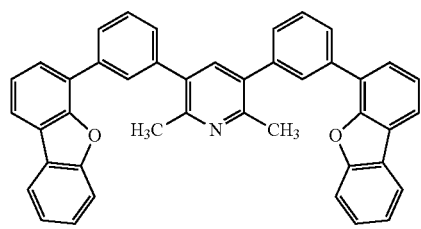
(314)
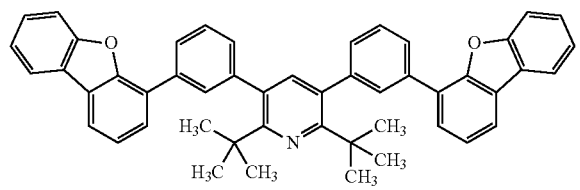

(315) 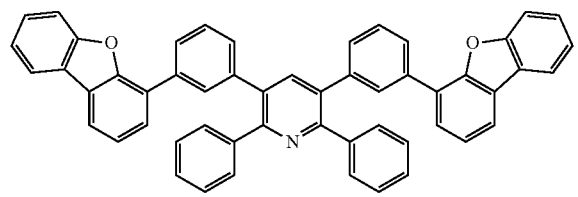
(316) 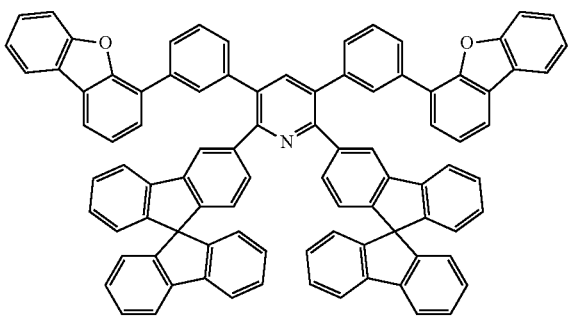
(317) 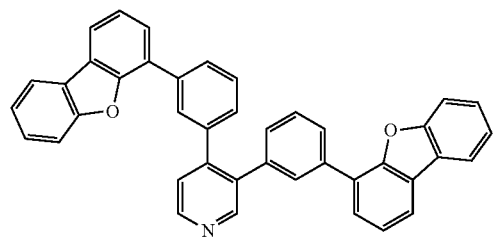
(318) 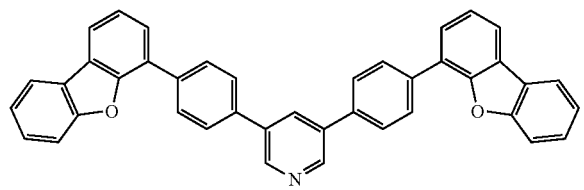
(319) 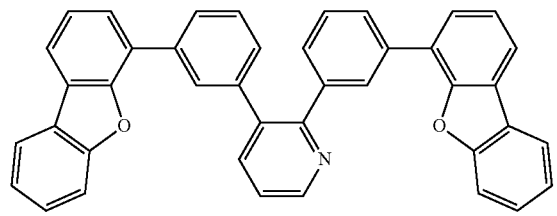
(320) 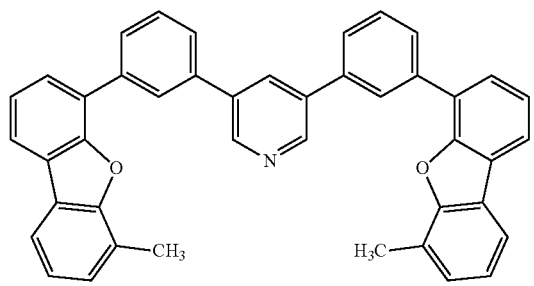
(321) 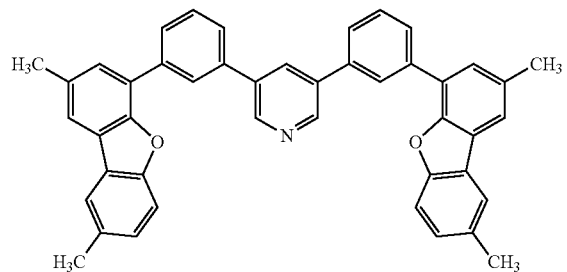
(322) 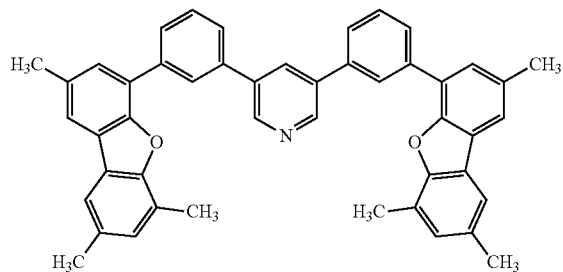
(323) 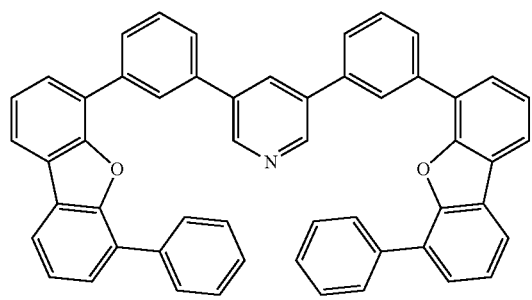

-continued
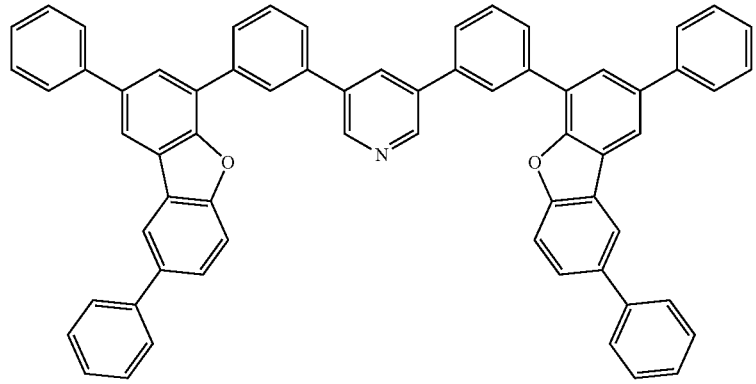
(324)
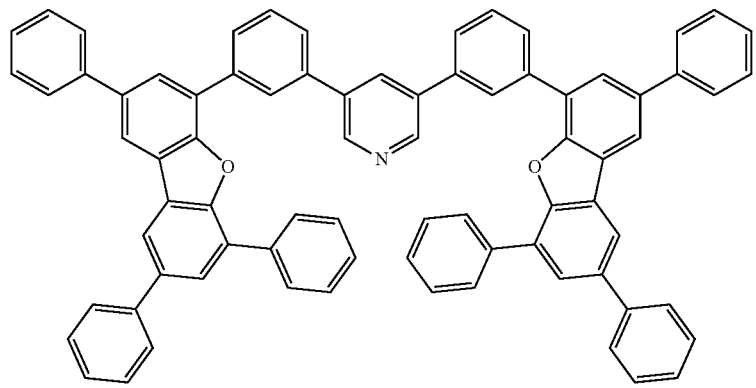
(325)
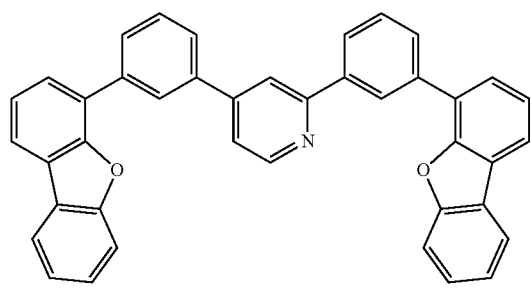
(326)
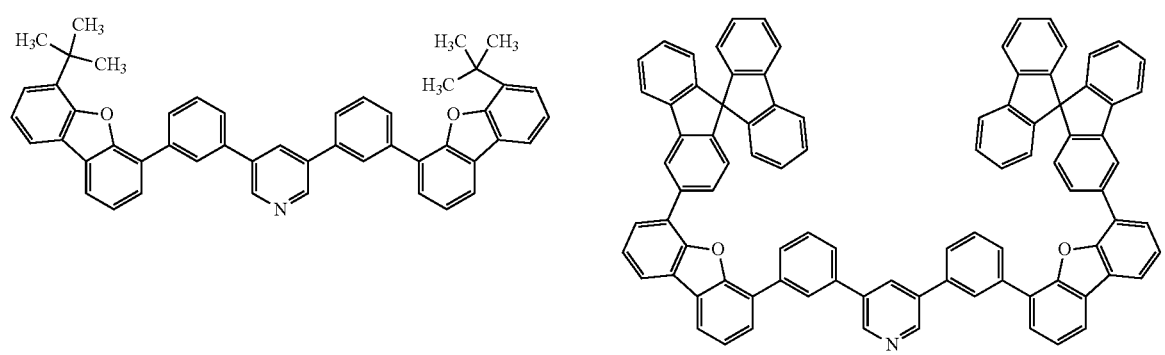
(327)
(328)
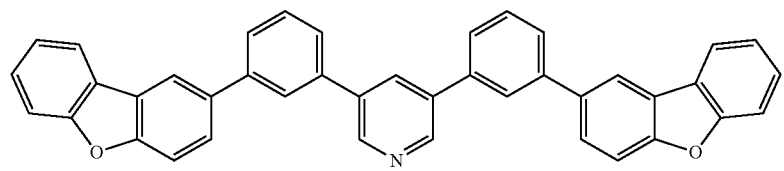
(329)

-continued
(330)
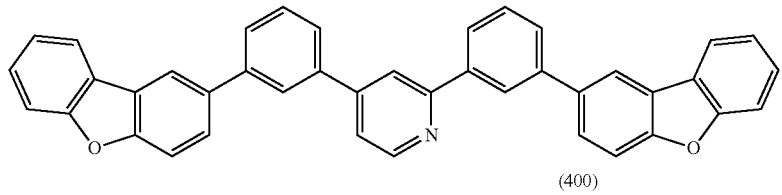
(400)
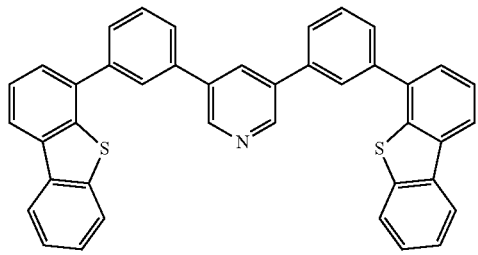
(401)
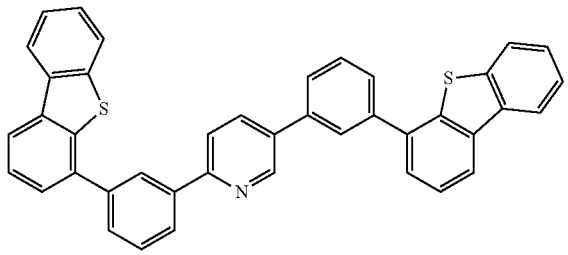
(402)
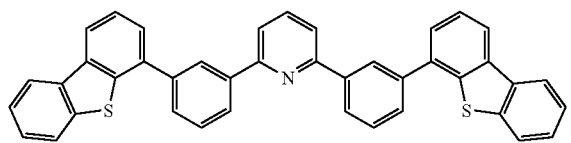
(403)
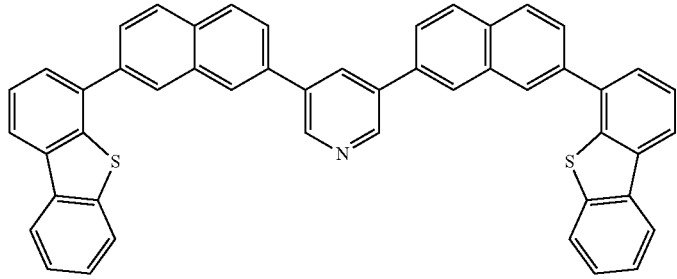
(404)
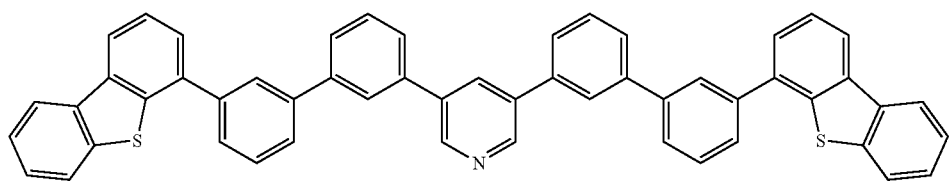
(405)
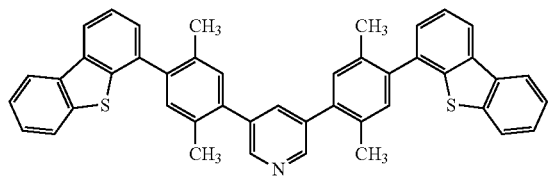
(406)
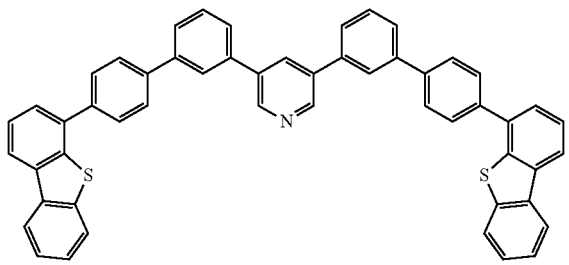

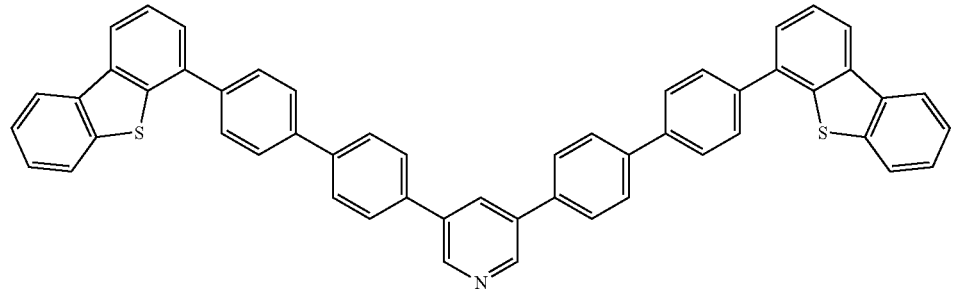
(408)
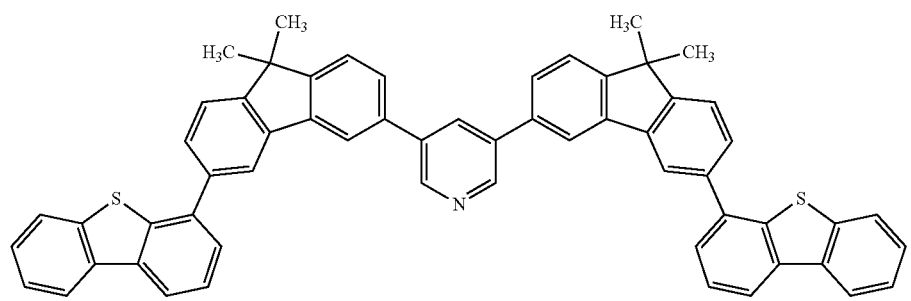
(409)
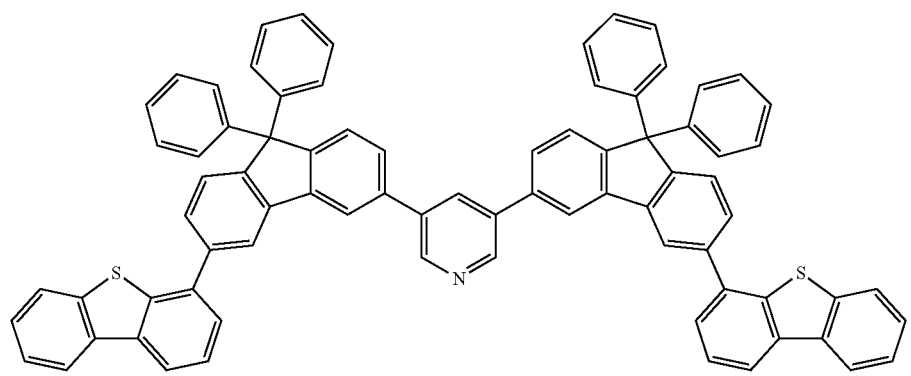
(410)
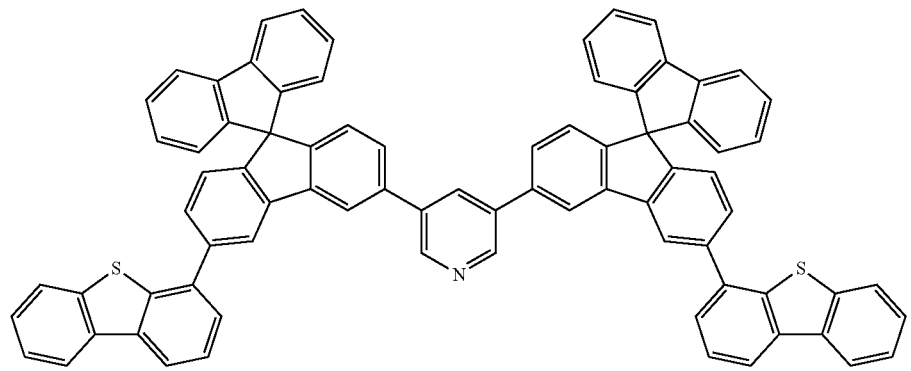
(411)

-continued
(412)
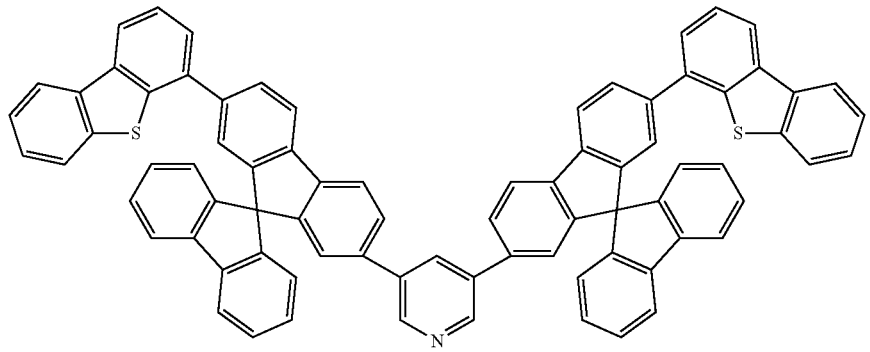
(413)
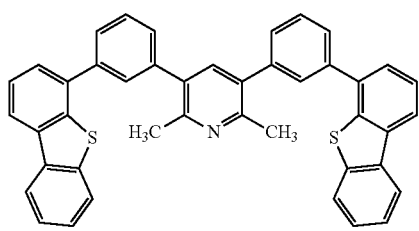
(414)
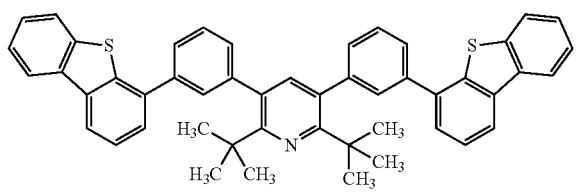
(415)
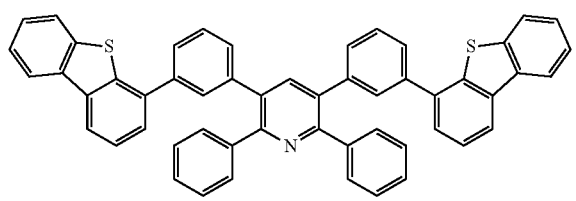
(416)
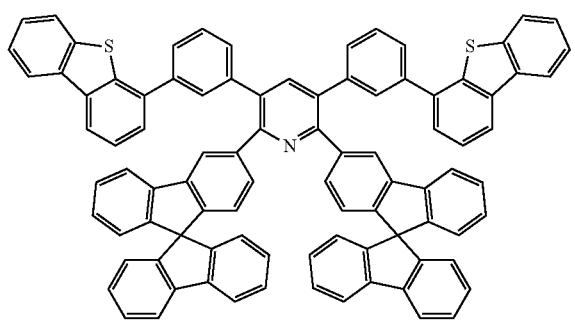
(417)
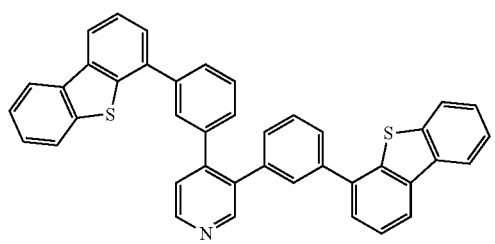
(418)
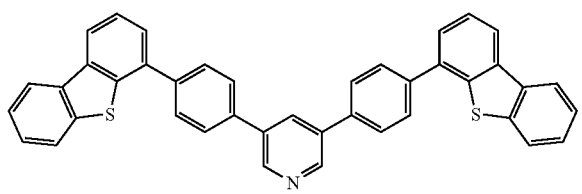
(419)
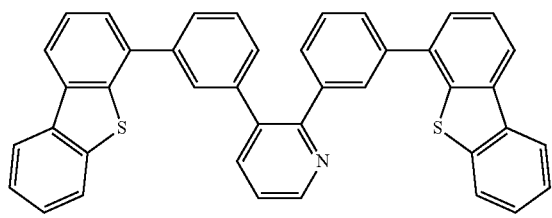
(420)
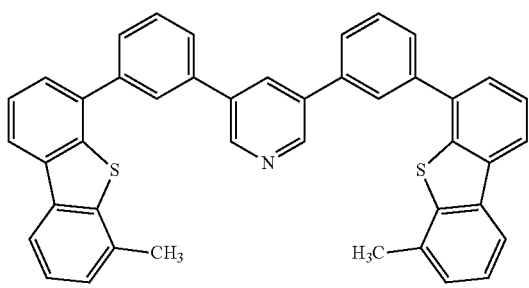

(421)
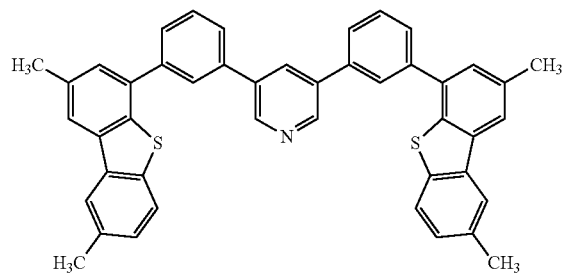
(422)
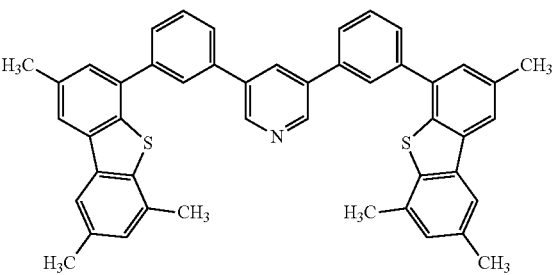
(423)
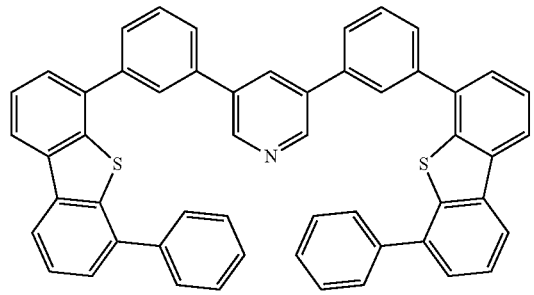
(424)
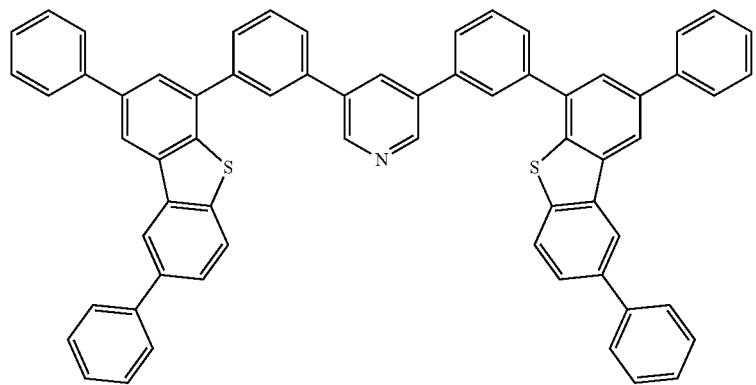
(425)
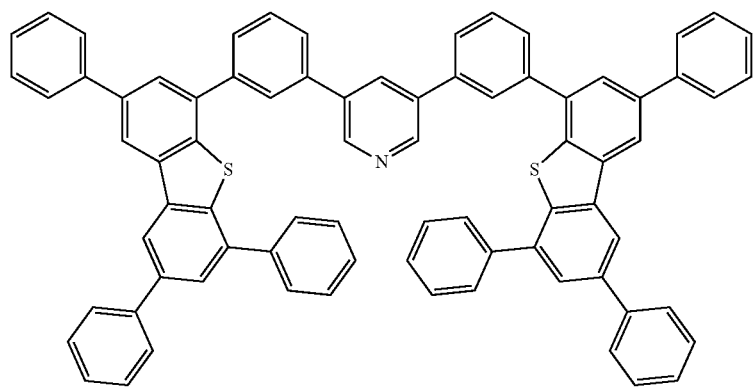

(426)

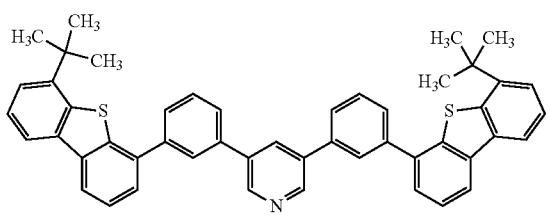

(427)

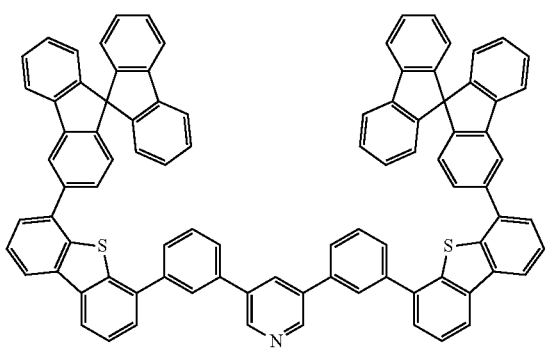

(428)

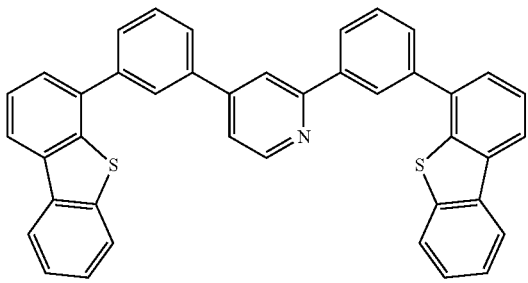

(429)

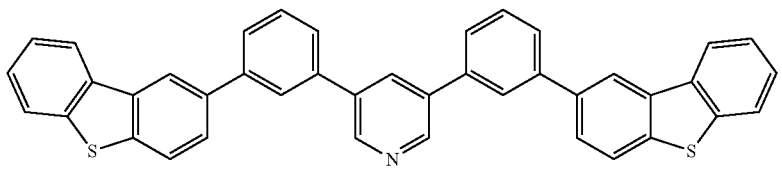

(430)

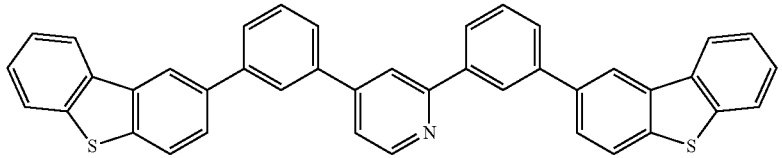

Furthermore, because of their high triplet level, the above organic compounds allow a phosphorescent light-emitting element to have high emission efficiency. Specifically, the organic compounds allow even a light-emitting element emitting green or blue phosphorescence, which has a short wavelength, to have favorable characteristics without reducing the emission efficiency. Moreover, the high triplet level means that the organic compounds have a wide band gap, which allows a blue-emissive fluorescent light-emitting element to emit light efficiently.

Furthermore, the organic compound of this embodiment can be used as a light-emitting material that emits blue to ultraviolet light.

Subsequently, a method for synthesizing these organic compounds is described. As shown in Synthesis Scheme (A-1), a halide of a pyridine derivative or a pyridine derivative that has a triflate group as a substituent (compound 1) may be coupled with an organoboron compound or a boronic acid (compound 2) of a pyridine derivative by the Suzuki-Miyaura reaction, whereby the organic compound represented by General Formula (G1) can be provided. Synthesis Scheme (A-1) is shown below.

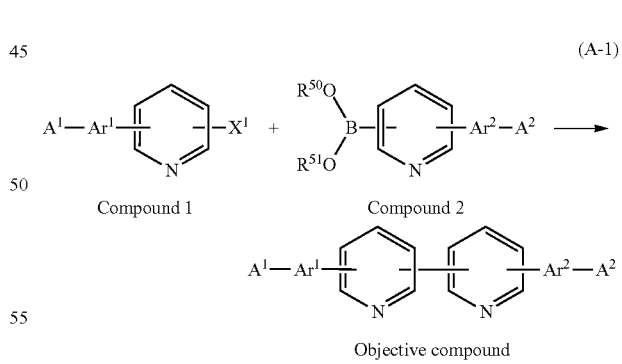

In Synthesis Scheme (A-1), $A^1$ and $A^2$ separately represent any one of a dibenzofuranyl group and a dibenzothiophenyl group, and $Ar^1$ and $Ar^2$ separately represent an arylene group having 6 to 13 carbon atoms. $R^{50}$ and $R^{51}$ separately represent any one of hydrogen and an alkyl group having 1 to 6 carbon atoms. In Synthesis Scheme (A-1), $R^{50}$ and $R^{51}$ may be bonded to each other to form a ring. Furthermore, $X^1$ represents any one of a halogen and a triflate group.

Alternatively, the organic compound represented by General Formula (G1) can be provided through the reaction represented by Synthesis Scheme (B-1), in which a halide of a bipyridine derivative or a bipyridine derivative that has a triflate group as a substituent (compound 3) may be coupled with organoboron compounds or boronic acids (compounds 4 and 5) of dibenzofuran and/or dibenzothiophene derivatives by the Suzuki-Miyaura reaction. Synthesis Scheme (B-1) is shown below.

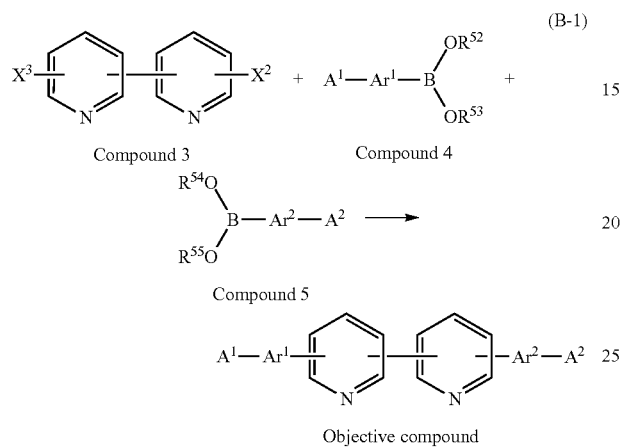

In Synthesis Scheme (B-1), $A^1$ and $A^2$ separately represent any one of a dibenzofuranyl group and a dibenzothiophenyl group, and $Ar^1$ and $Ar^2$ separately represent an arylene group having 6 to 13 carbon atoms. $R^{52}$ to $R^{55}$ separately represent any one of hydrogen and an alkyl group having 1 to 6 carbon atoms. In Synthesis Scheme (B-1), $R^{52}$ and $R^{53}$, and $R^{54}$ and $R^{55}$ may be bonded to each other to form a ring. Furthermore, $X^2$ and $X^3$ separately represent any one of a halogen and a triflate group.

Examples of the palladium catalyst that can be used in Synthesis Schemes (A-1) and (B-1) include, but are not limited to, palladium(II) acetate, tetrakis(triphenylphosphine)palladium(0), and bis(triphenylphosphine)palladium (II) dichloride. Examples of ligands of the palladium catalyst that can be used in Synthesis Scheme (B-1) include tri(ortho-tolyl)phosphine, triphenylphosphine, and tricyclohexylphosphine. Note that the ligand of the palladium catalyst that can be used is not limited to these ligands. Examples of a base that can be used in Synthesis Schemes (A-1) and (B-1) include, but are not limited to, organic bases such as sodium tert-butoxide and inorganic bases such as potassium carbonate and sodium carbonate. Examples of a solvent that can be used in Synthesis Schemes (A-1) and (B-1) include, but not limited to, a mixed solvent of toluene and water; a mixed solvent of toluene, alcohol such as ethanol, and water; a mixed solvent of xylene and water; a mixed solvent of xylene, alcohol such as ethanol, and water; a mixed solvent of benzene and water; a mixed solvent of benzene, alcohol such as ethanol, and water; and a mixed solvent of water and an ether such as ethylene glycol dimethyl ether. Further, a mixed solvent of toluene and water, a mixed solvent of toluene, ethanol, and water, or a mixed solvent of an ether such as ethylene glycol dimethyl ether and water is more preferable.

To synthesize the objective substance, although the compound 2, the compound 4, and the compound 5 are separately any one of an organoboron compound and a boronic acid and the Suzuki-Miyaura coupling reaction is caused in Synthesis Scheme (A-1) and Synthesis Scheme (B-1), the compound 2, the compound 4, and the compound 5 may be separately any one of an organoaluminum compound, an organozirconium compound, an organozinc compound, an organotin compound, and the like and a cross coupling reaction may be caused. However, one embodiment of the present invention is not limited thereto.

Further, in the Suzuki-Miyaura coupling reaction shown in Synthesis Scheme (B-1), an organoboron compound or a boronic acid of a bipyridine derivative may be reacted with a halide of a dibenzofuran derivative, a halide of a dibenzothiophene derivative, a dibenzofuran derivative having a triflate group as a substituent, or a dibenzothiophene derivative having a triflate group as a substituent.

The organic compound represented by General Formula (G6) can be provided through the reaction represented by Synthesis Scheme (C-1), in which a halide of a pyridine derivative or a pyridine derivative that has a triflate group as a substituent (compound 6) may be coupled with organoboron compounds or boronic acids (compounds 7 and 8) of dibenzofuran and/or dibenzothiophene derivatives by the Suzuki-Miyaura reaction. Synthesis Scheme (C-1) is shown below.

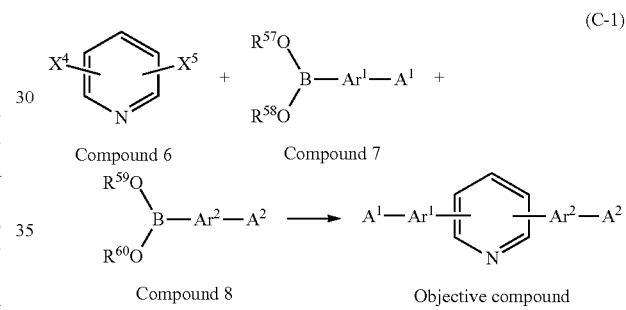

In Synthesis Scheme (C-1), $A^1$ and $A^2$ separately represent any one of a dibenzofuranyl group and a dibenzothiophenyl group, and $Ar^1$ and $Ar^2$ separately represent an arylene group having 6 to 13 carbon atoms. $R^{57}$ to $R^{60}$ separately represent any one of hydrogen and an alkyl group having 1 to 6 carbon atoms. In Synthesis Scheme (C-1), $R^{57}$ and $R^{58}$, and $R^{59}$ and $R^{60}$ may be bonded to each other to form a ring. Furthermore, $X^4$ and $X^5$ separately represent any one of a halogen and a triflate group.

Examples of the palladium catalyst that can be used in Synthesis Scheme (C-1) include, but are not limited to, palladium(II) acetate, tetrakis(triphenylphosphine)palladium(0), and bis(triphenylphosphine)palladium(II) dichloride. Examples of ligands of the palladium catalyst that can be used in Synthesis Scheme (C-1) include tri(ortho-tolyl)phosphine, triphenylphosphine, and tricyclohexylphosphine. Note that the ligand of the palladium catalyst that can be used is not limited to these ligands. Examples of a base that can be used in Synthesis Scheme (C-1) include, but are not limited to, organic bases such as sodium tert-butoxide and inorganic bases such as potassium carbonate and sodium carbonate. Examples of a solvent that can be used in Synthesis Scheme (C-1) include, but not limited to, a mixed solvent of toluene and water; a mixed solvent of toluene, alcohol such as ethanol, and water; a mixed solvent of xylene and water; a mixed solvent of xylene, alcohol such as ethanol, and water; a mixed solvent of benzene and water; a mixed solvent of benzene, alcohol such as ethanol, and water; and a mixed solvent of water and an ether such as ethylene glycol dimethyl ether. Further, a mixed solvent of toluene and water, a mixed solvent of toluene, ethanol, and water, or a mixed solvent of an ether such as ethylene glycol dimethyl ether and water is more preferable.

To synthesize the objective substance, although the compound 7 and the compound 8 are separately any one of an organoboron compound and a boronic acid and the Suzuki-Miyaura coupling reaction is caused in Synthesis Scheme (C-1), the compound 7 and the compound 8 may be separately any one of an organoaluminum compound, an organozirconium compound, an organozinc compound, an organotin compound, and the like and a cross coupling reaction may be caused. However, one embodiment of the present invention is not limited thereto.

Further, in the Suzuki-Miyaura coupling reaction shown in Synthesis Scheme (C-1), an organoboron compound or a boronic acid of a pyridine derivative may be reacted with a halide of a dibenzofuran derivative, a halide of a dibenzothiophene derivative, a dibenzofuran derivative having a triflate group as a substituent, or a dibenzothiophene derivative having a triflate group as a substituent.

Through the above-described steps, the organic compounds described in this embodiment can be synthesized.

(Embodiment 2)

In this embodiment, an example will be described in which the organic compound represented by General Formula (G0) described in Embodiment 1 is used for an active layer of a vertical transistor (static induction transistor (SIT)), which is a kind of an organic semiconductor element. In General Formula (G0), $A^1$ and $A^2$ separately represent any one of a dibenzofuranyl group and a dibenzothiophenyl group, and $Ar^1$ and $Ar^2$ separately represent an arylene group having 6 to 13 carbon atoms. Furthermore, n is 1 or 2.

(G0)

Figure 2:
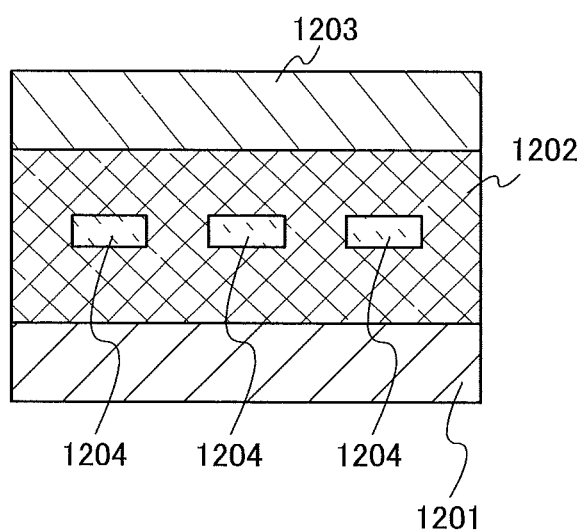
FIG. 2 is a conceptual diagram of an organic semiconductor element.

The element has a structure in which a thin-film active layer 1202 containing the organic compound represented by General Formula (G0) is interposed between a source electrode 1201 and a drain electrode 1203, and a gate electrode 1204 is embedded in the active layer 1202, as illustrated in FIG. 2. The gate electrode 1204 is electrically connected to a unit for applying gate voltage, and the source electrode 1201 and the drain electrode 1203 are electrically connected to a unit for controlling the voltage between a source and a drain.

In such an element structure, when voltage is applied between the source and the drain under the condition that gate voltage is not applied, a current flows (an ON state). Then, when gate voltage is applied in this state, a depletion layer is generated in the periphery of the gate electrode 1204, and thus a current does not flow (an OFF state). With such a mechanism, the element operates as a transistor.

In a vertical transistor, a material which has both a carrier-transport property and favorable film quality are required for an active layer like in a light-emitting element. Any of the organic compounds represented by General Formula (G0) can be suitably used because it sufficiently meets these requirements.

(Embodiment 3)

In this embodiment, one mode of a light-emitting element that includes an organic compound of one embodiment of the present invention disclosed in Embodiment 1 will be described with reference to FIG. 1A.

The light-emitting element of this embodiment has a plurality of layers between a pair of electrodes. In this embodiment, the light-emitting element includes a first electrode 101, a second electrode 102, and an EL layer 103 provided between the first electrode 101 and the second electrode 102. Note that in FIG. 1A, the first electrode 101 functions as an anode and the second electrode 102 functions as a cathode. In other words, when voltage is applied between the first electrode 101 and the second electrode 102 such that the potential of the first electrode 101 is higher than that of the second electrode 102, light emission is obtained. Of course, a structure in which the first electrode functions as a cathode and the second electrode functions as an anode can be employed. In that case, the stacking order of layers in the EL layer is reversed from the stacking order described below. Note that in the light-emitting element of this embodiment, at least one of layers in the EL layer 103 contains the organic compound of one embodiment of the present invention described in Embodiment 1. Note that a layer that contains the organic compound is preferably a light-emitting layer or an electron-transport layer because the characteristics of the organic compound can be utilized and a light-emitting element having favorable characteristics can be obtained.

For the electrode functioning as an anode, any of metals, alloys, electrically conductive compounds, and mixtures thereof which have a high work function (specifically, a work function of 4.0 eV or more) or the like is preferably used. Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Films of these electrically conductive metal oxides are usually formed by sputtering but may be formed by a sol-gel method or the like. For example, indium oxide-zinc oxide can be formed by a sputtering method using a target in which zinc oxide is added to indium oxide at 1 wt % to 20 wt %. Moreover, indium oxide containing tungsten oxide and zinc oxide (IWZO) can be formed by a sputtering method using a target in which tungsten oxide is added to indium oxide at 0.5 wt % to 5 wt % and zinc oxide is added to indium oxide at 0.1 wt % to 1 wt %. Other examples are gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like. Graphene may also be used.

There is no particular limitation on the stacked structure of the EL layer 103. The EL layer 103 can be formed by combining a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport and hole-transport property), a layer having a carrier-blocking property, and the like as appropriate. In this embodiment, the EL layer 103 has a structure in which a hole-injection layer 111, a hole-transport layer 112, a light-emitting layer 113, an electron-transport layer 114, and an electron-injection layer 115 are stacked in this order over the electrode functioning as an anode. Materials contained in the layers are specifically given below.

The hole-injection layer 111 is a layer containing a substance having a hole-injection property. The hole-injection layer 111 can be formed using molybdenum oxide, vanadium oxide, ruthenium oxide, tungsten oxide, manganese oxide, or the like. The hole-injection layer 111 can also be formed using a phthalocyanine-based compound such as phthalocyanine (abbreviation: H$_2$Pc) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD); a high molecule compound such as poly(3,4-ethylenedioxythiophene)/poly(styrenesulfonic acid) (PEDOT/PSS), or the like.

The hole-injection layer 111 can be formed using a composite material in which a substance exhibiting an electron-accepting property (hereinafter, simply referred to as "electron-accepting substance") with respect to a substance having a hole-transport property is contained in the substance having a hole-transport property. In this specification, the composite material refers to not a material in which two materials are simply mixed but a material in the state where charge transfer between the materials can be caused by a mixture of a plurality of materials. This charge transfer includes the charge transfer that occurs only when an electric field exists.

Note that by using the composite material in which the electron-accepting substance is contained in the substance having a hole-transport property, a material used for forming the electrode can be selected regardless of the work function of the material. In other words, besides a material having a high work function, a material having a low work function can be used for the electrode functioning as an anode. Examples of the electron-accepting substance are 7,7,8,8-tetracyano-2,3,5,6-tetrafluoroquinodimethane (abbreviation: F$_4$-TCNQ), chloranil, and the like. A transition metal oxide can also be used. In particular, an oxide of a metal belonging to any of Groups 4 to 8 of the periodic table can be suitably used. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable as the electron-accepting substance because it is stable in the air, has a low hygroscopic property, and is easily handled.

As the substance with a hole-transport property used for the composite material, any of a variety of organic compounds such as an aromatic amine compound, a carbazole compound, an aromatic hydrocarbon, and a high molecular compound (such as an oligomer, a dendrimer, or a polymer) can be used. The organic compound used for the composite material is preferably an organic compound having a high hole-transport property. Specifically, a substance having a hole mobility of $1\times10^{-6}$ cm$^2$/Vs or higher is preferably used. Note that any other substance may be used as long as the substance has a hole-transport property higher than an electron-transport property. Specific examples of the organic compound that can be used as a substance having a hole-transport property in the composite material are given below.

Examples of the aromatic amine compound are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole compound that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole compound that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ cm$^2$/Vs or more and having 14 to 42 carbon atoms is particularly preferable.

The aromatic hydrocarbon that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

The hole-transport layer 112 is a layer containing a substance having a hole-transport property. As the substance having a hole-transport property, those given above as the substances having hole-transport properties, which can be used for the above composite material, can be used. Note that detailed description is omitted to avoid repetition. Refer to the description of the composite material.

The light-emitting layer 113 is a layer containing a light-emitting substance. The light-emitting layer 113 may be formed using a film containing only a light-emitting substance or a film in which an emission center substance is dispersed in a host material.

There is no particular limitation on a material that can be used as the light-emitting substance or the emission center substance in the light-emitting layer 113, and light emitted from the material may be either fluorescence or phosphorescence. Examples of the above light-emitting substance or the emission center substance are fluorescent substances and phosphorescent substances. Examples of the fluorescent substance are N,N'-bis[4-(9-phenyl-9H-fluoren-9-yl)phenyl]-N,N'-diphenylpyrene-1,6-diamine (abbreviation: 1,6FLPAPrn), N,N'-bis[4-(9H-carbazol-9-yl)phenyl]N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-[4-(9-phenyl-9H-fluoren-9-yl)phenyl]-N,N'-diphenylpyrene-1,6-diamine (abbreviation: 1,6FLPAPrn), and the like. Examples of blue-emissive phosphorescent substances include an organometallic iridium complex having a 4H-triazole skeleton, such as tris {2-[5-(2-methylphenyl)-4-(2,6-dimethylphenyl)-4H-1,2,4-triazol-3-yl-κN2] phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), or tris[4-(3-biphenyl)-5-isopropyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato] (abbreviation: [Ir (Mptz1-mp)$_3$]) or tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$] iridium(III) picolinate (abbreviation: FIrpic), bis {2-[3',5'-bis(trifluoromethyl)phenyl]pyridinato-N,C$^{2'}$}iridium(III) picolinate (abbreviation: [Ir(CF$_3$ppy)$_2$(pic)]), or bis[2-(4',6'-difluorophenyppyridinato-N,C$^{2'}$]iridium(III) acetylacetonate (abbreviation: FIr(acac)). Note that an organometallic iridium complex having a 4H-triazole skeleton has excellent reliability and emission efficiency and thus is especially preferable. Examples of green-emissive phosphorescent substances include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir (tBuppm)$_3$)), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato) bis(4,6-diphenylpyrimidinato)iridium(III) (abbreviation: [Ir (dppm)$_2$(acac)]); an organometallic iridium complex having a pyrazine skeleton, such as (acetylacetonato)bis(3,5-dimethyl-2-phenylpyrazinato)iridium(III) (abbreviation: [Ir (mppr-Me)$_2$(acac)]) or (acetylacetonato)bis(5-isopropyl-3-methyl-2-phenylpyrazinato)iridium(III) (abbreviation: [Ir (mppr-iPr)$_2$(acac)]); an organometallic iridium complex having a pyridine skeleton, such as fac-tris(2-phenylpyridine)iridium (abbreviation: [Ir(ppy)$_3$]), bis(2-phenylpyridinato-N,C$^{2'}$)iridium(III) acetylacetonate (abbreviation: [Ir (ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,C$^{2'}$)iridium(III) (abbreviation: [Ir(pq)$_3$]), or bis(2-phenylquinolinato-N,C$^{2'}$)iridium(III) acetylacetonate (abbreviation: [Ir(pq)$_2$(acac)]); and a rare earth metal complex such as tris(acetylacetonato)(monophenanthroline)terbium(III) (abbreviation: Tb(acac)$_3$ (Phen)). Note that an organometallic iridium complex having a pyrimidine skeleton has distinctively high reliability and emission efficiency and thus is especially preferable. Examples of red-emissive phosphorescent substances include an organometallic iridium complex having a pyrimidine skeleton, such as (diisobutyrylmethanato)bis[4,6-bis(3-methylphenyl)pyrimidinato]iridium(III) (abbreviation: [Ir (5mdppm)$_2$(dibm)]), bis[4,6-bis(3-methylphenyl) pyrimidinato](dipivaloylmethanato)iridium(III) (abbreviation: [Ir(5mdppm)$_2$(dpm)]), or bis[4,6-di(naphthalen-1-yl)pyrimidinato](dipivaloylmethanato)iridium(III) (abbreviation: [Ir(d1npm)$_2$(dpm)]); an organometallic iridium complex having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato) (dipivaloylmethanato)iridium(III) (abbreviation: [Ir(tppr)$_2$ (dpm)]), or (acetylacetonato)bis[2,3-bis(4-fluorophenyl) quinoxalinato]iridium(III) (abbreviation: [Ir(Fdpq)$_2$(acac)]); an organometallic iridium complex having a pyridine skeleton, such as tris(1-phenylisoquinolinato-N,C$^{2'}$)iridium(III) (abbreviation: [Ir(piq)$_3$]) or bis(1-phenylisoquinolinato-N, C$^{2'}$)iridium(III)acetylacetonate (abbreviation: [Ir(piq)$_2$(acac)]); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: [Eu(DBM)$_3$(Phen)]) or tris[1-(2-thenoyl)-3,3,3-trifluoroacetonato](monophenanthroline) europium(III) (abbreviation: [Eu(TTA)$_3$(Phen)]). Note that an organometallic iridium complex having a pyrimidine skeleton has distinctively high reliability and emission efficiency and thus is especially preferable. Further, because an organometallic iridium complex having a pyrazine skeleton can provide red light emission with favorable chromaticity, the use of the organometallic iridium complex in a white light-emitting element improves a color rendering property of the white light-emitting element. Note that the organic compound of one embodiment of the present invention described in Embodiment 1 exhibits light in blue to ultraviolet regions, and thus can be used as an emission center substance.

The material that can be used as the light-emitting substance or the emission center substance may be selected from known substances as well as from the substances given above.

As a host material in which the emission center substance is dispersed, the organic compound of one embodiment of the present invention described in Embodiment 1 is preferably used.

Since the organic compound has a wide band gap and a high triplet level, the organic compound can be suitably used as a host material in which an emission center substance having a high-energy excited state is dispersed, such as an emission center substance emitting blue fluorescence or an emission center substance emitting green phosphorescence. Needless to say, the organic compound can also be used as a host material in which an emission center substance emitting fluorescence of a wavelength longer than that of blue light or an emission center substance emitting phosphorescence of a wavelength longer than that of green light is dispersed. In addition, it is effective to use the organic compound as a material of a carrier-transport layer (preferably an electron-transport layer) adjacent to a light-emitting layer. Since the organic compound has a wide band gap or a high triplet level, even when the emission center substance is a material emitting high-energy light, such as a material emitting blue fluorescence or a material emitting green phosphorescence, the energy of carriers that have recombined in a host material can be effectively transferred to the emission center substance. Thus, a light-emitting element having high emission efficiency can be fabricated. Note that in the case where the organic compound is used as a host material or a material of a carrier-transport layer, the emission center substance is preferably, but not limited to, a substance having a narrower band gap than the organic compound or a substance having a lower singlet level ($S_1$ level) or a lower triplet level than the organic compound.

In the case where the organic compound of one embodiment of the present invention described in Embodiment 1 is not used for the host material, a known material can be used for the host material.

Examples of materials which can be used as the above host material are given below. The following are examples of materials having an electron-transport property: a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTP-DBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in driving voltage.

The following are examples of materials which have a hole-transport property and can be used as the host material: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl] phenyl}dibenzofuran (abbreviation: mmDBFFLBi-II). Among the above materials, a compound having an aromatic amine skeleton and a compound having a carbazole skeleton are preferable because these compounds are highly reliable and have high carrier-transport properties to contribute to a reduction in driving voltage.

Note that a substance having a higher triplet level and a wider band gap than the emission center substance is preferably selected as the host material. The light-emitting layer may contain a third substance in addition to the host material and the phosphorescent substance.

Here, to achieve high emission efficiency of a light-emitting element that uses a phosphorescent substance, energy transfer between the host material and the phosphorescent substance will be considered. Carrier recombination occurs in both the host material and the phosphorescent substance; thus, efficient energy transfer from the host material to the phosphorescent substance is necessary to increase emission efficiency. Note that in this explanation of energy transfer, a molecule providing excitation energy is referred to as a host molecule, while a molecule receiving the excitation energy is referred to as a guest molecule.

When a phosphorescent compound is used as the guest material, in an absorption spectrum of the phosphorescent compound, an absorption band that is considered to contribute to light emission most greatly is at an absorption wavelength corresponding to direct transition from a ground state to a triplet excited state and a vicinity of the absorption wavelength, which is on the longest wavelength side. Therefore, it is considered preferable that the emission spectrum (a fluorescence spectrum and a phosphorescence spectrum) of the host material overlap with the absorption band on the longest wavelength side in the absorption spectrum of the phosphorescent compound.

Here, first, energy transfer from a host material in a triplet excited state will be considered. It is preferable that, in energy transfer from a triplet excited state, the phosphorescence spectrum of the host material and the absorption band on the longest wavelength side of the guest material have a large overlap.

However, a question here is energy transfer from the host molecule in the singlet excited state. In order to efficiently perform not only energy transfer from the triplet excited state but also energy transfer from the singlet excited state, it is clear from the above-described discussion that the host material needs to be designed such that not only its phosphorescence spectrum but also its fluorescence spectrum overlaps with the absorption band on the longest wavelength side of the guest material. In other words, unless the host material is designed so as to have its fluorescence spectrum in a position similar to that of its phosphorescence spectrum, it is not possible to achieve efficient energy transfer from the host material in both the singlet excited state and the triplet excited state.

However, in general, the $S_1$ level differs greatly from the $T_1$ level ($S_1$ level>$T_1$ level); therefore, the fluorescence emission wavelength also differs greatly from the phosphorescence emission wavelength (fluorescence emission wavelength<phosphorescence emission wavelength). Accordingly, it is extremely difficult to design a host material so as to have its fluorescence spectrum in a position similar to that of its phosphorescence spectrum.

Fluorescence is emitted from an energy level higher than that of phosphorescence, and the $T_1$ level of a host material whose fluorescence spectrum corresponds to a wavelength close to an absorption spectrum of a guest material on the longest wavelength side is lower than the $T_1$ level of the guest material.

Thus, in the case where a phosphorescent substance is used as the emission center substance in the light-emitting element of one embodiment of the present invention, it is preferable that the light-emitting layer include a third substance in addition to the host material and the emission center substance and that the host material form an excited complex (also referred to as an exciplex) in combination with the third substance.

In that case, at the time of recombination of carriers (electrons and holes) in the light-emitting layer, the host material and the third substance form an exciplex. A fluorescence spectrum of the exciplex is on a longer wavelength side than a fluorescence spectrum of the host material alone or the third substance alone. Therefore, energy transfer from a singlet excited state can be maximized while the $T_1$ levels of the host material and the third substance are kept higher than the $T_1$ level of the guest material. In addition, the exciplex is in a state where the $T_1$ level and the $S_1$ level are close to each other; therefore, the fluorescence spectrum and the phosphorescence spectrum exist at substantially the same position. Accordingly, both the fluorescence spectrum and the phosphorescence spectrum of the exciplex can have a large overlap with an absorption corresponding to transition of the guest molecule from the singlet ground state to the triplet excited state (a broad absorption band of the guest molecule existing on the longest wavelength side in the absorption spectrum), and thus a light-emitting element having high energy transfer efficiency can be obtained.

As the third substance, the above material which can be used as the host material or additives can be used. There is no particular limitation on the host materials and the third substance as long as they can form an exciplex; a combination of a compound which readily accepts electrons (a compound having an electron-transport property) and a compound which readily accepts holes (a compound having a hole-transport property) is preferably employed.

In the case where a compound having an electron-transport property and a compound having a hole-transport property are used for the host material and the third substance, carrier balance can be controlled by the mixture ratio of the compounds. Specifically, the ratio of the host material to the third substance (or additive) is preferably from 1:9 to 9:1. Note that in that case, the following structure may be employed: a light-emitting layer in which one kind of an emission center substance is dispersed is divided into two layers, and the two layers have different mixture ratios of the host material to the third substance. With this structure, the carrier balance of the light-emitting element can be optimized, so that the lifetime of the light-emitting element can be improved. Furthermore, one of the light-emitting layers may be a hole-transport layer and the other of the light-emitting layers may be an electron-transport layer.

In the case where the light-emitting layer having the above-described structure is formed using a plurality of materials, the light-emitting layer can be formed using co-evaporation by a vacuum evaporation method; or an inkjet method, a spin coating method, a dip coating method, or the like with a solution of the materials.

The electron-transport layer 114 is a layer containing a substance having an electron-transport property. For example, the electron-transport layer 114 is formed using a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato) beryllium (abbreviation: BeBq$_2$), or bis(2-methyl-8-quinolinolato)(4-phenylphenolato)aluminum (abbreviation: BAlq), or the like. A metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can also be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances given here are mainly ones having an electron mobility of $10^{-6}$ cm$^2$/Vs or higher. Note that any substance other than the above substances may be used for the electron-transport layer as long as the substance has an electron-transport property higher than a hole-transport property.

The organic compound of one embodiment of the present invention described in Embodiment 1 may also be used as a material contained in the electron-transport layer 114. The organic compound has a wide band gap and a high $T_1$ level and thus can effectively prevent transfer of excitation energy in the light-emitting layer to the electron-transport layer 114 to inhibit a reduction in emission efficiency due to the excitation energy transfer, and allow a light-emitting element having high emission efficiency to be fabricated. Moreover, the organic compound has a high carrier-transport property; thus, a light-emitting element having low driving voltage can be provided.

The electron-transport layer is not limited to a single layer, and may be a stack including two or more layers containing any of the above substances.

Between the electron-transport layer and the light-emitting layer, a layer that controls transport of electron carriers may be provided. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (such as a reduction in element lifetime) caused when electrons pass through the light-emitting layer.

It is preferable that the host material in the light-emitting layer and a material of the electron-transport layer have the same skeleton, in which case transfer of carriers can be smooth and thus the driving voltage can be reduced. Moreover, it is effective that the host material and the material of the electron-transport layer be the same material.

The electron-injection layer 115 may be provided in contact with the second electrode 102 between the electron-transport layer 114 and the second electrode 102. For the electron-injection layer 115, lithium, calcium, lithium fluoride (LiF), cesium fluoride (CsF), calcium fluoride (CaF$_2$), or the like can be used. A composite material of a substance having an electron-transport property and a substance exhibiting an electron-donating property (hereinafter, simply referred to as electron-donating substance) with respect to the substance having an electron-transport property can also be used. Examples of the electron-donating substance include an alkali metal, an alkaline earth metal, and compounds thereof. Note that such a composite material is preferably used for the electron-injection layer 115, in which case electrons are injected efficiently from the second electrode 102. With this structure, a conductive material as well as a material having a low work function can be used for the cathode.

For the electrode functioning as a cathode, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as lithium (Li), cesium (Cs), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

Note that the structure of the EL layer provided between the first electrode 101 and the second electrode 102 is not limited to the above structure. However, it is preferable that a light-emitting region where holes and electrons recombine be positioned away from the first electrode 101 and the second electrode 102 so as to prevent quenching due to the proximity of the light-emitting region and a metal used for an electrode or a carrier-injection layer.

Further, in order that transfer of energy from an exciton generated in the light-emitting layer can be inhibited, preferably, the hole-transport layer and the electron-transport layer which are in direct contact with the light-emitting layer, particularly a carrier-transport layer in contact with a side closer to the light-emitting region in the light-emitting layer 113 is formed with a substance having a wider band gap than the emission center substance of the light-emitting layer or the light-emitting substance included in the light-emitting layer.

In the light-emitting element having the above-described structure, current flows due to a potential difference between the first electrode 101 and the second electrode 102, and holes and electrons recombine in the light-emitting layer 113 which contains a substance having a high light-emitting property, so that light is emitted. In other words, a light-emitting region is formed in the light-emitting layer 113.

Light is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light is extracted from the substrate side through the first electrode 101. In contrast, when only the second electrode 102 is a light-transmitting electrode, light is extracted from the side opposite to the substrate side through the second electrode 102. In the case where both the first electrode 101 and the second electrode 102 are light-transmitting electrodes, light is extracted from both the substrate side and the side opposite to the substrate side through the first electrode 101 and the second electrode 102.

Since the light-emitting element of this embodiment is formed using the organic compound of one embodiment of the present invention having a wide band gap, efficient light emission can be obtained even if the emission center substance is a substance that emits blue fluorescence or green phosphorescence, and the light-emitting element can have a high emission efficiency. Thus, a light-emitting element with lower power consumption can be provided. Further, the organic compound has a high carrier-transport property; thus, a light-emitting element having low driving voltage can be provided.

Such a light-emitting element may be fabricated using a substrate made of glass, plastic, or the like as a support. A plurality of such light-emitting elements are formed over one substrate, thereby forming a passive matrix light-emitting device. Alternatively, a transistor may be formed over a substrate made of glass, plastic, or the like, and the light-emitting element may be fabricated over an electrode electrically connected to the transistor. In this manner, an active matrix light-emitting device in which the driving of the light-emitting element is controlled by the transistor can be fabricated.

(Embodiment 4)

In this embodiment is described one mode of a light-emitting element having a structure in which a plurality of light-emitting units are stacked (hereinafter, also referred to as stacked-type element), with reference to FIG. 1B. This light-emitting element includes a plurality of light-emitting units between a first electrode and a second electrode. Each light-emitting unit can have the same structure as the EL layer 103 which is described in Embodiment 3. In other words, the light-emitting element described in Embodiment 3 is a light-emitting element having one light-emitting unit while the light-emitting element described in this embodiment is a light-emitting element having a plurality of light-emitting units.

Figure 1B:
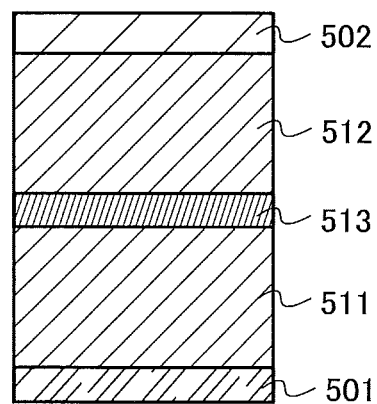

In FIG. 1B, a first light-emitting unit 511 and a second light-emitting unit 512 are stacked between a first electrode 501 and a second electrode 502, and a charge generation layer 513 is provided between the first light-emitting unit 511 and the second light-emitting unit 512. The first electrode 501 and the second electrode 502 respectively correspond to the first electrode 101 and the second electrode 102 in Embodiment 3, and materials described in Embodiment 3 can be used. Further, the structures of the first light-emitting unit 511 and the second light-emitting unit 512 may be the same or different.

The charge generation layer 513 includes a composite material of an organic compound and a metal oxide. As this composite material of an organic compound and a metal oxide, the composite material that can be used for the hole-injection layer and described in Embodiment 3 can be used. As the organic compound, any of a variety of compounds such as aromatic amine compounds, carbazole compounds, aromatic hydrocarbons, and high molecular compounds (oligomers, dendrimers, polymers, or the like) can be used. Note that the organic compound preferably has a hole mobility of $1\times10^{-6}$ cm$^2$/Vs or more. However, any other substance may be used as long as the substance has a hole-transport property higher than an electron-transport property. Since a composite material of an organic compound and a metal oxide is excellent in carrier-injection property and carrier-transport property, low voltage driving and low current driving can be achieved. Note that in the light-emitting unit whose anode side surface is in contact with the charge generation layer, a hole-injection layer is not necessarily provided because the charge generation layer can also function as the hole-injection layer.

The charge generation layer 513 may have a stacked-layer structure of a layer containing the composite material of an organic compound and a metal oxide and a layer containing another material. For example, a layer containing the composite material of an organic compound and a metal oxide may be combined with a layer containing a compound of a substance selected from electron-donating substances and a compound having a high electron-transport property. Moreover, the charge generation layer 513 may be formed by combining a layer containing the composite material of an organic compound and a metal oxide with a transparent conductive film.

The charge generation layer 513 provided between the first light-emitting unit 511 and the second light-emitting unit 512 may have any structure as long as electrons can be injected to a light-emitting unit on one side and holes can be injected to a light-emitting unit on the other side when voltage is applied between the first electrode 501 and the second electrode 502. For example, in FIG. 1B, any layer can be used as the charge generation layer 513 as long as the layer injects electrons into the first light-emitting unit 511 and holes into the second light-emitting unit 512 when voltage is applied such that the potential of the first electrode is higher than that of the second electrode.

Although the light-emitting element having two light-emitting units is described in this embodiment, the present invention can be similarly applied to a light-emitting element in which three or more light-emitting units are stacked. With a plurality of light-emitting units partitioned by the charge generation layer between a pair of electrodes, as in the light-emitting element according to this embodiment, light with high luminance can be obtained while current density is kept low; thus, a light-emitting element having a long lifetime can be obtained. In addition, a low power consumption light-emitting device which can be driven at low voltage can be achieved.

By making the light-emitting units emit light of different colors from each other, the light-emitting element can provide light emission of a desired color as a whole. For example, by forming a light-emitting element having two light-emitting units such that the emission color of the first light-emitting unit and the emission color of the second light-emitting unit are complementary colors, the light-emitting element can provide white light emission as a whole. Note that the word "complementary" means color relationship in which an achromatic color is obtained when colors are mixed. In other words, when light obtained from substances which emit light of complementary colors are mixed, white light emission can be obtained. Further, the same can be applied to a light-emitting element having three light-emitting units. For example, the light-emitting element as a whole can provide white light emission when the emission color of the first light-emitting unit is red, the emission color of the second light-emitting unit is green, and the emission color of the third light-emitting unit is blue. Alternatively, in the case of employing a light-emitting element in which a phosphorescent emission center substance is used for a light-emitting layer of one light-emitting unit and a fluorescent emission center substance is used for a light-emitting layer of the other light-emitting unit, both fluorescence and phosphorescence can be efficiently emitted from the light-emitting element. For example, when red phosphorescence and green phosphorescence are obtained from one light-emitting unit and blue fluorescence is obtained from the other light-emitting unit, white light with high emission efficiency can be obtained.

Since the light-emitting element of this embodiment contains the organic compound of one embodiment of the present invention, the light-emitting element can have high emission efficiency or operate at low driving voltage. In addition, since light emission with high color purity which is derived from the emission center substance can be obtained from the light-emitting unit including the organic compound, color adjustment of the light-emitting element as a whole is easy.

Note that this embodiment can be combined with any of other embodiments as appropriate.

(Embodiment 5)

In this embodiment, explanation will be given with reference to FIGS. 3A and 3B of an example of the light-emitting device fabricated using a light-emitting element including the organic compound of one embodiment of the present invention. Note that FIG. 3A is a top view of the light-emitting device and FIG. 3B is a cross-sectional view taken along the lines A-B and C-D in FIG. 3A. This light-emitting device includes a driver circuit portion (source side driver circuit) 601, a pixel portion 602, and a driver circuit portion (gate side driver circuit) 603, which control light emission of a light-emitting element 618 and denoted by dotted lines. A reference numeral 604 denotes a sealing substrate; 605, a sealing material; and 607, a space surrounded by the sealing material 605.

Reference numeral 608 denotes a wiring for transmitting signals to be input to the source side driver circuit 601 and the gate side driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is explained with reference to FIG. 3B. The driver circuit portion and the pixel portion are formed over an element substrate 610; here, the source side driver circuit 601, which is a driver circuit portion, and one of the pixels in the pixel portion 602 are shown.

As the source side driver circuit 601, a CMOS circuit in which an n-channel TFT 623 and a p-channel TFT 624 are combined is formed. In addition, the driver circuit may be formed with any of a variety of circuits such as a CMOS circuit, a PMOS circuit, and an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching TFT 611, a current controlling TFT 612, and a first electrode 613 electrically connected to a drain of the current controlling TFT 612. Note that to cover an end portion of the first electrode 613, an insulator 614 is formed, for which a positive photosensitive resin film is used here.

Note that a structure of the transistor is not particularly limited. Either a staggered TFT or an inverted staggered TFT may be employed. In addition, the crystallinity of a semiconductor used for the TFT is not particularly limited. In addition, a driver circuit formed in a TFT substrate may be formed with n-type TFTs and p-type TFTs, or with either n-type TFTs or p-type TFTs. The semiconductor layer for forming the TFTs may be formed using any material as long as the material exhibits semiconductor characteristics; for example, an element belonging to Group 14 of the periodic table such as silicon (Si) and germanium (Ge), a compound such as gallium arsenide and indium phosphide, an oxide such as zinc oxide and tin oxide, and the like can be given. For the oxide exhibiting semiconductor characteristics (oxide semiconductor), composite oxide of an element selected from indium, gallium, aluminum, zinc, and tin can be used. Examples thereof are zinc oxide (ZnO), indium oxide containing zinc oxide (indium zinc oxide), and oxide containing indium oxide, gallium oxide, and zinc oxide (IGZO: indium gallium zinc oxide). An organic semiconductor may also be used. The semiconductor layer may have either a crystalline structure or an amorphous structure. Specific examples of the crystalline semiconductor layer are a single crystal semiconductor, a polycrystalline semiconductor, and a microcrystalline semiconductor.

In order to improve coverage with a film formed over the insulator 614, the insulator 614 is formed to have a curved surface with curvature at its upper or lower end portion. For example, in the case where a positive photosensitive acrylic resin is used for a material of the insulator 614, only the upper end portion of the insulator 614 preferably has a surface with a curvature radius (0.2 µm to 3 µm). As the insulator 614, either a negative photosensitive material or a positive photosensitive material can be used.

An EL layer 616 and a second electrode 617 are formed over the first electrode 613. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a zinc film, a platinum film, or the like, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance, a favorable ohmic contact, and a function as an anode.

The EL layer 616 is formed by any of a variety of methods such as an evaporation method using an evaporation mask, an inkjet method, and a spin coating method. The EL layer 616 contains the organic compound of one embodiment of the present invention. Further, for another material included in the EL layer 616, any of low molecular-weight compounds and polymeric compounds (including oligomers and dendrimers) may be used.

As a material used for the second electrode 617, which is formed over the EL layer 616 and functions as a cathode, a material having a low work function (e.g., Al, Mg, Li, Ca, or an alloy or compound thereof, such as MgAg, MgIn, or AlLi) is preferably used. In the case where light generated in the EL layer 616 passes through the second electrode 617, a stack including a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element has the structure described in Embodiment 3 or 4. In the light-emitting device of this embodiment, the pixel portion, which includes a plurality of light-emitting elements, may include both the light-emitting element with the structure described in Embodiment 3 or 4 and a light-emitting element with a structure other than those.

The sealing substrate 604 is attached to the element substrate 610 with the sealing material 605, so that the light-emitting element 618 is provided in the space 607 surrounded by the element substrate 610, the sealing substrate 604, and the sealing material 605. The space 607 is filled with filler. The filler may be an inert gas (such as nitrogen or argon), or a resin and/or a desiccant.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), a polyester, an acrylic resin, or the like can be used.

As described above, the light-emitting device fabricated by using the light-emitting element that contains the organic compound of one embodiment of the present invention can be obtained.

FIGS. 4A and 4B illustrate examples of light-emitting devices in which full color display is achieved by forming a light-emitting element exhibiting white light emission and providing a coloring layer (a color filter) and the like. In FIG. 4A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, an EL layer 1028, a second electrode 1029 of the light-emitting elements, a sealing substrate 1031, a sealant 1032, and the like are illustrated.

In FIG. 4A, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 4A, light emitted from some of the light-emitting layers does not pass through the coloring layers, while light emitted from the others of the light-emitting layers passes through the coloring layers. Since light which does not pass through the coloring layers is white and light which passes through any one of the coloring layers is red, blue, or green, an image can be displayed using pixels of the four colors.

FIG. 4B illustrates an example in which coloring layers (a red coloring layer 1034R, a green coloring layer 1034G, and a blue coloring layer 1034B) are formed between the gate insulating film 1003 and the first interlayer insulating film 1020. As shown in FIG. 4B, the coloring layers may be provided between the substrate 1001 and the sealing substrate 1031.

Figure 5:
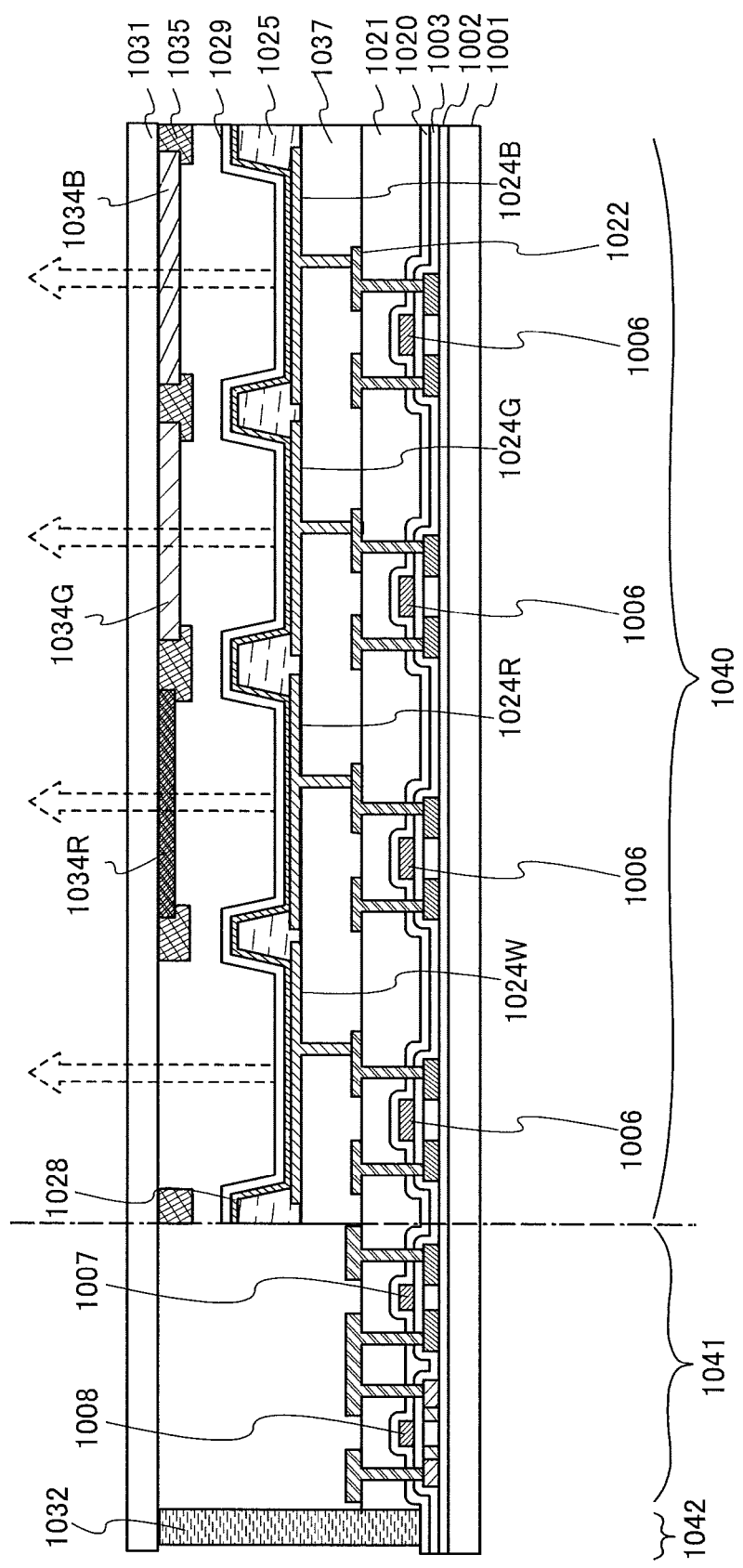
FIG. 5 is a conceptual diagram of an active matrix light-emitting device.

The above-described light-emitting device has a structure in which light is extracted from the substrate 1001 side where the TFTs are formed (a bottom emission structure), but may have a structure in which light is extracted from the sealing substrate 1031 side (a top emission structure). FIG. 5 is a cross-sectional view of a light-emitting device having a top emission structure. In this case, a substrate which does not transmit light can be used as the substrate 1001. The process up to the step of forming a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other known material.

The first electrodes 1024W, 1024R, 1024G, and 1024B of the light-emitting elements each serve as an anode here, but may serve as a cathode. Further, in the case of a light-emitting device having a top emission structure as illustrated in FIG. 5, the first electrodes are preferably reflective electrodes. The EL layer 1028 is formed to have a structure similar to the structure described in Embodiment 3 or 4, with which white light emission can be obtained.

In FIGS. 4A and 4B and FIG. 5, the structure of the EL layer for providing white light emission can be achieved by, for example, using a plurality of light-emitting layers or using a plurality of light-emitting units. Note that the structure to provide white light emission is not limited to the above.

In the case of a top emission structure as illustrated in FIG. 5, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue may be performed.

Since the light-emitting device of this embodiment uses the light-emitting element described in Embodiment 3 or 4 (the light-emitting element including the organic compound of one embodiment of the present invention), the light-emitting device can have favorable characteristics. Specifically, the organic compound of one embodiment of the present invention has a wide band gap and a high triplet level and can inhibit energy transfer from a light-emitting substance; thus, a light-emitting element having high emission efficiency can be provided, leading to a light-emitting device having reduced power consumption. Furthermore, the organic compound of one embodiment of the present invention has a high carrier-transport property, so that a light-emitting element with low driving voltage can be provided, leading to a light-emitting device with low driving voltage.

Figure 6A:
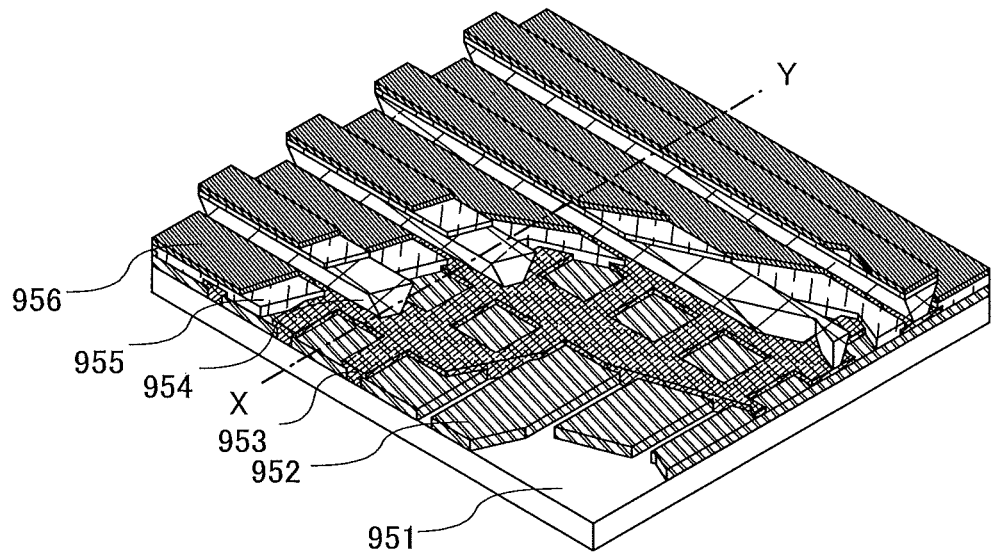
FIGS. 6A and 6B are conceptual diagrams of a passive matrix light-emitting device.
Figure 6B:
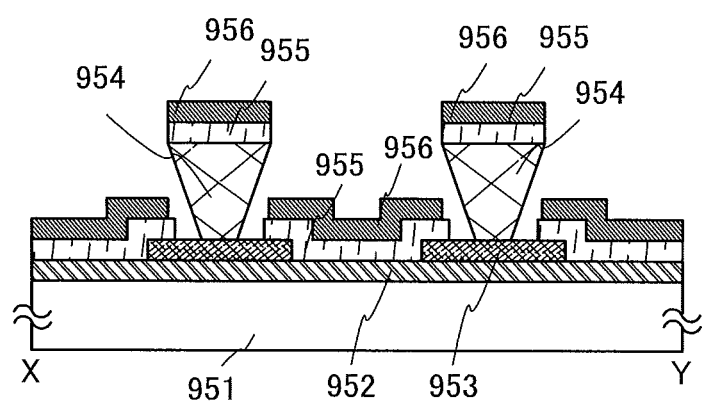

An active matrix light-emitting device is described above, whereas a passive matrix light-emitting device is described below. FIGS. 6A and 6B illustrate a passive matrix light-emitting device fabricated by application of the present invention. FIG. 6A is a perspective view of the light-emitting device, and FIG. 6B is a cross-sectional view of FIG. 6A taken along line X-Y. In FIGS. 6A and 6B, over a substrate 951, an EL layer 955 is provided between an electrode 952 and an electrode 956. An edge portion of the electrode 952 is covered with an insulating layer 953. A partition layer 954 is provided over the insulating layer 953. The sidewalls of the partition layer 954 slope so that the distance between one sidewall and the other sidewall gradually decreases toward the surface of the substrate. In other words, a cross section taken along the direction of the short side of the partition layer 954 is trapezoidal, and the base (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). By providing the partition layer 954 in such a manner, a defect of the light-emitting element due to static electricity or the like can be prevented. The passive matrix light-emitting device can also be driven with low power consumption, by including the light-emitting element described in Embodiment 3 or 4 (the light-emitting element including the organic compound of one embodiment of the present invention) capable of operating at low driving voltage. Furthermore, the passive matrix light-emitting device can be driven with low power consumption by including the light-emitting element using the organic compound of one embodiment of the present invention and having a high emission efficiency (the light-emitting element described in Embodiment 3 or 4).

Since many minute light-emitting elements arranged in a matrix in the light-emitting device described above can each be controlled, the light-emitting device can be suitably used as a display device for displaying images.

(Embodiment 6)

In this embodiment, electronic devices each including the light-emitting element described in Embodiment 3 or 4 will be described. The light-emitting element described in Embodiment 3 or 4 includes the organic compound of one embodiment of the present invention and thus has reduced power consumption; as a result, the electronic devices described in this embodiment can each include a display portion having reduced power consumption. In addition, the electronic devices can have low driving voltage since the light-emitting element described in Embodiment 3 or 4 has low driving voltage.

Examples of the electronic device to which the above light-emitting element is applied include television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, large game machines such as pachinko machines, and the like. Specific examples of these electronic devices are given below.

Figure 7A:
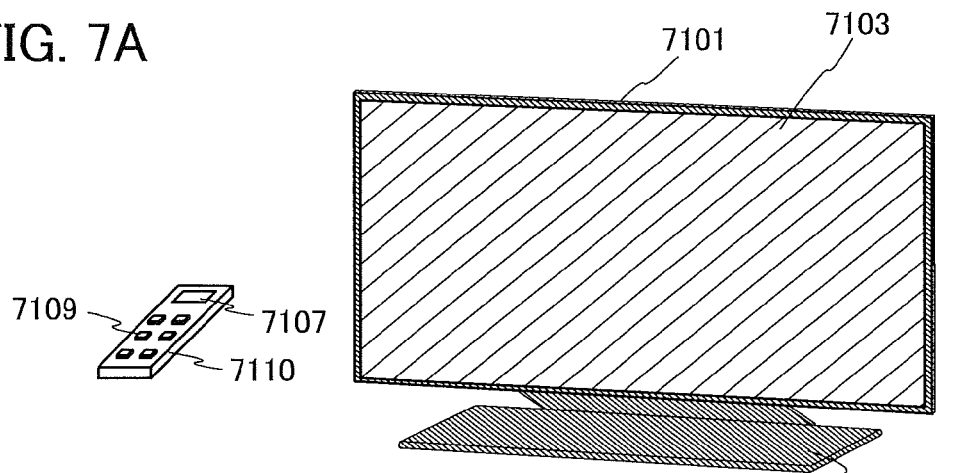
FIGS. 7A to 7D illustrate electronic devices.

FIG. 7A illustrates an example of a television device. In the television device, a display portion 7103 is incorporated in a housing 7101. In addition, here, the housing 7101 is supported by a stand 7105. The display portion 7103 enables display of images and includes light-emitting elements which are the same as the light-emitting element described in Embodiment 3 or 4 and arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 7B:
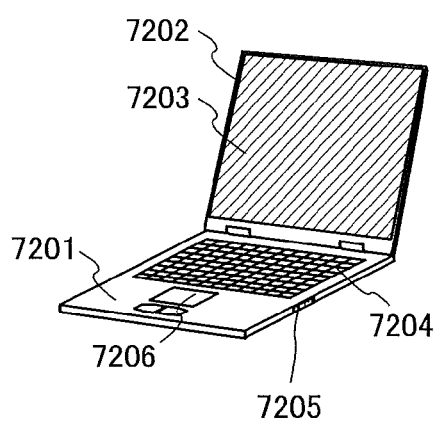

FIG. 7B illustrates a computer, which includes a main body 7201, a housing 7202, a display portion 7203, a keyboard 7204, an external connection port 7205, a pointing device 7206, and the like. Note that this computer is fabricated by using light-emitting elements arranged in a matrix in the display portion 7203, which are the same as that described in Embodiment 3 or 4.

Figure 7C:
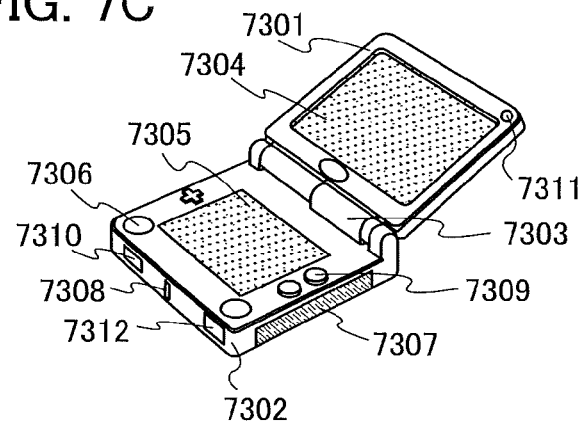

FIG. 7C illustrates a portable game machine having two housings, a housing 7301 and a housing 7302, which are connected with a joint portion 7303 so that the portable game machine can be opened or folded. A display portion 7304 including light-emitting elements which are the same as that described in Embodiment 3 or 4 and arranged in a matrix is incorporated in the housing 7301, and a display portion 7305 is incorporated in the housing 7302. In addition, the portable game machine illustrated in FIG. 7C includes a speaker portion 7306, a recording medium insertion portion 7307, an LED lamp 7308, an input unit (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as far as the display portion including light-emitting elements which are the same as that described in Embodiment 3 or 4 and arranged in a matrix is used as at least either the display portion 7304 or the display portion 7305, or both, and the structure can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above.

Figure 7D:
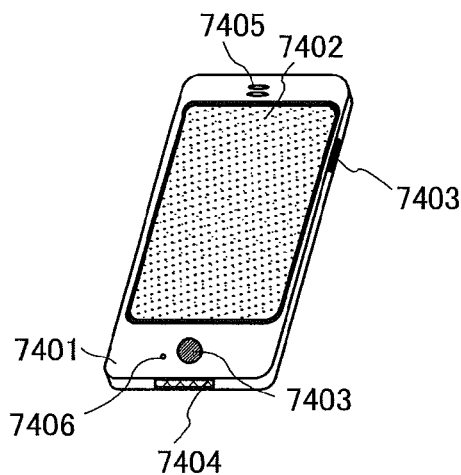

FIG. 7D illustrates an example of a mobile phone. A mobile phone is provided with a display portion 7402 incorporated in a housing 7401, operation buttons 7403, an external connection port 7404, a speaker 7405, a microphone 7406, and the like. Note that the mobile phone has the display portion 7402 including light-emitting elements which are the same as that described in Embodiment 3 or 4 and arranged in a matrix.

When the display portion 7402 of the mobile phone illustrated in FIG. 7D is touched with a finger or the like, data can be input into the mobile phone. In this case, operations such as making a call and creating e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone, display on the screen of the display portion 7402 can be automatically changed by determining the orientation of the mobile phone (whether the mobile phone is placed horizontally or vertically for a landscape mode or a portrait mode).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits near-infrared light in the display portion, an image of a finger vein, a palm vein, or the like can be taken.

Note that the structure described in this embodiment can be combined with any of the structures described in Embodiments 1 to 5 as appropriate.

As described above, the application range of the light-emitting device having the light-emitting element described in Embodiment 3 or 4 which includes the organic compound of one embodiment of the present invention is wide so that this light-emitting device can be applied to electronic devices in a variety of fields. By using the organic compound of one embodiment of the present invention, an electronic device having reduced power consumption and low driving voltage can be obtained.

The light-emitting element including the organic compound of one embodiment of the present invention can also be used for a light source device. One mode of application of the light-emitting element including the organic compound of one embodiment of the present invention to a light source device is described with reference to FIG. 8. Note that the light source device includes a light-emitting element including the organic compound of one embodiment of the present invention as a light irradiation unit and at least includes an input-output terminal portion which supplies current to the light-emitting element. Further, the light-emitting element is preferably shielded from the outside atmosphere by sealing.

Figure 8:
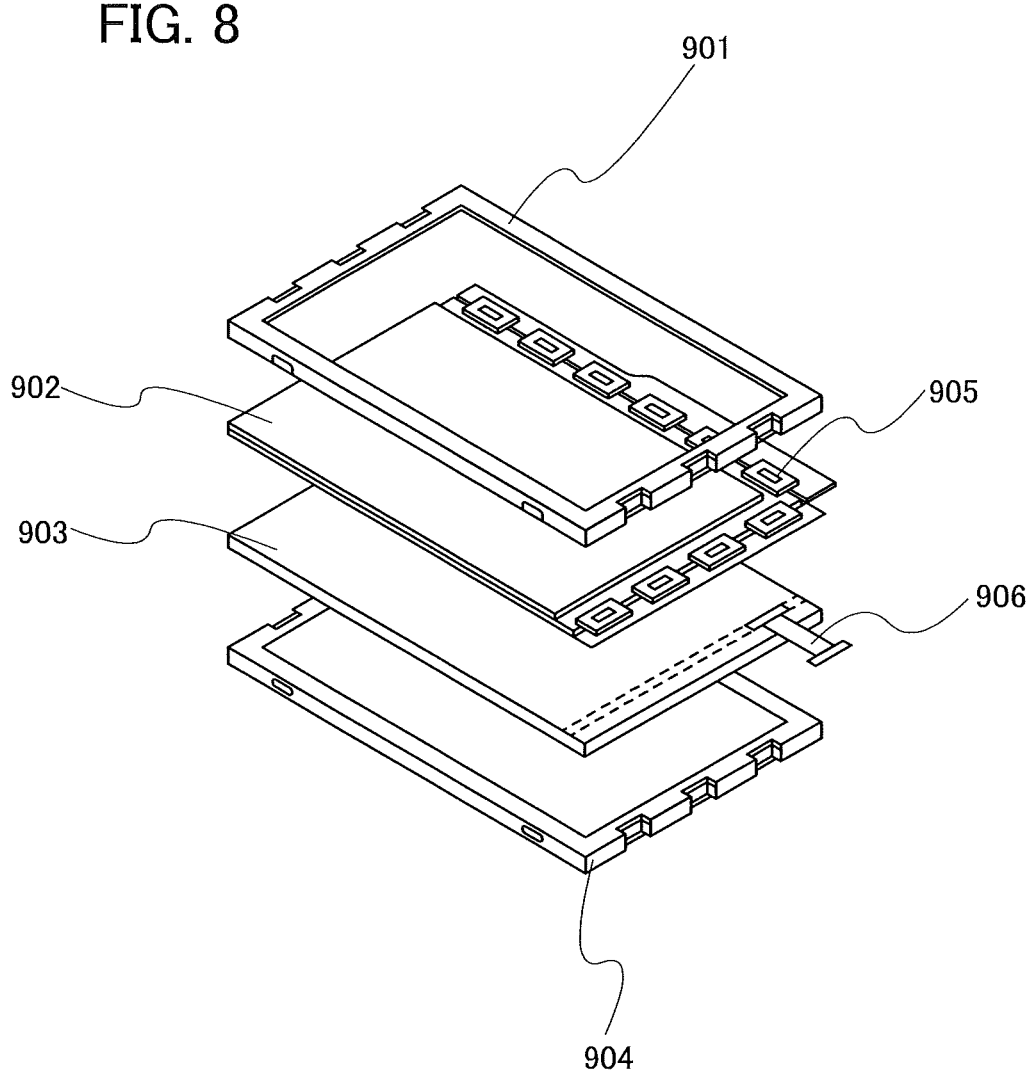
FIG. 8 illustrates a light source device.

FIG. 8 illustrates an example of a liquid crystal display device using the light-emitting elements including the organic compound of one embodiment of the present invention for a backlight. The liquid crystal display device illustrated in FIG. 8 includes a housing 901, a liquid crystal layer 902, a backlight 903, and a housing 904. The liquid crystal layer 902 is connected to a driver IC 905. The light-emitting element including the above organic compound is used in the backlight 903, to which current is supplied through a terminal 906.

The light-emitting element including the above organic compound is used for the backlight of the liquid crystal display device; thus, the backlight can have reduced power consumption. In addition, the use of the light-emitting element including the above organic compound enables fabrication of a planar-emission lighting device and further a larger-area planar-emission lighting device; therefore, the backlight can be a larger-area backlight, and the liquid crystal display device can also be a larger-area device. Furthermore, the backlight using the light-emitting element including the above organic compound can be thinner than a conventional one; accordingly, the display device can also be thinner.

Figure 9:
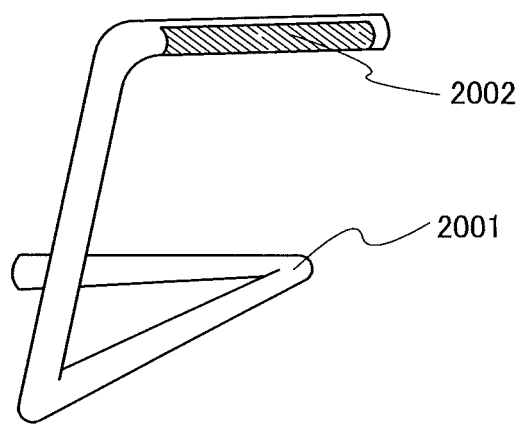
FIG. 9 illustrates a lighting device.

FIG. 9 illustrates an example in which the light-emitting element including the organic compound of one embodiment of the present invention is used for a table lamp which is a lighting device. The table lamp illustrated in FIG. 9 includes a housing 2001 and a light source 2002, and the light-emitting element including the above organic compound is used for the light source 2002.

Figure 10:
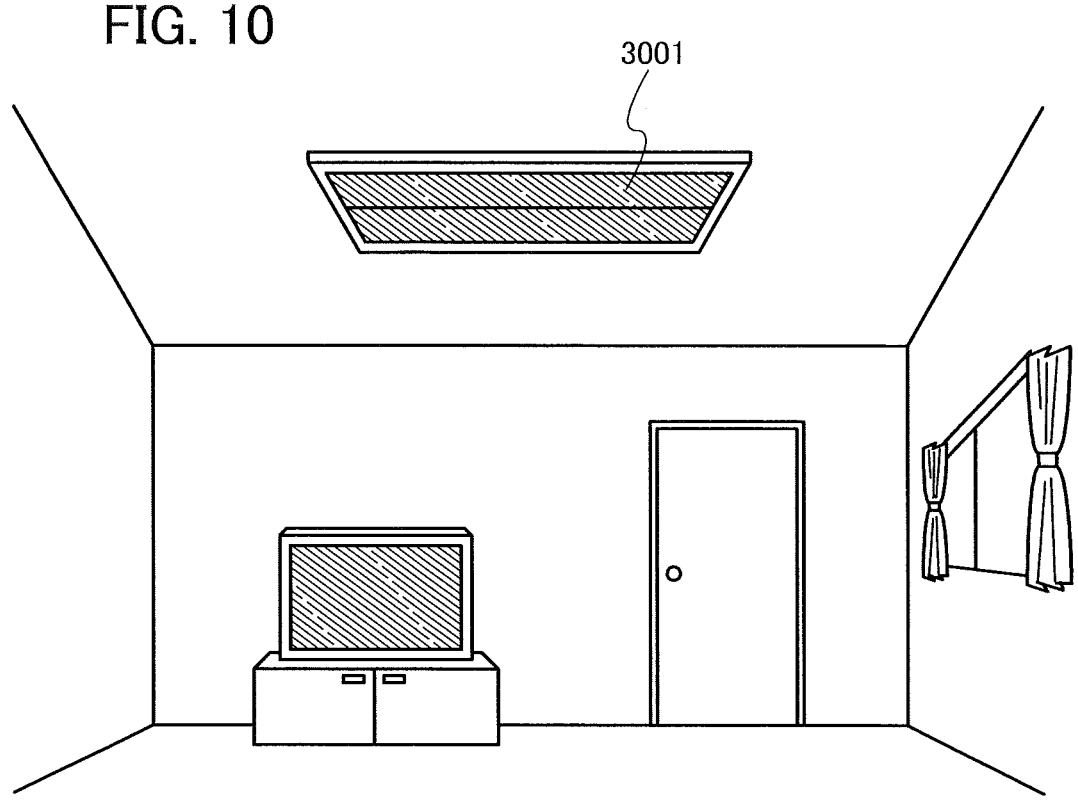
FIG. 10 illustrates a lighting device.

FIG. 10 illustrates an example in which the light-emitting element including the organic compound of one embodiment of the present invention is used for an indoor lighting device 3001. Since the light-emitting element including the above organic compound has reduced power consumption, a lighting device that has reduced power consumption can be obtained. Further, since the light-emitting element including the above organic compound can have a large area, the light-emitting element can be used for a large-area lighting device. Furthermore, since the light-emitting element including the above organic compound is thin, a lighting device having a reduced thickness can be fabricated.

Figure 11:
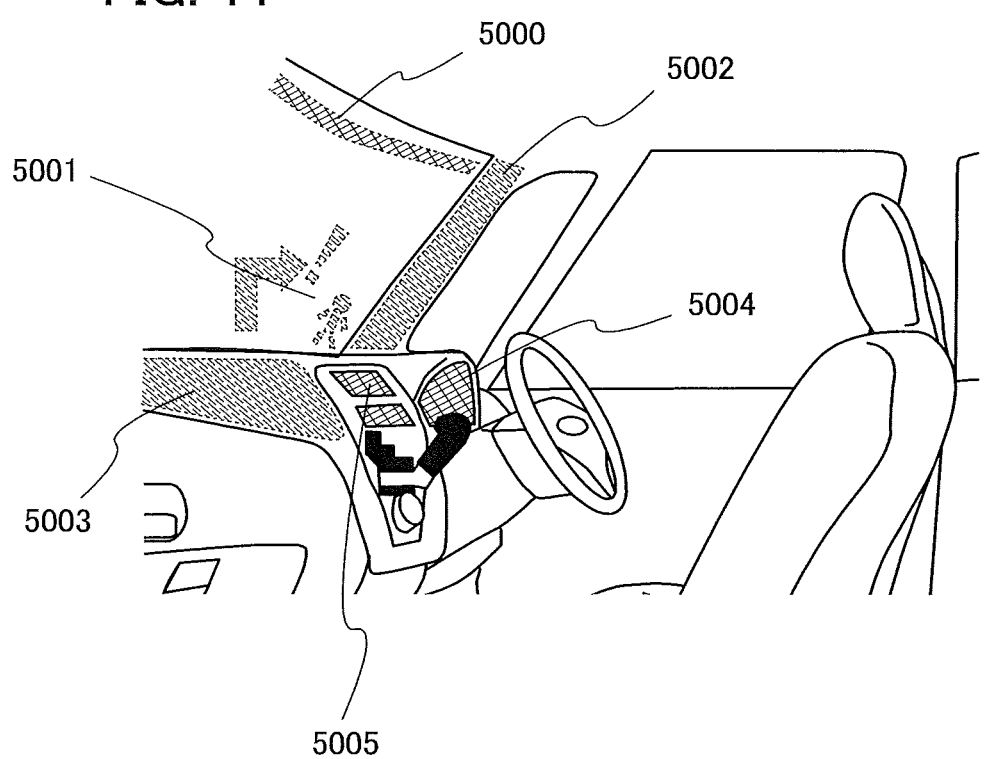
FIG. 11 illustrates in-vehicle display devices and lighting devices.

The light-emitting element including the organic compound of one embodiment of the present invention can also be used for an automobile windshield or an automobile dashboard. FIG. 11 illustrates one mode in which the light-emitting elements including the above organic compound are used for an automobile windshield and an automobile dashboard. Display regions 5000 to 5005 each include the light-emitting element that contains the above organic compound.

The display region 5000 and the display region 5001 are provided in an automobile windshield. The light-emitting element including the above organic compound can be formed into a so-called see-through display device, through which the opposite side can be seen, by including a first electrode and a second electrode formed of electrodes having light-transmitting properties. Such see-through display devices can be provided even in the windshield of the car, without hindering the vision. Note that in the case where a transistor for driving the light-emitting element is provided, a transistor having a light-transmitting property, such as an organic transistor using an organic semiconductor material or a transistor using an oxide semiconductor, is preferably used.

A display region 5002 is provided in a pillar portion. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of information by displaying navigation data, speed, the number of revolutions, a mileage, a fuel level, a gearshift state, and air-condition setting. The content or layout of the display can be changed freely by a user as appropriate. Note that such information can also be shown by the display regions 5000 to 5003. The display regions 5000 to 5005 can also be used as lighting devices.

By including the organic compound of one embodiment of the present invention, the light-emitting element including the above compound has low driving voltage and low power consumption. Therefore, load on a battery is small even when a number of large screens such as the display regions 5000 to 5005 are provided, which provides comfortable use. For that reason, the light-emitting device and the lighting device each of which includes the light-emitting element including the above organic compound can be suitably used as an in-vehicle light-emitting device and lighting device.

Figure 12A:
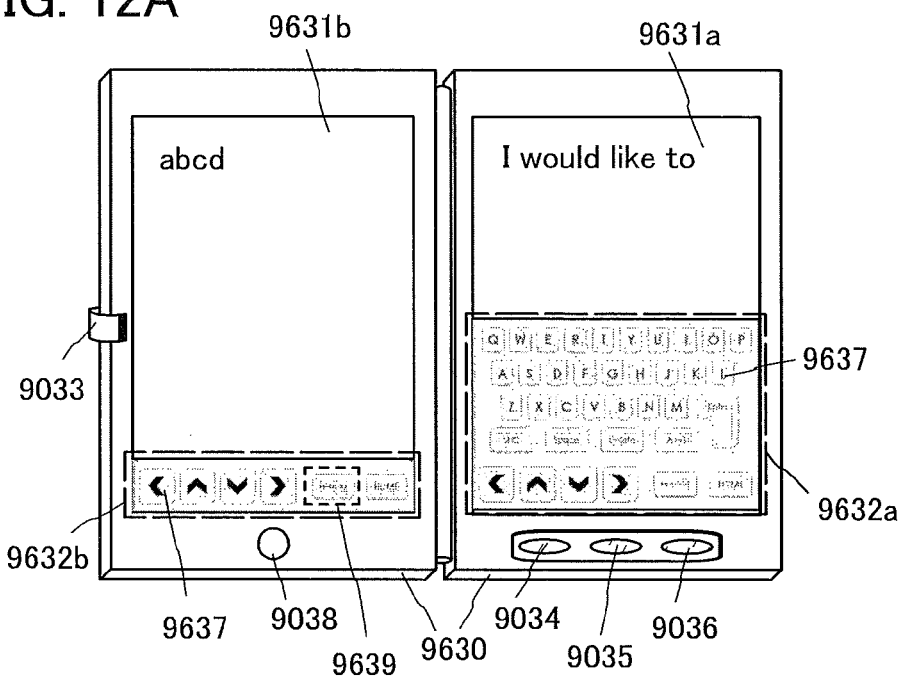
FIGS. 12A to 12C illustrate an electronic device.
Figure 12B:
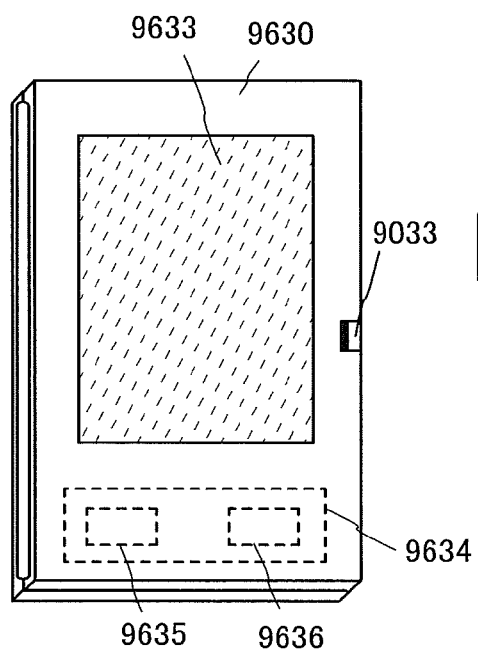

FIGS. 12A and 12B illustrate an example of a foldable tablet terminal. FIG. 12A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038. Note that in the tablet terminal, one or both of the display portion 9631a and the display portion 9631b is/are formed using a light-emitting device which includes a light-emitting element including the above organic compound.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard is displayed on the entire region of the display portion 9631a so that the display portion 9631a is used as a touchscreen; thus, the display portion 9631b can be used as a display screen.

Like the display portion 9631a, part of the display portion 9631b can be a touchscreen region 9632b. When a keyboard display switching button 9639 displayed on the touchscreen is touched with a forger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving switch 9036 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, one display panel may be capable of higher-resolution display than the other display panel.

FIG. 12B illustrates the tablet terminal which is folded. The tablet terminal includes the housing 9630, a solar cell 9633, a charge and discharge control circuit 9634, a battery 9635, and a DC-to-DC converter 9636. As an example, FIG. 12B illustrates the charge and discharge control circuit 9634 including the battery 9635 and the DC-to-DC converter 9636.

Since the tablet terminal is foldable, the housing 9630 can be closed when the tablet terminal is not in use. As a result, the display portion 9631a and the display portion 9631b can be protected, which offers a tablet terminal having excellent durability and high reliability in terms of long-term use.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or two surfaces of the housing 9630, in which case the battery 9635 can be charged efficiently.

Figure 12C:
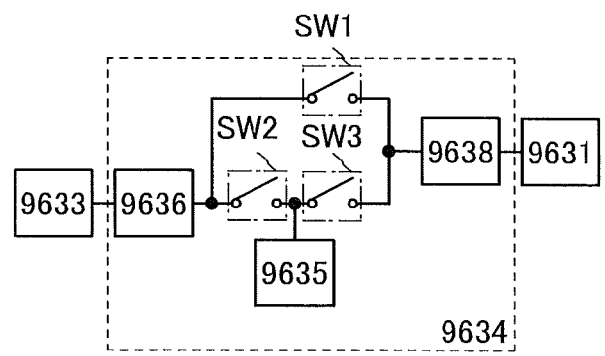

The structure and operation of the charge and discharge control circuit 9634 illustrated in FIG. 12B will be described with reference to a block diagram of FIG. 12C. FIG. 12C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 illustrated in FIG. 12B.

First, description is made of an example of the operation in the case where power is generated by the solar cell 9633 with the use of external light. The voltage of the power generated by the solar cell 9633 is raised or lowered by the DC-to-DC converter 9636 so as to be voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). The battery 9635 may be charged by a non-contact power transmission module which is capable of charging by transmitting and receiving power by wireless (without contact), or another charge unit used in combination, and the power generation unit is not necessarily provided.

One embodiment of the present invention is not limited to the electronic device having the shape illustrated in FIGS. 12A to 12C as long as the display portion 9631 is included.

EXAMPLE 1

In this example, a synthesis method and properties of 4,4'-bis[3-(dibenzothiophen-4-yl)phenyl]-2,2'-bipyridine (abbreviation: 4,4'mDBTP2BPy-II) represented by Structural Formula (200), which is one of organic compounds represented by General Formula (G1), will be described.

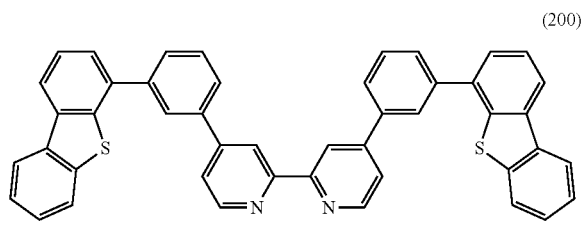

(200)

<Synthesis Method>

Into a 500-mL three-neck flask were put 3.1 g (10 mmol) of 4,4'-dibromo-2,2'-bipyridine, 6.7 g (22 mmol) of 3-(dibenzothiophen-4-yl)phenylboronic acid, 100 mL of toluene, 15 mL of ethanol, and 15 mL of a 2M aqueous solution of sodium carbonate. The mixture was degassed by being stirred under reduced pressure, and the air in the flask was replaced with nitrogen. Then, 0.43 g (0.37 mmol) of tetrakis(triphenylphosphine)palladium(0) was added to the mixture, and the mixture was stirred at 0.100° C. under a nitrogen stream for 3.5 hours. After the predetermined time elapsed, this mixture was cooled to 60° C., 100 mL of toluene and 15 mL of water were added to the mixture, and a solid was collected by suction filtration. A methanol suspension of this solid was irradiated with ultrasonic waves, and a solid was collected by suction filtration. The obtained solid was dissolved in toluene, and the toluene solution was suction filtered through Celite (produced by Wako Pure Chemical Industries, Ltd., Catalog No. 531-16855, the same shall apply hereinafter) and alumina, and the filtrate was concentrated. An obtained solid was recrystallized with toluene, so that 2.2 g of a target white powder was obtained in a yield of 32%. The synthesis scheme of this reaction is shown below.

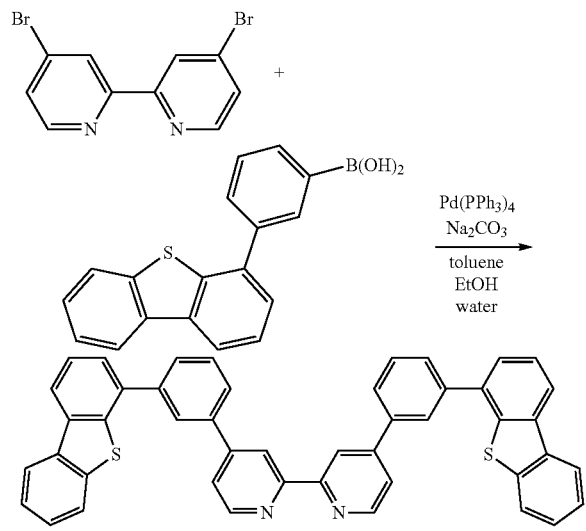

By a train sublimation method, 2.2 g of the obtained powder of 4,4'-bis[3-(dibenzothiophen-4-yl)phenyl]-2,2'-bipyridine was purified by sublimation. The purification by sublimation was carried out by heating 4,4'-bis[3-(dibenzothiophen-4-yl)phenyl]-2,2'-bipyridine at 340° C. under a pressure of 3.1 Pa with an argon flow rate of 5.0 mL/min After the purification by sublimation, 2.0 g of a white powder of 4,4'mDBTP2BPy-II was obtained at a collection rate of 91%.

The $^1$H NMR data of the obtained compound are as follows: $^1$H NMR (CDCl$_3$, 300 MHz): δ=7.47-7.50 (m, 4H), 7.56-7.70 (m, 8H), 7.83-7.90 (m, 6H), 8.15 (s, 2H), 8.19-8.23 (m, 4H), 8.78 (d, J=5.4 Hz, 2H), 8.82 (s, 2H).

Figure 13A:
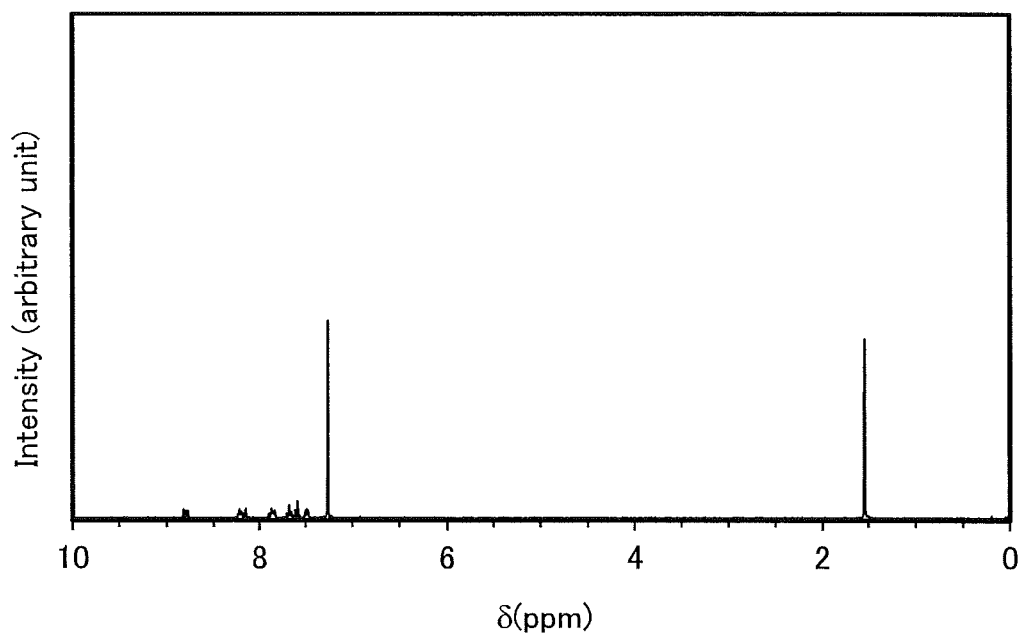
FIGS. 13A and 13B are NMR charts of 4,4'mDBTP2BPy-II.
Figure 13B:
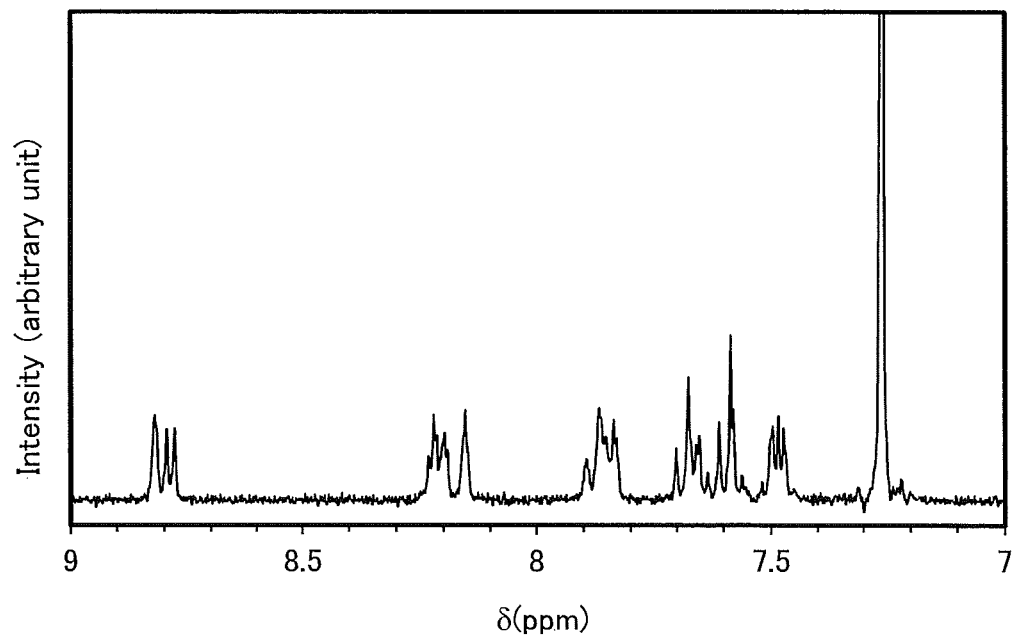

FIGS. 13A and 13B show $^1$H NMR charts. Note that FIG. 13B is a chart showing an enlarged part of FIG. 13A in the range of 7.00 ppm to 9.0 ppm. The measurement results show that 4,4'mDBTP2BPy-II, which was the target substance, was obtained.

<<Properties of 4,4'mDBTP2BPy-II>>

Figure 14A:
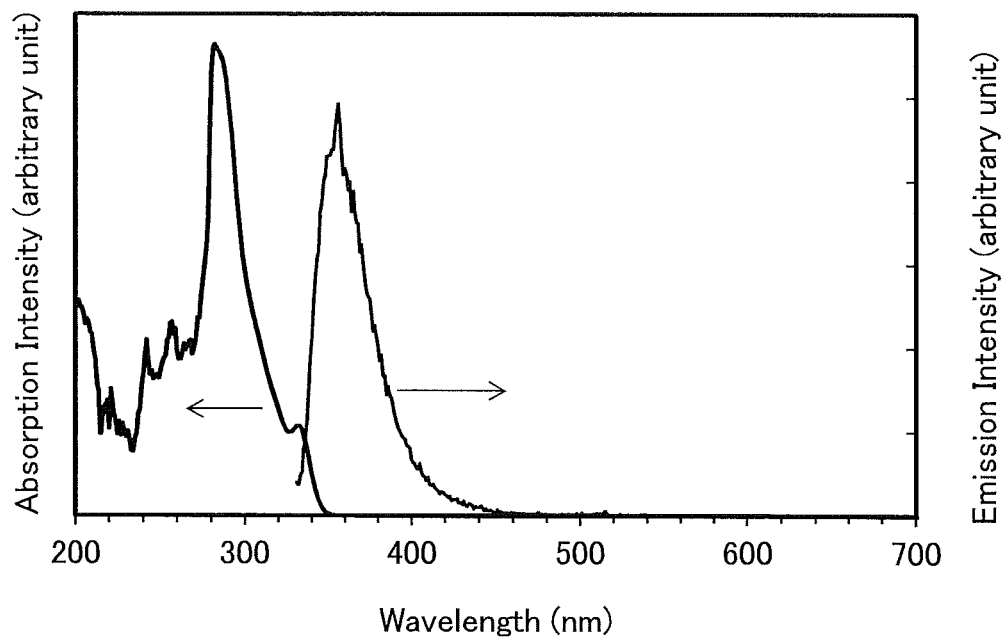
FIGS. 14A and 14B show absorption spectra and emission spectra of 4,4'mDBTP2BPy-II.
Figure 14B:
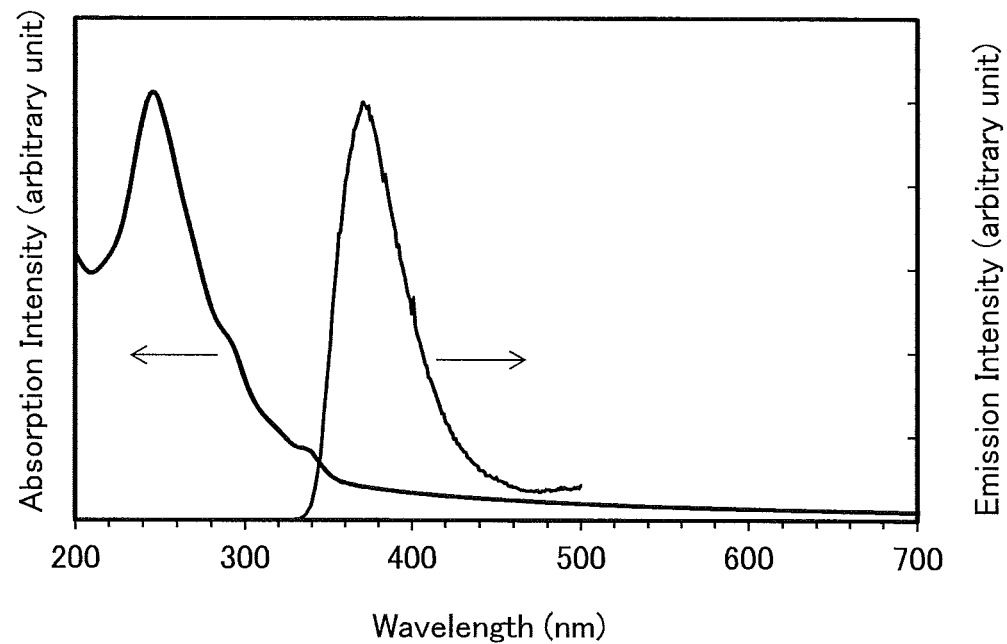

FIG. 14A shows an absorption spectrum and an emission spectrum of a toluene solution of 4,4'mDBTP2BPy-II, and FIG. 14B shows an absorption spectrum and an emission spectrum of a thin film of 4,4'mDBTP2BPy-II. The spectra were measured with a UV-visible spectrophotometer (V550, produced by JASCO Corporation). The spectra of the toluene solution were obtained with the toluene solution of 4,4'mDBTP2BPy-II put in a quartz cell. The spectra of the thin film were measured with a sample prepared by deposition of 4,4'mDBTP2BPy-II on a quartz substrate by evaporation. Note that in the case of the absorption spectrum of the toluene solution of 4,4'mDBTP2BPy-II, the absorption spectrum obtained by subtraction of the absorption spectra of the quartz cell and toluene from the raw spectra is illustrated. In the case of the absorption spectrum of the thin film of 4,4'mDBTP2BPy-II, the absorption spectrum obtained by subtraction of the absorption spectrum of the quartz substrate from the raw spectra is illustrated.

As shown in FIG. 14A, in the case of 4,4'mDBTP2BPy-II in the toluene solution, absorption peaks were observed at approximately 332 nm and 282 nm, and an emission peak was observed at approximately 351 nm (excitation wavelength: 333 nm). As shown in FIG. 14B, in the case of the thin film of 4,4'mDBTP2BPy-II, absorption peaks were observed at approximately 336 nm, 318 nm, 288 nm, and 246 nm, and an emission peak was observed at approximately 371 nm (excitation wavelength: 274 nm). Thus, it was found that absorption and emission of 4,4'mDBTP2BPy-II occur in extremely short wavelength regions.

The ionization potential of 4,4'mDBTP2BPy-II in a thin film state was measured by a photoelectron spectrometer (AC-3, manufactured by Riken Keiki, Co., Ltd.) in the air. The obtained value of the ionization potential was converted into a negative value, so that the HOMO level of 4,4'mDBTP2BPy-II was −6.38 eV. From the data of the absorption spectrum of the thin film in FIG. 14B, the absorption edge of 4,4'mDBTP2BPy-II, which was obtained from Tauc plot with an assumption of direct transition, was 3.48 eV. Therefore, the optical band gap of 4,4'mDBTP2BPy-II in a solid state was estimated to be 3.48 eV; from the values of the HOMO level obtained above and this band gap, the LUMO level of 4,4'mDBTP2BPy-II was estimated to be −2.90 eV. The above results show that 4,4'mDBTP2BPy-II in the solid state has a band gap as wide as 3.48 eV.

Phosphorescence of 4,4'mDBTP2BPy-II was measured. The measurement was performed by using a PL microscope, LabRAM HR-PL, produced by HORIBA, Ltd., a He—Cd laser (325 nm) as excitation light, and a CCD detector at a measurement temperature of 10 K. For the measurement, a thin film as a sample was formed over a quartz substrate to a thickness of approximately 50 nm and another quartz substrate was attached to the deposition surface in a nitrogen atmosphere. The results showed that the peak on the shortest wavelength side of a phosphorescence spectrum of 4,4'mDBTP2BPy-II is at 470 nm, which means that 4,4'mDBTP2BPy-II has a high $T_1$ level.

Next, 4,4'mDBTP2BPy-II was analyzed by liquid chromatography mass spectrometry (LC/MS).

The analysis by LC/MS was carried out with Acquity UPLC (produced by Waters Corporation) and Xevo G2 Tof MS (produced by Waters Corporation).

Figure 15:
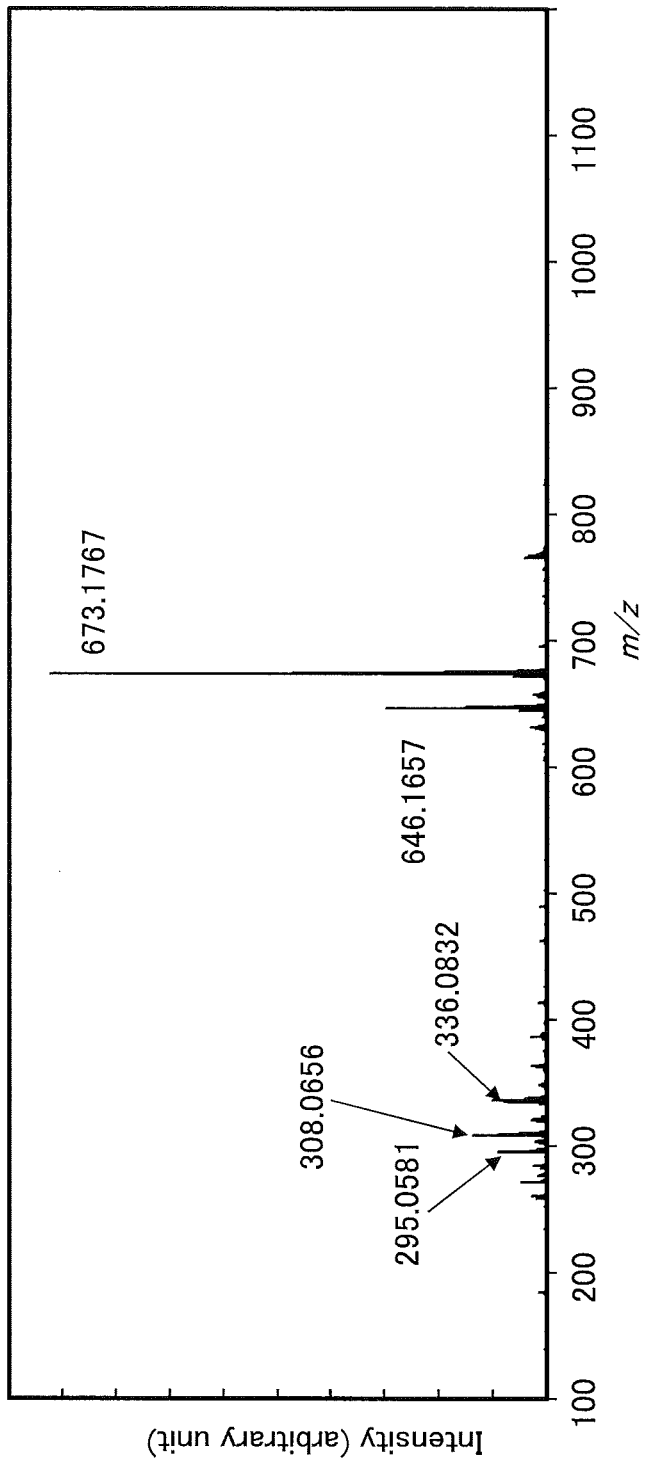
FIG. 15 shows results of LC/MS analysis of 4,4'mDBTP2BPy-II.

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-described conditions was collided with an argon gas in a collision cell to dissociate into product ions. Energy (collision energy) for the collision with argon was 70 eV. A mass range for the measurement was m/z=100 to 1200. FIG. 15 shows the results.

EXAMPLE 2

In this example, a synthesis method and properties of 4,4'-bis[3-(dibenzofuran-4-yl)phenyl]-2,2'-bipyridine (abbreviation: 4,4DBfP2BPy) represented by Structural Formula (100), which is one of organic compounds represented by General Formula (G1), will be described.

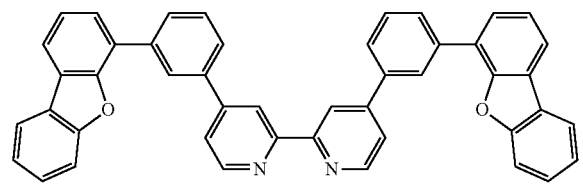

(100)

<Synthesis Method>

Into a 500-mL three-neck flask were put 3.1 g (10 mmol) of 4,4'-dibromo-2,2'-bipyridine, 6.4 g (22 mmol) of 3-(dibenzofuran-4-yl)phenylboronic acid, 120 mL of toluene, 15 mL of ethanol, and an aqueous solution in which 3.2 g (30 mmol) of sodium carbonate was dissolved in 15 mL of water. The mixture was degassed by being stirred under reduced pressure, and the air in the flask was replaced with nitrogen. Then, 0.48 g (0.42 mmol) of tetrakis(triphenylphosphine)palladium(0) was added to the mixture, and the mixture was stirred at 100° C. under a nitrogen stream for 13 hours. After the predetermined time elapsed, 120 mL of toluene and 15 mL of water were added to this mixture and stirring was performed at 60° C. for 3 hours. After the predetermined time elapsed, this mixture was suction filtered to give a solid. A methanol suspension of this solid was irradiated with ultrasonic waves, and a solid was collected by suction filtration. The obtained solid was dissolved in hot toluene, and the toluene solution was suction filtered through Celite (produced by Wako Pure Chemical Industries, Ltd., Catalog No. 531-16855, the same shall apply hereinafter) and alumina, and the filtrate was concentrated. An obtained solid was recrystallized with toluene, so that 3.7 g of a target white powder was obtained in a yield of 58%. The synthesis scheme of this reaction is shown below.

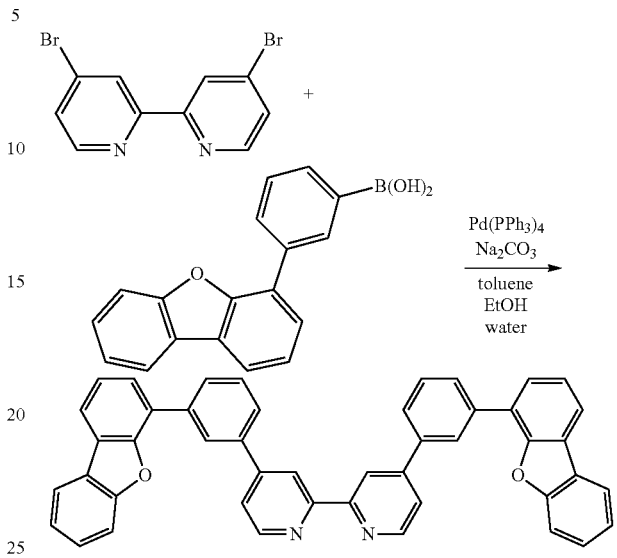

By a train sublimation method, 3.7 g of the obtained powder of 4,4'DBfP2BPy was purified by sublimation. The purification by sublimation was carried out by heating 4,4'DBfP2BPy at 335° C. under a pressure of 3.5 Pa with an argon flow rate of 5.0 mL/min After the purification by sublimation, 2.4 g of a white powder of 4,4'DBfP2BPy was obtained at a collection rate of 65%.

The $^1$H NMR data of the obtained compound are as follows: $^1$H NMR (CDCl$_3$, 300 MHz): δ=7.38 (t, J=7.2 Hz, 2H), 7.46-7.51 (m, 4H), 7.61-7.72 (m, 8H), 7.87 (d, J=7.2 Hz, 2H), 7.99-8.04 (m, 6H), 8.31 (s, 2H), 8.81 (d, J=4.8 Hz, 2H), 8.86 (s, 2H).

Figure 16A:
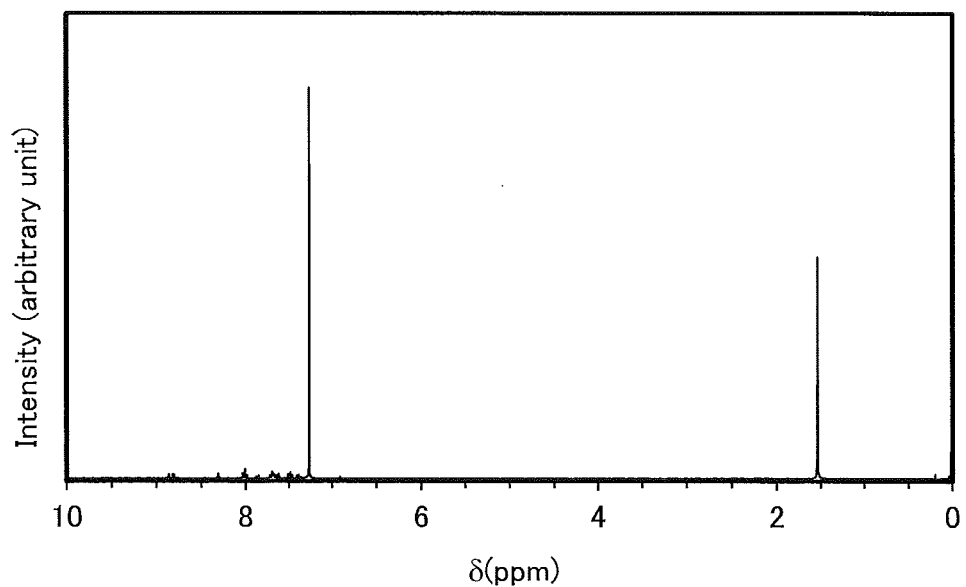
FIGS. 16A and 16B are NMR charts of 4,4'DBfP2BPy.
Figure 16B:
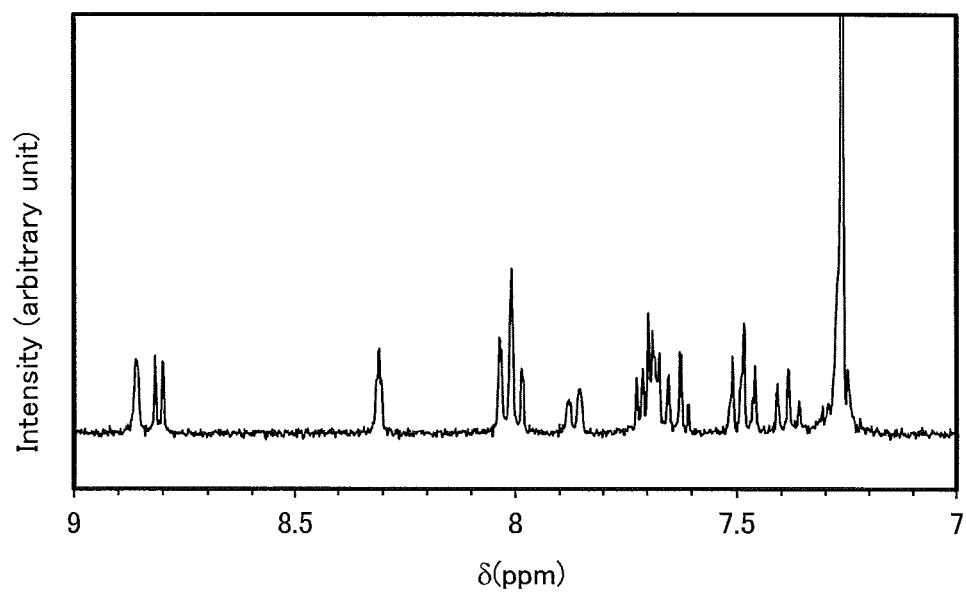

FIGS. 16A and 16B show $^1$H NMR charts. Note that FIG. 16B is a chart showing an enlarged part of FIG. 16A in the range of 7.00 ppm to 9.0 ppm. The measurement results show that 4,4'DBfP2BPy, which was the target substance, was obtained.

<<Properties of 4,4'DBfP2BPy>>

Figure 17A:
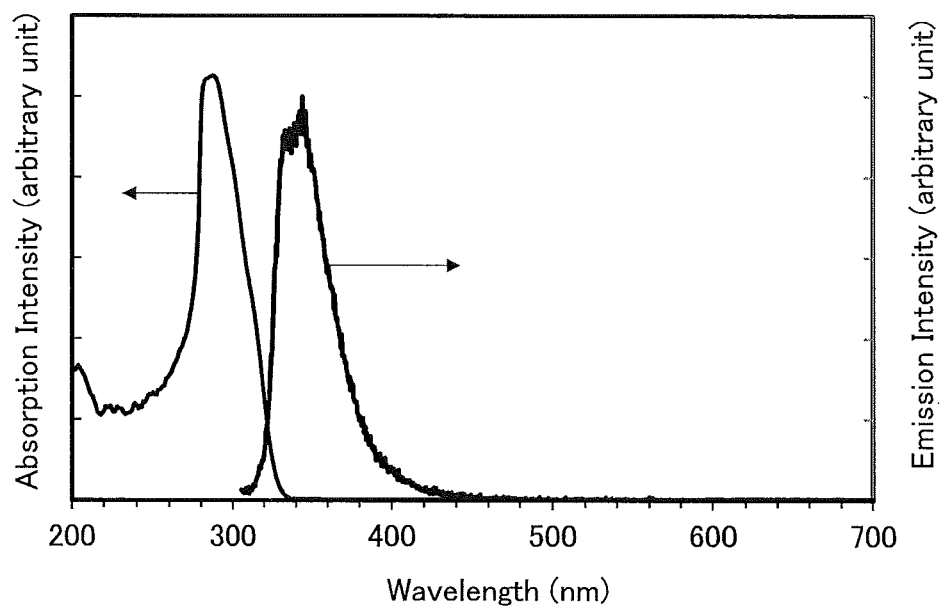
FIGS. 17A and 17B show absorption spectra and emission spectra of 4,4'DBfP2BPy.
Figure 17B:
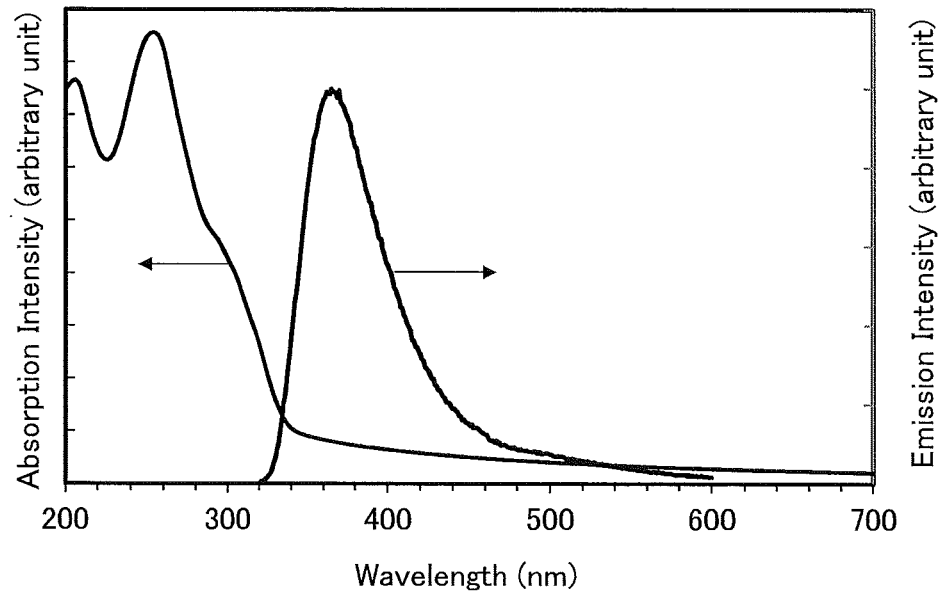

FIG. 17A shows an absorption spectrum and an emission spectrum of a toluene solution of 4,4'DBfP2BPy, and FIG. 17B shows an absorption spectrum and an emission spectrum of a thin film of 4,4'DBfP2BPy. The spectra were measured with a UV-visible spectrophotometer (V550, produced by JASCO Corporation). The spectra of the toluene solution were obtained with the toluene solution of 4,4'DBfP2BPy put in a quartz cell. The spectra of the thin film were measured with a sample prepared by deposition of 4,4'DBfP2BPy on a quartz substrate by evaporation. Note that in the case of the absorption spectrum of the toluene solution of 4,4'DBfP2BPy, the absorption spectrum obtained by subtraction of the absorption spectra of the quartz cell and toluene from the raw spectra is illustrated. In the case of the absorption spectrum of the thin film of 4,4'DBfP2BPy, the absorption spectrum obtained by subtraction of the absorption spectrum of the quartz substrate from the raw spectra is illustrated.

As shown in FIG. 17A, in the case of 4,4'DBfP2BPy in the toluene solution, absorption peaks were observed at approximately 287 nm, 300 nm, and 314 nm, and an emission peak was observed at approximately 344 nm (excitation wavelength: 289 nm). As shown in FIG. 17B, in the case of the thin film of 4,4'DBfP2BPy, absorption peaks were observed at approximately 314 nm, 301 nm, 291 nm, 254 nm, and 206 nm, and an emission peak was observed at approximately 366 nm (excitation wavelength: 305 nm). Thus, it was found that absorption and emission of 4,4'DBfP2BPy occur in extremely short wavelength regions.

The ionization potential of 4,4'DBfP2BPy in a thin film state was measured by a photoelectron spectrometer (AC-3, manufactured by Riken Keiki, Co., Ltd.) in the air. The obtained value of the ionization potential was converted into a negative value, so that the HOMO level of 4,4'DBfP2BPy was −6.47 eV. From the data of the absorption spectrum of the thin film in FIG. 17B, the absorption edge of 4,4'DBfP2BPy, which was obtained from Tauc plot with an assumption of direct transition, was 3.73 eV. Therefore, the optical band gap of 4,4'DBfP2BPy in a solid state was estimated to be 3.73 eV; from the values of the HOMO level obtained above and this band gap, the LUMO level of 4,4'DBfP2BPy was estimated to be −2.74 eV. The above results show that 4,4'DBfP2BPy in the solid state has a band gap as wide as 3.73 eV.

Phosphorescence of 4,4'DBfP2BPy was measured. The measurement was performed by using a PL microscope, LabRAM HR-PL, produced by HORIBA, Ltd., a He—Cd laser (325 nm) as excitation light, and a CCD detector at a measurement temperature of 10 K. For the measurement, a thin film as a sample was formed over a quartz substrate to a thickness of approximately 50 nm and another quartz substrate was attached to the deposition surface in a nitrogen atmosphere. The results showed that the peak on the shortest wavelength side of a phosphorescence spectrum of 4,4'DBfP2BPy is at 467 nm, which means that 4,4'DBfP2BPy has a high $T_1$ level.

Next, 4,4'DBfP2BPy was analyzed by liquid chromatography mass spectrometry (LC/MS).

The analysis by LC/MS was carried out with Acquity UPLC (produced by Waters Corporation) and Xevo G2 Tof MS (produced by Waters Corporation).

Figure 18:
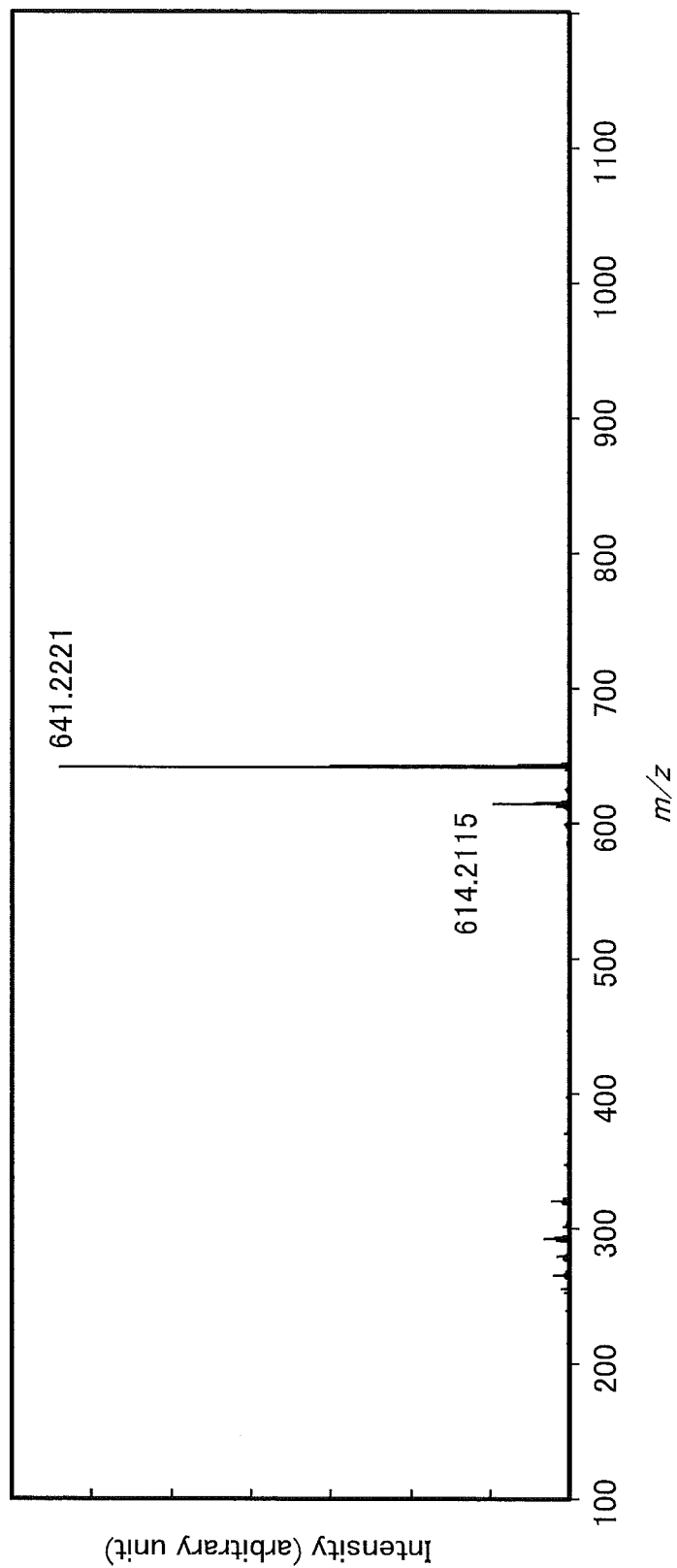
FIG. 18 shows results of LC/MS analysis of 4,4'DBfP2BPy.

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-described conditions was collided with an argon gas in a collision cell to dissociate into product ions. Energy (collision energy) for the collision with argon was 70 eV. A mass range for the measurement was m/z=100 to 1200. FIG. 18 shows the results.

EXAMPLE 3

This example will describe green-emissive phosphorescent light-emitting elements in which 4,4'-bis[3-(dibenzothiophen-4-yl)phenyl]-2,2'-bipyridine (abbreviation: 4,4'mDBTP2BPy-II) or 4,4'-bis[3-(dibenzofuran-4-yl)phenyl]-2,2'-bipyridine (abbreviation: 4,4'DBfP2BPy) was used as a host material and an electron-transport material (a light-emitting element 1 and a light-emitting element 2) and a green-emissive phosphorescent light-emitting element in which 4,4'-bis[3-(9H-carbazol-9-yl)phenyl]-2,2'-bipyridine (abbreviation: 4,4'mCzP2BPy) was used as a host material and an electron-transport material (a comparative light-emitting element 1).

Molecular structures of organic compounds that were used in this example are shown by Structural Formulae (i) to (vii) below. The element structure in FIG. 1A was employed.

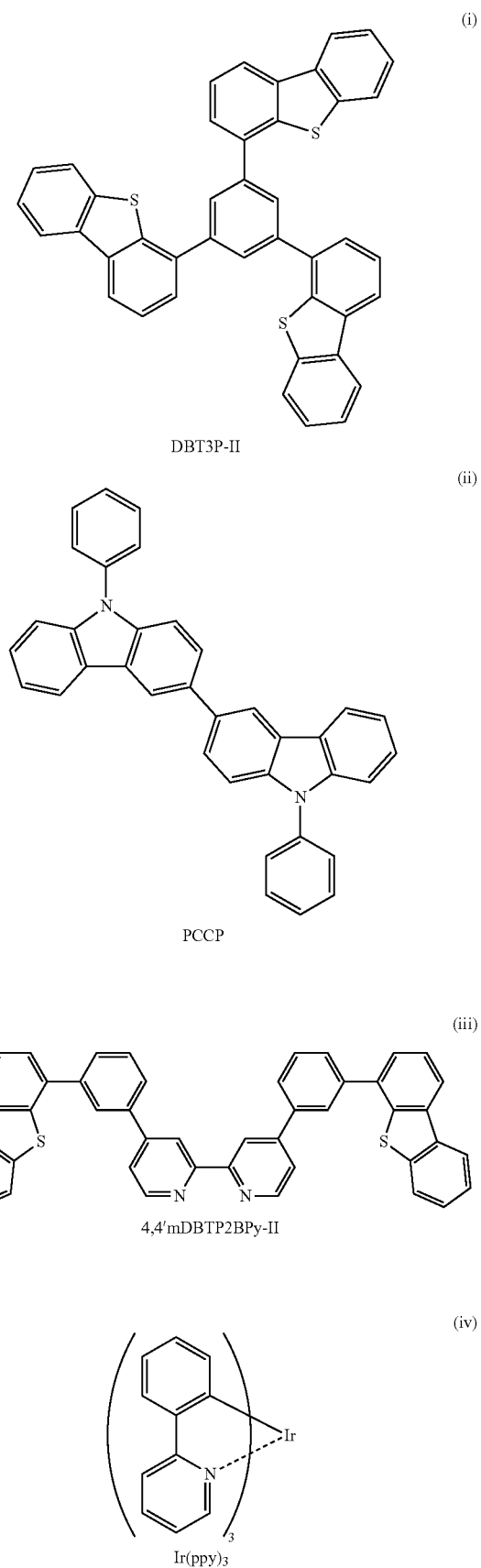

-continued

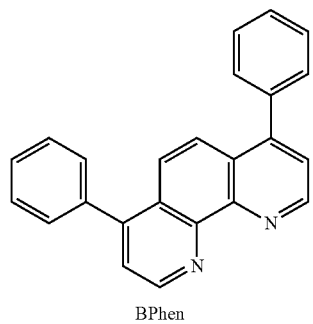
BPhen
(v)

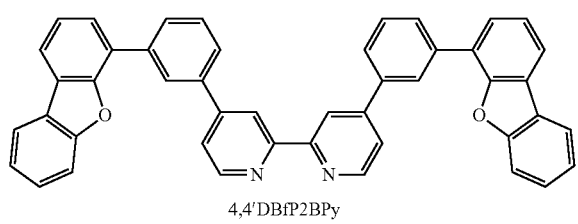
4,4'DBfP2BPy
(vi)

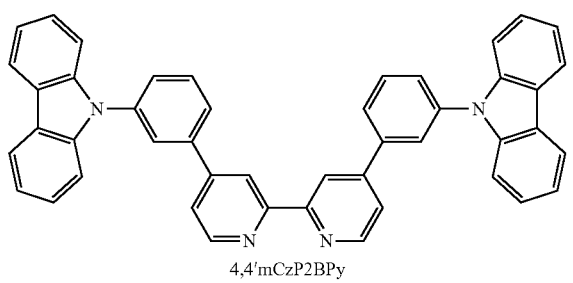
4,4'mCzP2BPy
(vii)

<<Fabrication of Light-emitting Element 1>>

First, a glass substrate, over which a film of indium tin oxide containing silicon (ITSO) was formed to a thickness of 110 nm as the first electrode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, 4,4',4''-(benzene-1,3,5-triyl)tri(dibenzothiophene) (abbreviation: DBT3P-II) represented by Structural Formula (i) and molybdenum(VI) oxide were deposited by co-evaporation so that the weight ratio of DBT3P-II to molybdenum oxide was 4:2, whereby the hole-injection layer 111 was formed. The thickness was set to 60 nm. Note that co-evaporation is an evaporation method in which a plurality of different substances are concurrently vaporized from respective different evaporation sources.

Next, 3,3'-bis(9-phenyl-9H-carbazole) (abbreviation: PCCP) represented by Structural Formula (ii) was deposited by evaporation to a thickness of 20 nm, whereby the hole-transport layer 112 was formed.

Moreover, 4,4'-bis[3-(dibenzothiophen-4-yl)phenyl]-2,2'-bipyridine (abbreviation: 4,4'mDBTP2BPy-II) represented by Structural Formula (iii), PCCP, and fac-tris(2-phenylpyridine)iridium (abbreviation: [Ir(ppy)$_3$]) represented by Structural Formula (iv) were co-deposited by evaporation to a thickness of 20 nm on the hole-transport layer 112 so that 4,4'mDBTP2BPy-II:PCCP:[Ir(ppy)$_3$]=1:0.3:0.06 (weight ratio), and then, 4,4'mDBTP2BPy-II and [Ir(ppy)$_3$] were co-deposited by evaporation to a thickness of 20 nm so that 4,4'mDBTP2BPy-II:[Ir(ppy)$_3$]=1:0.06 (weight ratio), whereby the light-emitting layer 113 was formed.

Next, 4,4'mDBTP2BPy-II was deposited by evaporation to a thickness of 10 nm, and then bathophenanthroline (abbreviation: BPhen) represented by Structural Formula (v) was deposited by evaporation to a thickness of 20 nm, whereby the electron-transport layer 114 was formed.

Then, lithium fluoride was deposited by evaporation to a thickness of 1 nm on the electron-transport layer 114, whereby the electron-injection layer 115 was formed. Lastly, a film of aluminum was formed to a thickness of 200 nm as the second electrode 102 which serves as a cathode. Thus, the light-emitting element 1 was completed. Note that in all the above evaporation steps, evaporation was performed by a resistance-heating method.

<<Fabrication of Light-Emitting Element 2>>

The light-emitting element 2 was fabricated in a manner similar to that of the light-emitting element 1 except that 4,4'-bis[3-(dibenzofuran-4-yl)phenyl]-2,2'-bipyridine (abbreviation: 4,4'DBfP2BPy) represented by Structural Formula (vi) was used instead of 4,4'mDBTP2BPy-II.

<<Fabrication of Comparative Light-Emitting Element 1>>

The comparative light-emitting element 1 was fabricated in a manner similar to that of the light-emitting element 1 except that 4,4'-bis[3-(9H-carbazol-9-yl)phenyl]-2,2'-bipyridine (abbreviation: 4,4'mCzP2BPy) represented by Structural Formula (vii) was used instead of 4,4'mDBTP2BPy-II.

<<Operation Characteristics of Light-Emitting Element 1, Light-Emitting Element 2, and Comparative Light-Emitting Element 1>>

The light-emitting element 1, the light-emitting element 2, and the comparative light-emitting element 1 obtained as described above were sealed in a glove box containing a nitrogen atmosphere so as not to be exposed to the air (specifically, a sealant was applied onto an outer edge of each element, and heat treatment at 80° C. for 1 hour and UV treatment were performed at the time of sealing). Then, the operating characteristics of the light-emitting elements were measured. Note that the measurement was carried out at room temperature (in an atmosphere kept at 25° C.).

Figure 19:
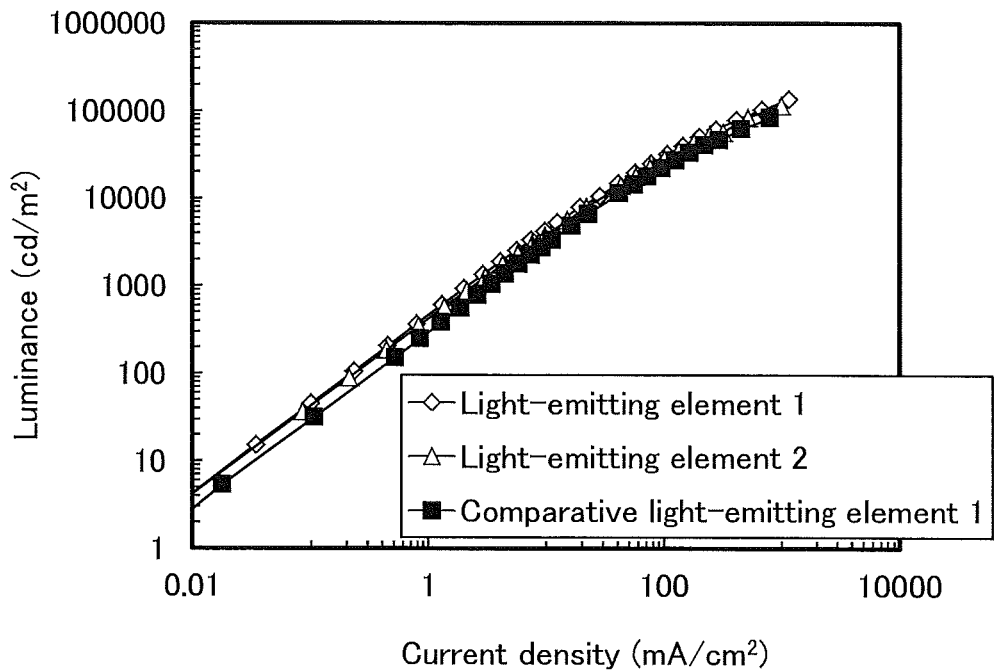
FIG. 19 shows luminance-current density characteristics of a light-emitting element 1, a light-emitting element 2, and a comparative light-emitting element 1.
Figure 20:
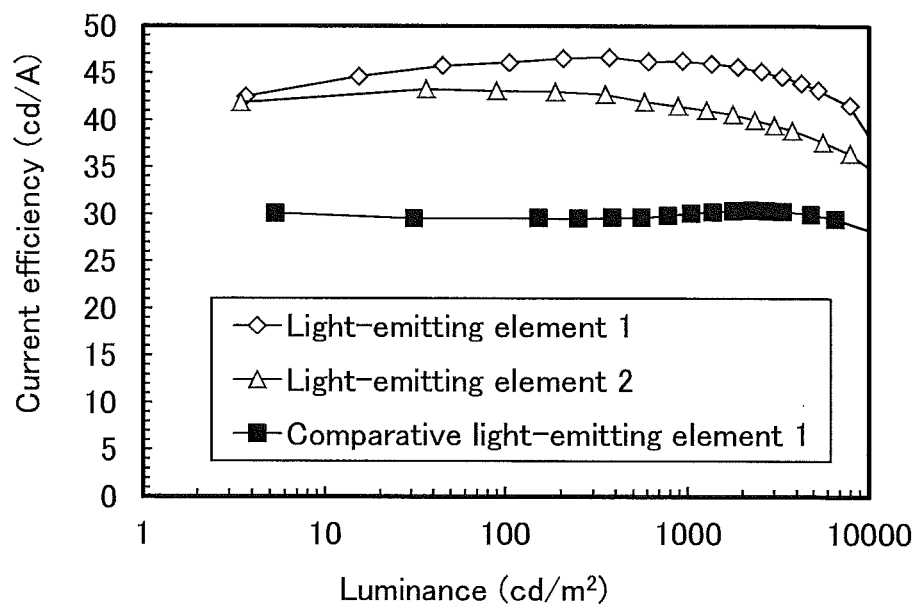
FIG. 20 shows current efficiency-luminance characteristics of a light-emitting element 1, a light-emitting element 2, and a comparative light-emitting element 1.
Figure 21:
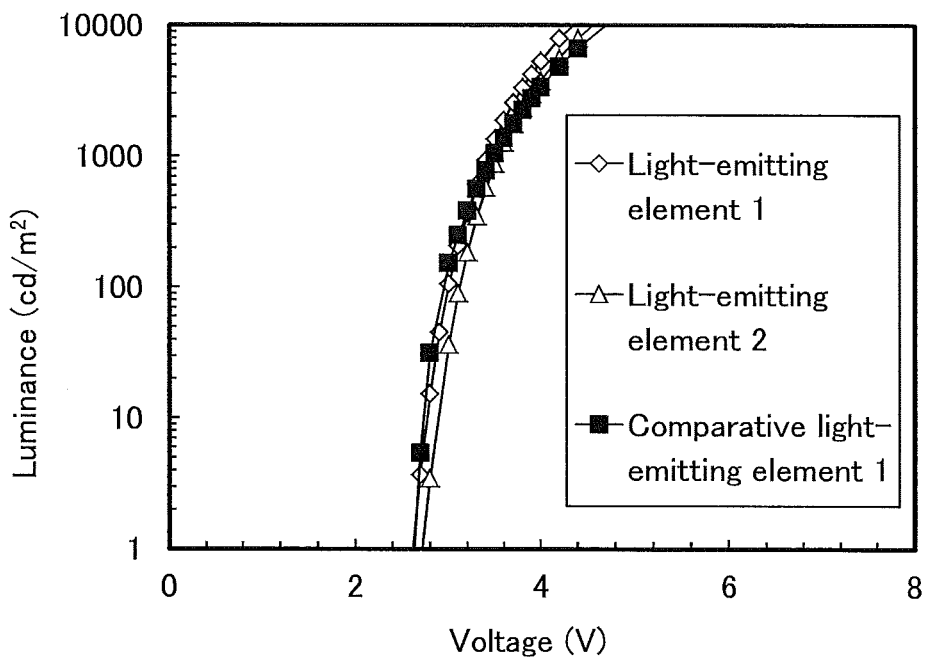
FIG. 21 shows luminance-voltage characteristics of a light-emitting element 1, a light-emitting element 2, and a comparative light-emitting element 1.
Figure 22:
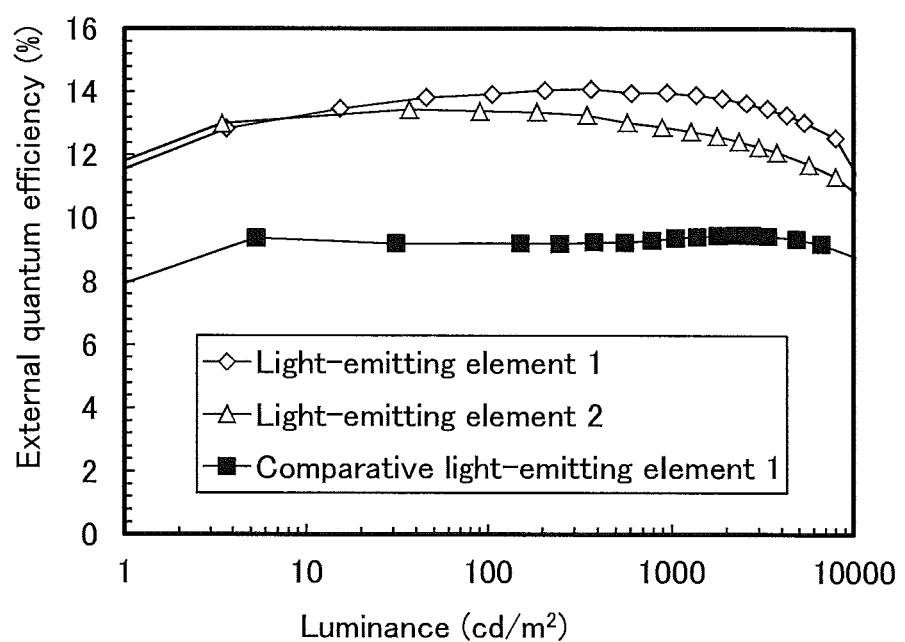
FIG. 22 shows external quantum efficiency-luminance characteristics of a light-emitting element 1, a light-emitting element 2, and a comparative light-emitting element 1.

FIG. 19 shows the luminance-current density characteristics of the light-emitting element 1, the light-emitting element 2, and the comparative light-emitting element 1; FIG. 20 shows the current efficiency-luminance characteristics thereof; FIG. 21 shows the luminance-voltage characteristics thereof; and FIG. 22 shows the external quantum efficiency-luminance characteristics thereof.

FIG. 20 shows that the light-emitting element 1 and the light-emitting element 2 have favorable current efficiency-luminance characteristics and thus have a high emission efficiency. Accordingly, 4,4'mDBTP2BPy-II and 4,4DBfP2BPy have a high triplet level and a wide band gap, and allow even a light-emitting substance emitting green phosphorescence to be effectively excited. Similarly, as shown in FIG. 22, the light-emitting element 1 and the light-emitting element 2 have favorable external quantum efficiency-luminance characteristics. Moreover, FIG. 21 shows that the light-emitting element 1 and the light-emitting element 2 have favorable luminance-voltage characteristics and thus have low driving voltage. This means that 4,4'mDBTP2BPy-II and 4,4'DBfP2BPy have a high carrier-transport property. FIG. 19 also shows that the light-emitting element 1 and the light-emitting element 2 have favorable luminance-current density characteristics.

The above results show that the light-emitting element 1 that contains 4,4'mDBTP2BPy-II and the light-emitting element 2 that contains 4,4'DBfP2BPy have favorable characteristics including a distinctively high emission efficiency as compared to the comparative light-emitting element 1 which was formed in a similar manner using 4,4'mCzP2BPy.

Figure 23:
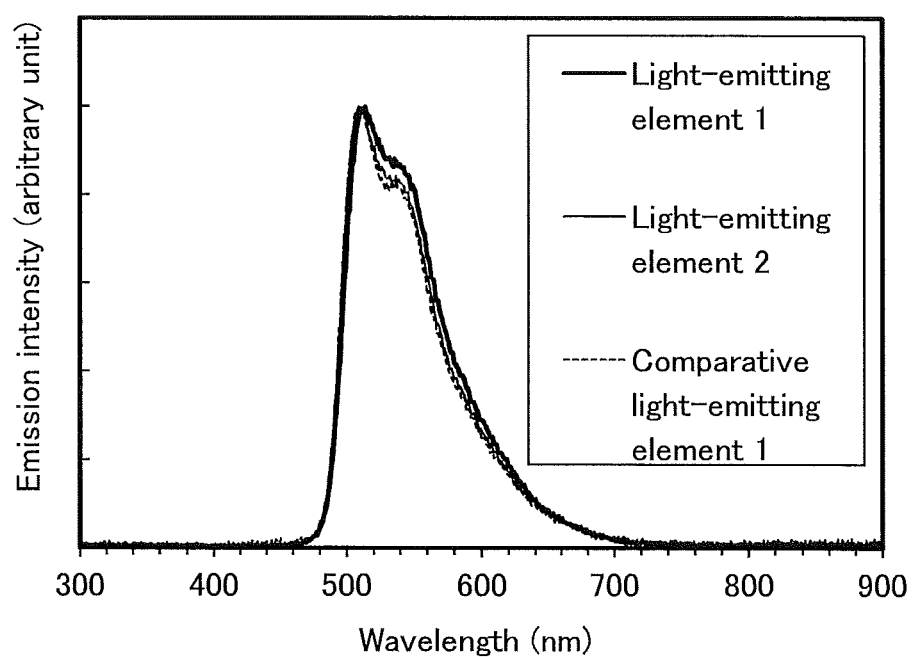
FIG. 23 shows emission spectra of a light-emitting element 1, a light-emitting element 2, and a comparative light-emitting element 1.

FIG. 23 shows emission spectra at the time when a current of 0.1 mA was made to flow in the fabricated light-emitting elements. FIG. 23 shows that the light-emitting element 1, the light-emitting element 2, and the comparative light-emitting element 1 emit green light originating from [Ir(ppy)₃], which is the emission center substance.

Figure 24:
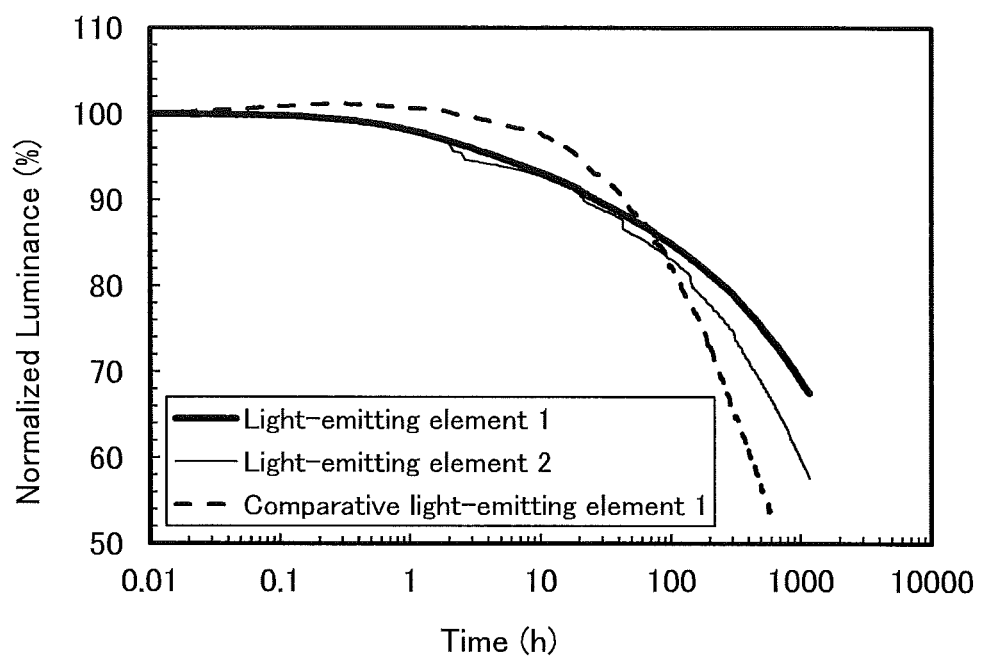
FIG. 24 shows time dependence of normalized luminance of a light-emitting element 1, a light-emitting element 2, and a comparative light-emitting element 1.

Next, these light-emitting elements were subjected to reliability tests. In the reliability tests, a change in luminance (normalized luminance) over driving time was measured with an initial luminance taken as 100% under the conditions where the initial luminance was 1000 cd/m² and the current density was constant. FIG. 24 shows the results. The above results show that the light-emitting element 1 and the light-emitting element 2 have high reliability as compared to the comparative light-emitting element 1.

EXAMPLE 4

This example will describe blue-emissive phosphorescent light-emitting elements in which 4,4'-bis[3-(dibenzothiophen-4-yl)phenyl]-2,2'-bipyridine (abbreviation: 4,4'mDBTP2BPy-II) or 4,4'-bis[3-(dibenzofuran-4-yl)phenyl]-2,2'-bipyridine (abbreviation: 4,4'DBfP2BPy) was used as a host material and an electron-transport material (a light-emitting element 3 and a light-emitting element 4).

Molecular structures of organic compounds that were used in this example are shown by Structural Formulae (i) to (iii), (v), (vi), and (viii). The element structure in FIG. 1A was employed.

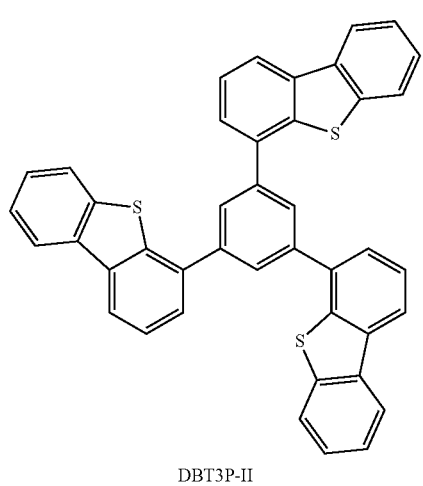

DBT3P-II
(i)

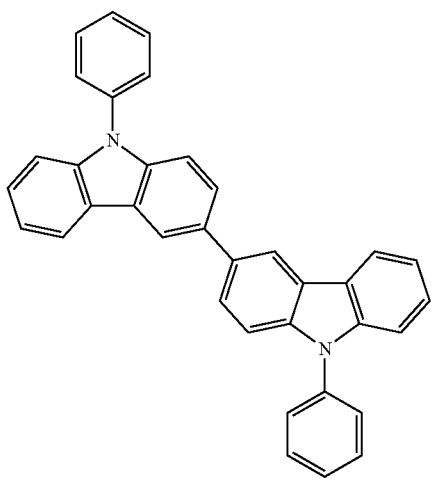

PCCP
(ii)

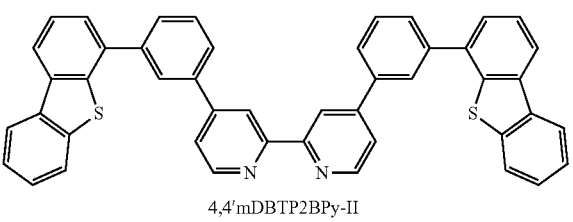

4,4'mDBTP2BPy-II
(iii)

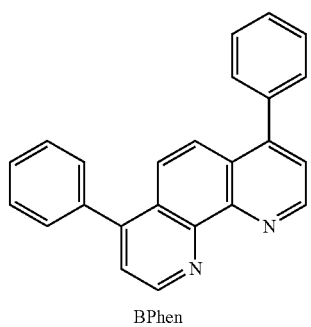

BPhen
(v)

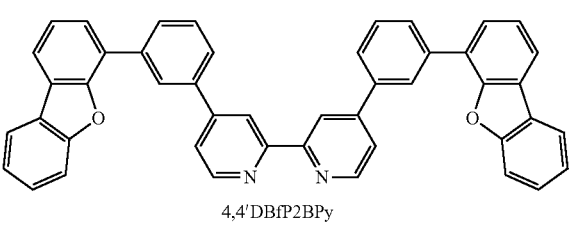

4,4'DBfP2BPy
(vi)

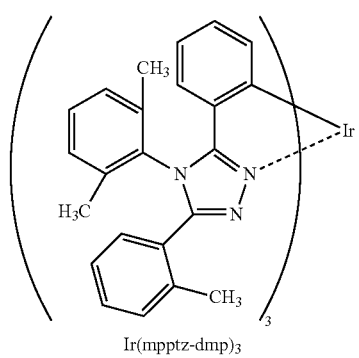

(viii)

Ir(mpptz-dmp)₃

<<Fabrication of Light-Emitting Element 3>>

First, a glass substrate, over which a film of indium tin oxide containing silicon (ITSO) was formed to a thickness of 110 nm as the first electrode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, 4,4',4''-(benzene-1,3,5-triyl)tri(dibenzothiophene) (abbreviation: DBT3P-II) represented by Structural Formula (i) and molybdenum(VI) oxide were deposited by co-evaporation so that the weight ratio of DBT3P-II to molybdenum oxide was 4:2, whereby the hole-injection layer 111 was formed. The thickness was set to 60 nm Note that co-evaporation is an evaporation method in which a plurality of different substances are concurrently vaporized from respective different evaporation sources.

Next, 3,3'-bis(9-phenyl-9H-carbazole) (abbreviation: PCCP) represented by Structural Formula (ii) was deposited by evaporation to a thickness of 20 nm, whereby the hole-transport layer 112 was formed.

Moreover, 4,4'-bis[3-(dibenzothiophen-4-yl)phenyl]-2,2'-bipyridine (abbreviation: 4,4'mDBTP2BPy-II) represented by Structural Formula (iii), PCCP, and tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)₃]) represented by Structural Formula (viii) were co-deposited by evaporation to a thickness of 30 nm on the hole-transport layer 112 so that PCCP:4,4'mDBTP2BPy-II:[Ir(mpptz-dmp)₃]=1:0.3:0.06 (weight ratio), and then, 4,4'mDBTP2BPy-II and [Ir(mpptz-dmp)₃] were co-deposited by evaporation to a thickness of 10 nm so that 4,4'mDBTP2BPy-II:[Ir(mpptz-dmp)₃]=1:0.06 (weight ratio), whereby the light-emitting layer 113 was formed.

Next, 4,4'mDBTP2BPy-II was deposited by evaporation to a thickness of 10 nm, and then bathophenanthroline (abbreviation: BPhen) represented by Structural Formula (v) was deposited by evaporation to a thickness of 15 nm, whereby the electron-transport layer 114 was formed.

Then, lithium fluoride was deposited by evaporation to a thickness of 1 nm on the electron-transport layer 114, whereby the electron-injection layer 115 was formed. Lastly, a film of aluminum was formed to a thickness of 200 nm as the second electrode 102 which serves as a cathode. Thus, the light-emitting element 3 was completed. Note that in all the above evaporation steps, evaporation was performed by a resistance-heating method.

<<Fabrication of Light-Emitting Element 4>>

The light-emitting element 4 was fabricated in a manner similar to that of the light-emitting element 3 except that 4,4'-bis[3-(dibenzofuran-4-yl)phenyl]-2,2'-bipyridine (abbreviation: 4,4'DBfP2BPy) represented by Structural Formula (vi) was used instead of 4,4'mDBTP2BPy-II.

<<Operation Characteristics of Light-Emitting Element 3 and Light-Emitting Element 4>>

The light-emitting element 3 and the light-emitting element 4 obtained as described above were sealed in a glove box containing a nitrogen atmosphere so as not to be exposed to the air (specifically, a sealant was applied onto an outer edge of each element, and heat treatment at 80° C. for 1 hour and UV treatment were performed at the time of sealing). Then, the operating characteristics of the light-emitting elements were measured. Note that the measurement was carried out at room temperature (in an atmosphere kept at 25° C.).

Figure 25:
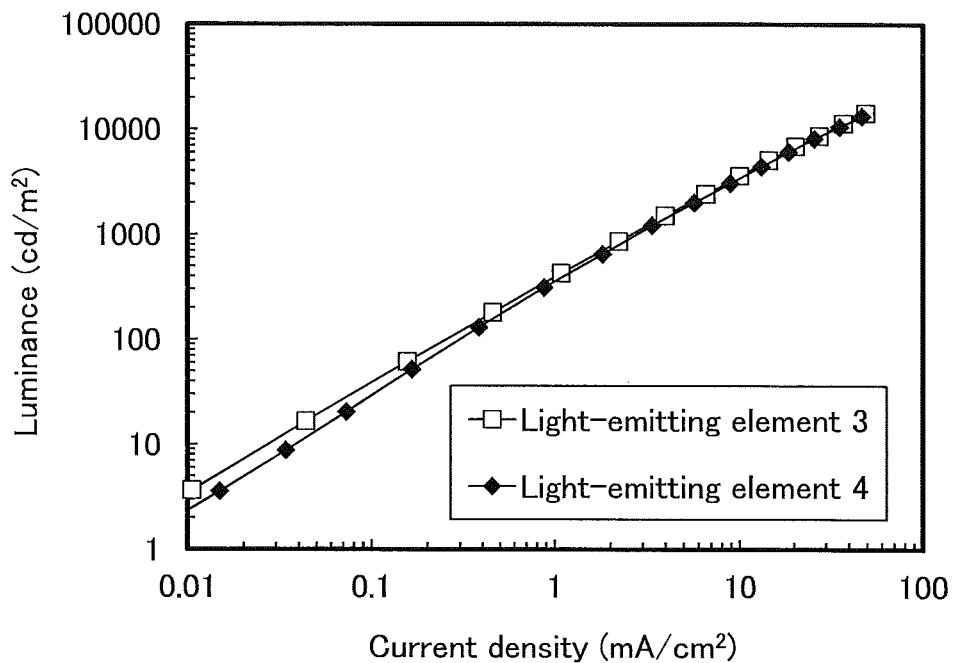
FIG. 25 shows luminance-current density characteristics of a light-emitting element 3 and a light-emitting element 4.
Figure 26:
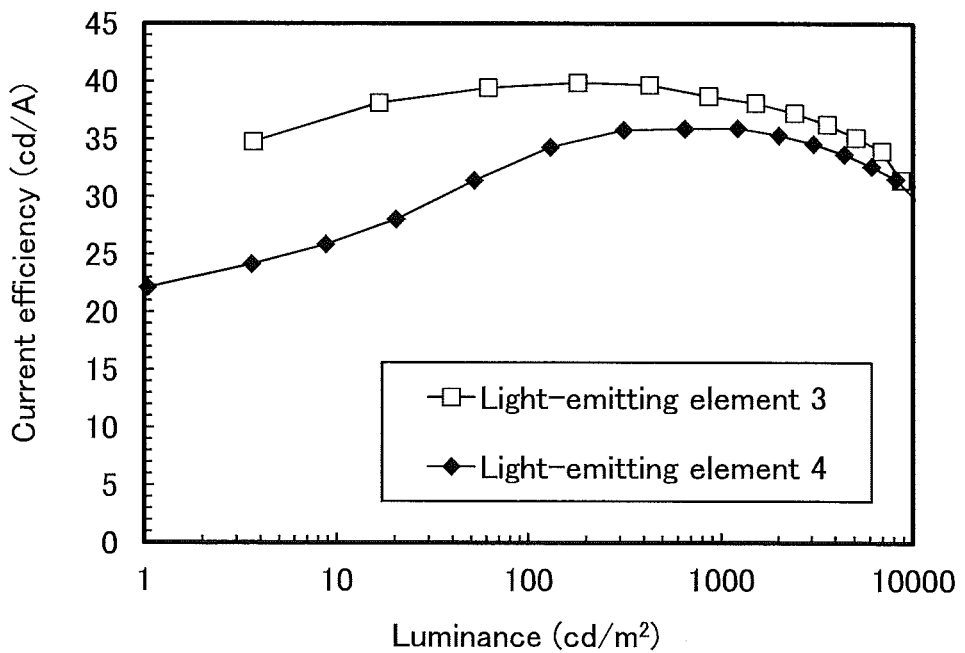
FIG. 26 shows current efficiency-luminance characteristics of a light-emitting element 3 and a light-emitting element 4.
Figure 27:
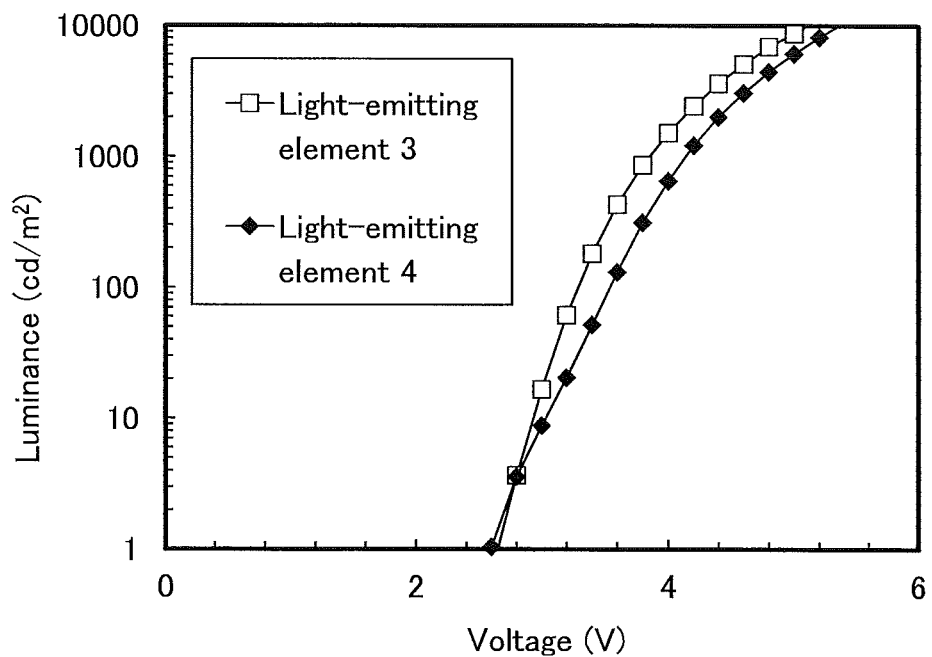
FIG. 27 shows luminance-voltage characteristics of a light-emitting element 3 and a light-emitting element 4.
Figure 28:
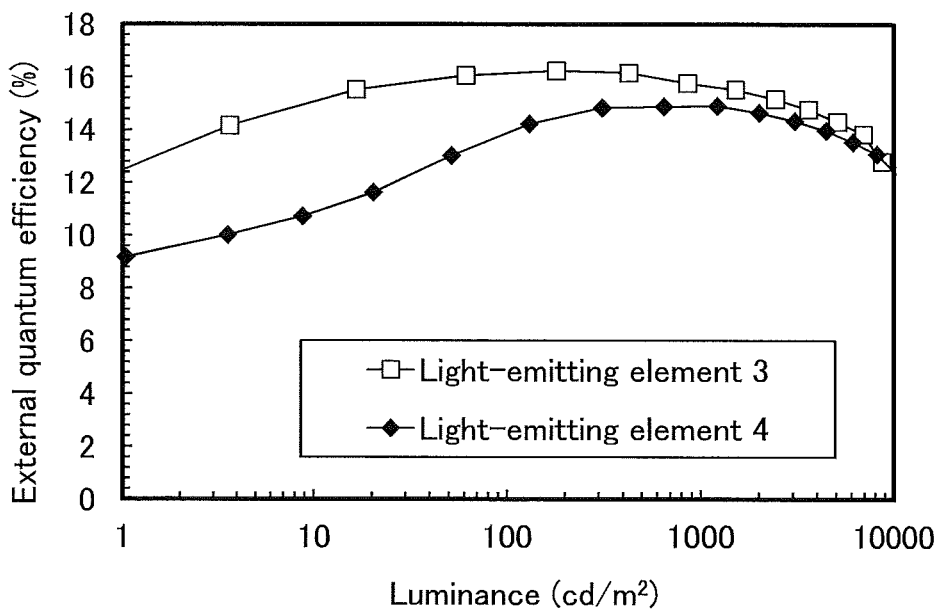
FIG. 28 shows external quantum efficiency-luminance characteristics of a light-emitting element 3 and a light-emitting element 4.

FIG. 25 shows the luminance-current density characteristics of the light-emitting element 3 and the light-emitting element 4; FIG. 26 shows the current efficiency-luminance characteristics thereof; FIG. 27 shows the luminance-voltage characteristics thereof and FIG. 28 shows the external quantum efficiency-luminance characteristics thereof FIG. 26 shows that the light-emitting element 3 and the light-emitting element 4 have favorable current efficiency-luminance characteristics and thus have a high emission efficiency. Accordingly, 4,4'mDBTP2BPy-II and 4,4'DBfP2BPy have a high triplet level and a wide band gap, and allow even a light-emitting substance emitting blue phosphorescence to be effectively excited. Similarly, as shown in FIG. 28, the light-emitting element 3 and the light-emitting element 4 have favorable external quantum efficiency-luminance characteristics. Moreover, FIG. 27 shows that the light-emitting element 3 and the light-emitting element 4 have favorable luminance-voltage characteristics and thus have low driving voltage. This means that 4,4'mDBTP2BPy-II and 4,4'DBfP2BPy have a high carrier-transport property. FIG. 25 also shows that the light-emitting element 3 and the light-emitting element 4 have favorable luminance-current density characteristics.

Figure 29:
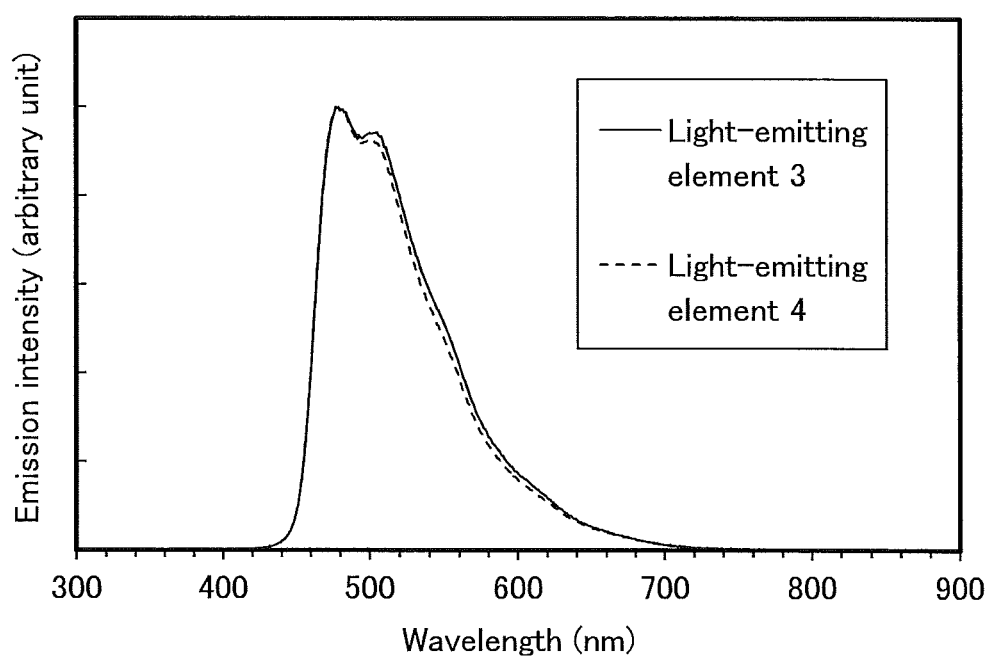
FIG. 29 shows emission spectra of a light-emitting element 3 and a light-emitting element 4.

FIG. 29 shows emission spectra at the time when a current of 0.1 mA was made to flow in the light-emitting element 3 and the light-emitting element 4. FIG. 29 shows that the light-emitting element 3 and the light-emitting element 4 emit blue light originating from [Ir(mpptz-dmp)₃], which is the emission center substance.

EXAMPLE 5

In this example, a synthesis method and properties of 3,5-bis[3-(dibenzothiophen-4-yl)phenyl]pyridine (abbreviation: 3,5mDBTP2Py) represented by Structural Formula (400), which is one of organic compounds represented by General Formula (G0), will be described.

(400)

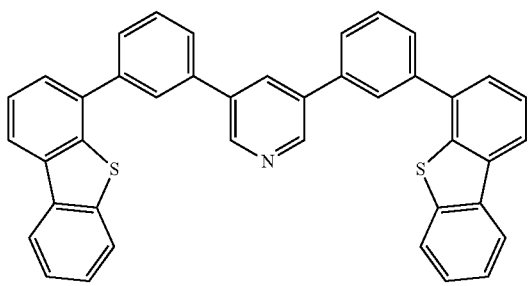

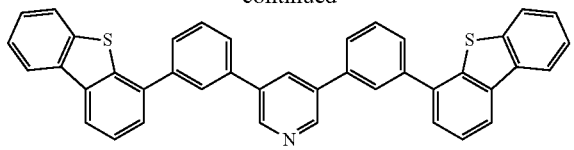

<Synthesis Method>

Into a 200-mL three-neck flask were put 1.6 g (6.8 mmol) of 3,5-dibromopyridine, 4.5 g (15 mmol) of 3-(dibenzothiophen-4-yl)phenylboronic acid, and 0.20 g (0.66 mmol) of tris(2-methylphenyl)phosphine, and the air in the flask was replaced with nitrogen. To this mixture were added 15 mL of a 2M aqueous solution of potassium carbonate, 25 mL of toluene, and 8.5 mL of ethanol, and the mixture was degassed by being stirred under reduced pressure. Then, 30 mg (0.13 mmol) of palladium(II) acetate was added to this mixture, and the mixture was stirred at 90° C. for 6 hours under a nitrogen stream. After the predetermined time elapsed, the organic layer and the aqueous layer of this mixture were separated and the aqueous layer was subjected to extraction using chloroform. The obtained solution of the extract and the organic layer were combined, and the mixture was washed with water and a saturated aqueous solution of sodium chloride, and dried with magnesium sulfate. This mixture was separated by gravity filtration, and the filtrate was concentrated to give an oily brown substance. This oily substance was purified by silica gel column chromatography (as a developing solvent, first, toluene was used, and then toluene and ethyl acetate (toluene:ethyl acetate=20:1) was used). The obtained fraction was concentrated to give a white solid. This solid was recrystallized from toluene, whereby a white solid was obtained. This white solid was purified by high performance liquid column chromatography (HPLC) (the developing solvent was chloroform). The obtained fraction was concentrated to give a white solid. To this solid was added hexane, followed by irradiation with ultrasonic waves. A solid was collected by suction filtration to give 2.0 g of a white solid, which was a target substance, in a yield of 50%. The synthesis scheme of this reaction is shown below.

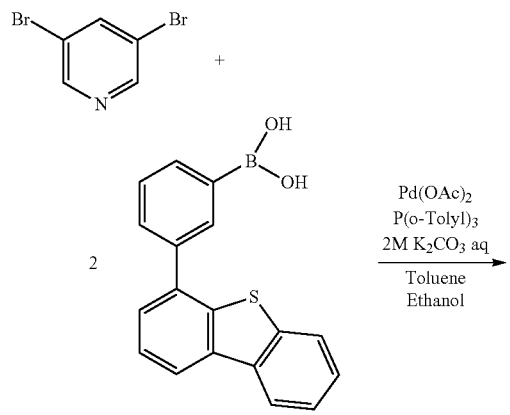

The obtained white solid was purified by sublimation using a train sublimation method. In the purification by sublimation, the white solid was heated at 310° C. under a pressure of 3.2 Pa with an argon flow rate of 5 mL/min. After the purification by sublimation, 1.6 g of a white solid was obtained at a collection rate of 85%.

The $^1$H NMR data of the obtained compound are as follows: $^1$H NMR (CDCl$_3$, 300 MHz): δ=7.41-7.52 (m, 4H), 7.56-7.69 (m, 6H), 7.72-7.82 (m, 6H), 8.07-8.08 (m, 2H), 8.17-8.21 (m, 4H), 8.23-8.25 (m, 1H), 8.97 (d, J=2.1 Hz, 2H).

Figure 30A:
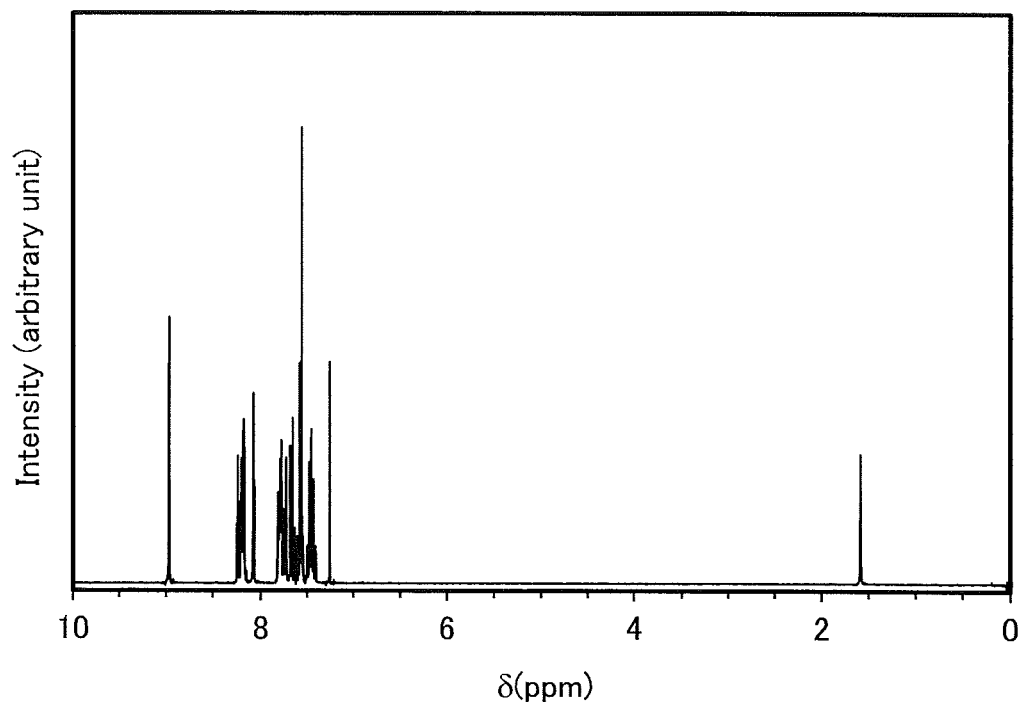
FIGS. 30A and 30B are NMR charts of 3,5mDBTP2Py.
Figure 30B:
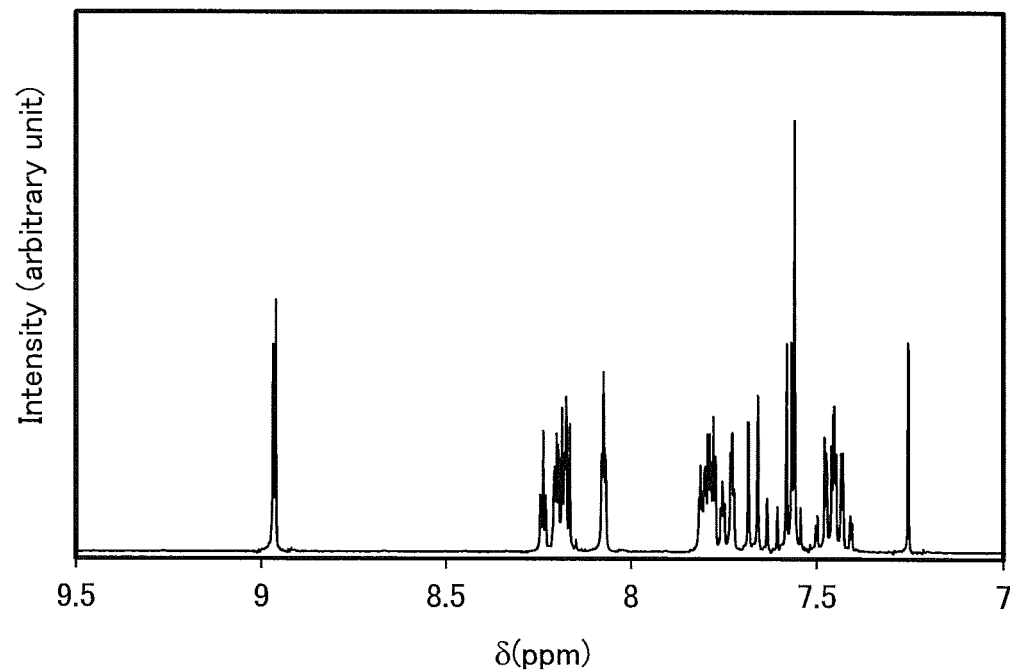

FIGS. 30A and 30B show $^1$H NMR charts. Note that FIG. 30B is a chart showing an enlarged part of FIG. 30A in the range of 7.00 ppm to 9.5 ppm. The measurement results show that 3,5mDBTP2Py, which was the target substance, was obtained.

<<Properties of 3,5mDBTP2Py>>

Figure 31A:
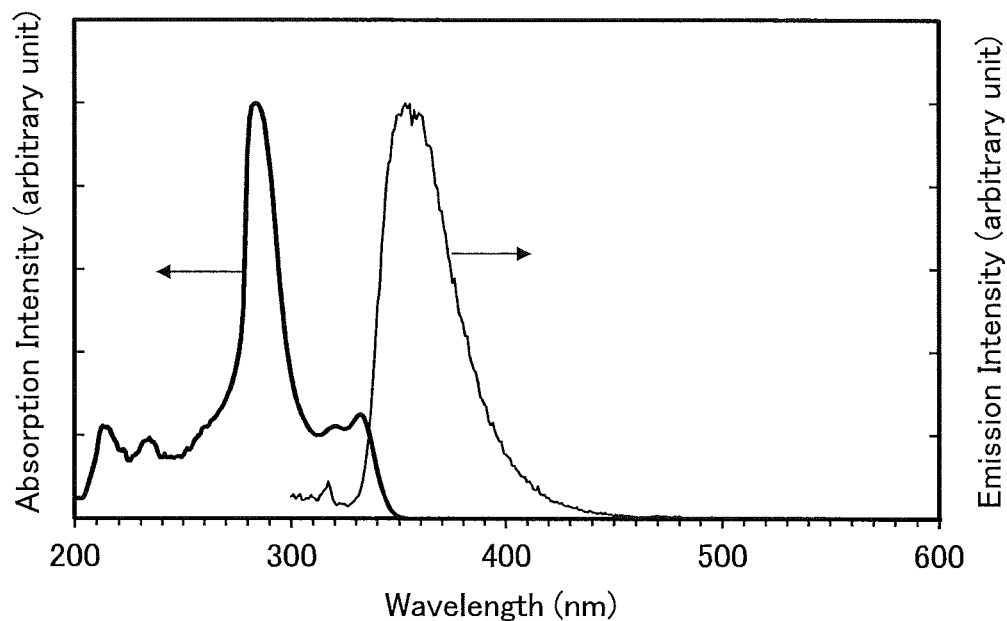
FIGS. 31A and 31B show absorption spectra and emission spectra of 3,5mDBTP2Py.
Figure 31B:
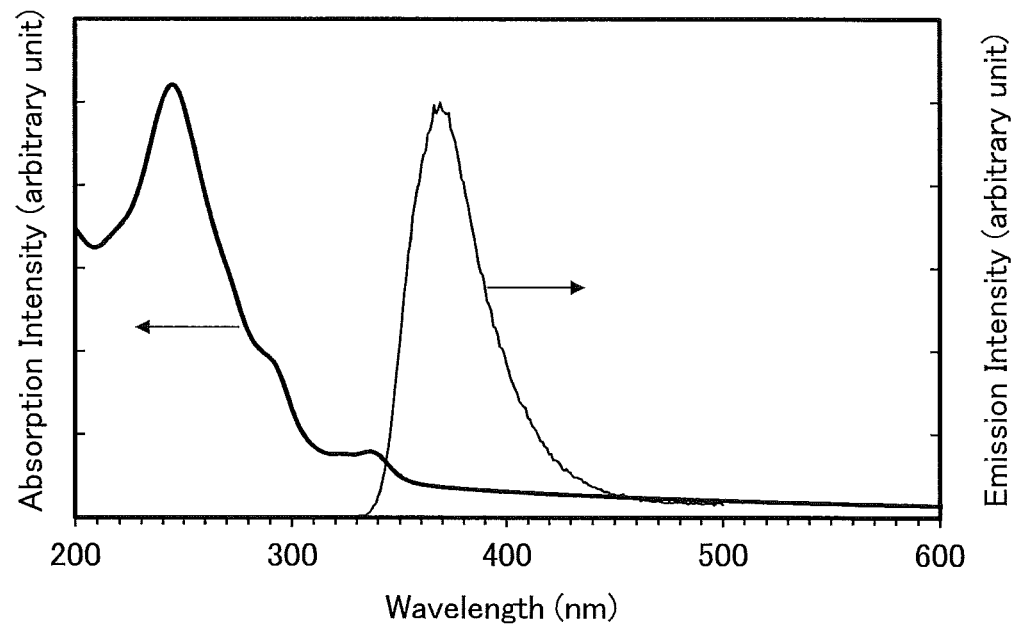

FIG. 31A shows an absorption spectrum and an emission spectrum of a toluene solution of 3,5mDBTP2Py, and FIG. 31B shows an absorption spectrum and an emission spectrum of a thin film of 3,5mDBTP2Py. The spectra were measured with a UV-visible spectrophotometer (V550, produced by JASCO Corporation). The spectra of the toluene solution were obtained with the toluene solution of 3,5mDBTP2Py put in a quartz cell. The spectra of the thin film were measured with a sample prepared by deposition of 3,5mDBTP2Py on a quartz substrate by evaporation. Note that in the case of the absorption spectrum of the toluene solution of 3,5mDBTP2Py, the absorption spectrum obtained by subtraction of the absorption spectra of the quartz cell and toluene from the raw spectra is illustrated. In the case of the absorption spectrum of the thin film of 3,5mDBTP2Py, the absorption spectrum obtained by subtraction of the absorption spectrum of the quartz substrate from the raw spectra is illustrated.

As shown in FIG. 31A, in the case of 3,5mDBTP2Py in the toluene solution, absorption peaks were observed at approximately 331 nm, 319 nm, and 283 nm, and an emission peak was observed at approximately 352 nm (excitation wavelength: 289 nm). As shown in FIG. 31B, in the case of the thin film of 3,5mDBTP2Py, absorption peaks were observed at approximately 332 nm, 315 nm, 284 nm, 272 nm, 240 nm, and 220 nm, and an emission peak was observed at approximately 369 nm (excitation wavelength: 274 nm). Thus, it was found that absorption and emission of 3,5mDBTP2Py occur in extremely short wavelength regions.

The ionization potential of 3,5mDBTP2Py in a thin film state was measured by a photoelectron spectrometer (AC-3, manufactured by Riken Keiki, Co., Ltd.) in the air. The obtained value of the ionization potential was converted into a negative value, so that the HOMO level of 3,5mDBTP2Py was −6.42 eV. From the data of the absorption spectrum of the thin film in FIG. 31B, the absorption edge of 3,5mDBTP2Py, which was obtained from Tauc plot with an assumption of direct transition, was 3.49 eV. Therefore, the optical band gap of 3,5mDBTP2Py in a solid state was estimated to be 3.49 eV; from the values of the HOMO level obtained above and this band gap, the LUMO level of 3,5mDBTP2Py was estimated to be −2.93 eV. The above results show that 3,5mDBTP2Py in the solid state has a band gap as wide as 3.49 eV.

Phosphorescence of 3,5mDBTP2Py was measured. The measurement was performed by using a PL microscope, LabRAM HR-PL, produced by HORIBA, Ltd., a He—Cd laser (325 nm) as excitation light, and a CCD detector at a measurement temperature of 10 K. For the measurement, a thin film as a sample was formed over a quartz substrate to a thickness of approximately 50 nm and another quartz substrate was attached to the deposition surface in a nitrogen atmosphere. The results showed that the peak on the shortest wavelength side of a phosphorescence spectrum of 3,5mDBTP2Py is at 472 nm, which means that 3,5mDBTP2Py has a high $T_1$ level.

EXAMPLE 6

In this example, a synthesis method and properties of 3,5-bis[3-(dibenzofuran-4-yl)phenyl]pyridine (abbreviation: 3,5mDBFP2Py) represented by Structural Formula (300), which is one of organic compounds represented by General Formula (G0), will be described.

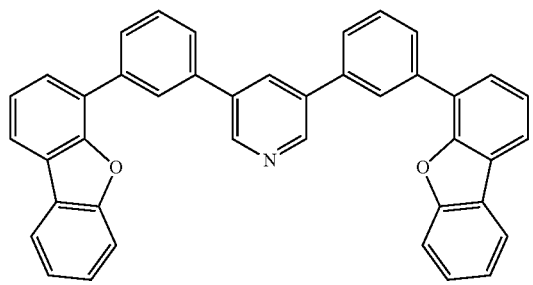

(300)

<Synthesis Method>

Into a 200-mL three-neck flask were put 1.7 g (7.2 mmol) of 3,5-dibromopyridine, 4.5 g (16 mmol) of 3-(dibenzofuran-4-yl)phenylboronic acid, and 0.22 g (0.72 mmol) of tris(2-methylphenyl)phosphine, and the air in the flask was replaced with nitrogen. To this mixture were added 16 mL of a 2M aqueous solution of potassium carbonate, 27 mL of toluene, and 9.0 mL of ethanol, and the mixture was degassed by being stirred under reduced pressure. Then, 32 mg (0.14 mmol) of palladium(II) acetate was added to this mixture, and the mixture was stirred at 90° C. for 6 hours under a nitrogen stream. After the predetermined time elapsed, this mixture was separated into the organic layer and the aqueous layer and the aqueous layer was subjected to extraction using chloroform. The obtained solution of the extract and the organic layer were combined, and the mixture was washed with water and a saturated aqueous solution of sodium chloride, and dried with magnesium sulfate. This mixture was separated by gravity filtration, and the filtrate was concentrated to give a brown solid. This solid was purified by silica gel column chromatography (as a developing solvent, first, toluene was used, and then toluene and ethyl acetate (toluene:ethyl acetate =20:1) was used). The obtained fraction was concentrated to give a white solid. This white solid was purified by high performance liquid column chromatography (HPLC) (the developing solvent was chloroform). The obtained fraction was concentrated to give a white solid. To this solid was added hexane, followed by irradiation with ultrasonic waves. A solid was collected by suction filtration to give 1.6 g of a white solid, which was a target substance, in a yield of 40%.

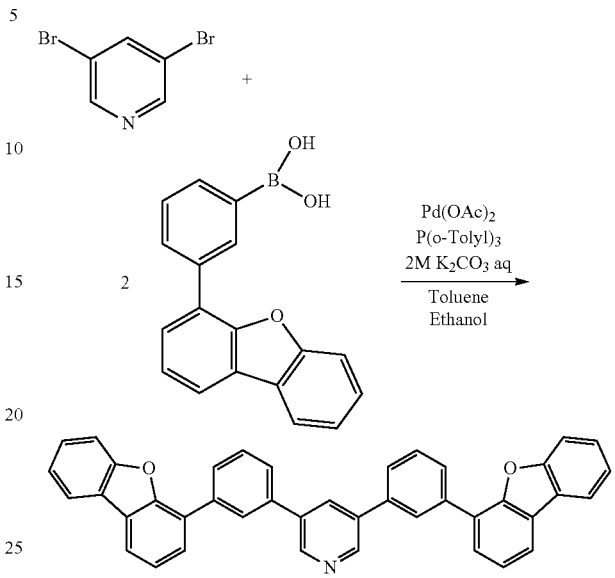

The 1.6 g of 3,5-bis[3-(dibenzofuran-4-yl)phenyl]pyridine (abbreviation: 3,5mDBFP2Py) was purified by sublimation using a train sublimation method. In the purification by sublimation, the white solid was heated at 280° C. under a pressure of 3.6 Pa with an argon flow rate of 5 mL/min After the purification by sublimation, 1.4 g of a white solid was obtained at a collection rate of 88%.

The $^1$H NMR data of the obtained compound are as follows: $^1$H NMR (CDCl$_3$, 300 MHz): δ=7.34-7.49 (m, 6H), 7.58 (d, J=7.8 Hz, 2H), 7.66-7.77 (m, 6H), 7.97-8.02 (m, 6H), 8.21-8.22 (m, 2H), 8.27-8.28 (m, 1H), 8.99 (d, J=2.4 Hz, 2H).

Figure 32A:
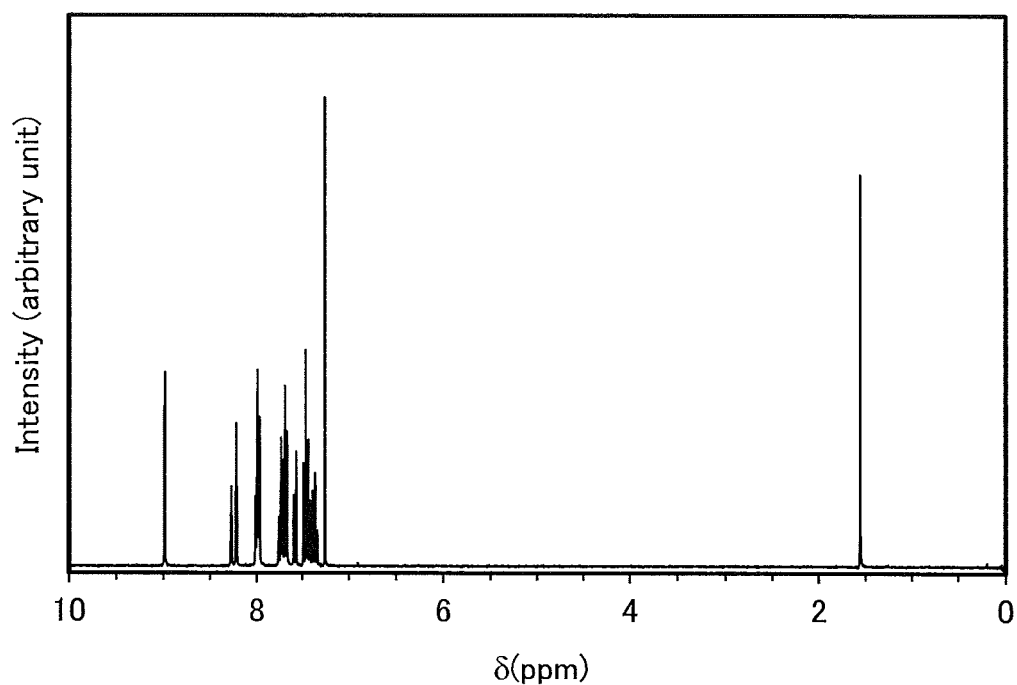
FIGS. 32A and 32B are NMR charts of 3,5mDBFP2Py.
Figure 32B:
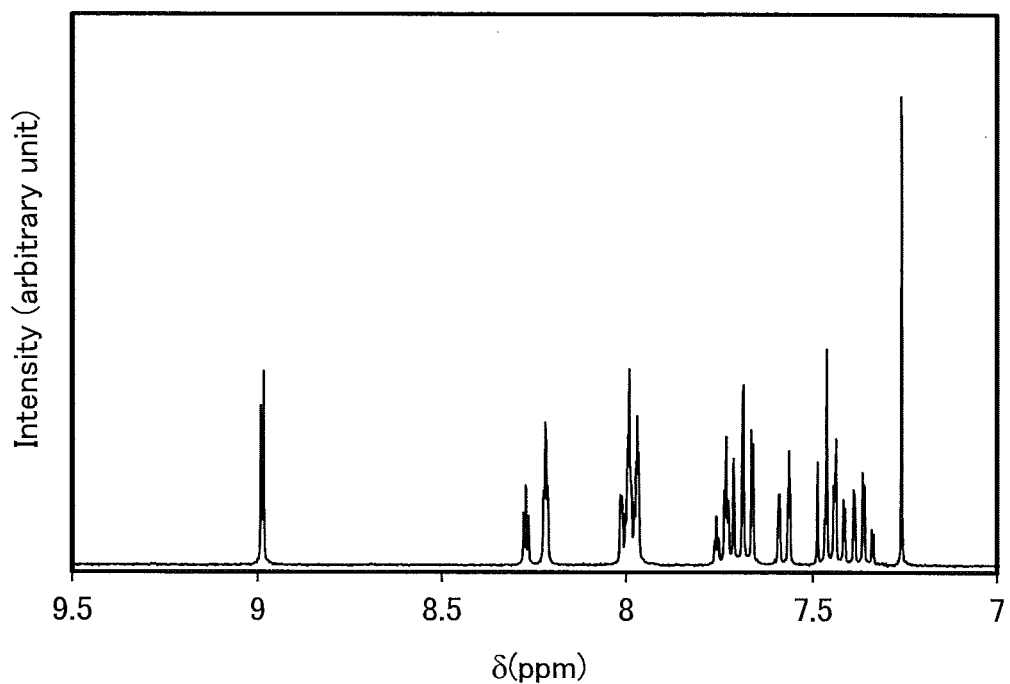

FIGS. 32A and 32B show $^1$H NMR charts. Note that FIG. 32B is a chart showing an enlarged part of FIG. 32A in the range of 7.00 ppm to 9.5 ppm. The measurement results show that 3,5mDBFP2Py, which was the target substance, was obtained.

<<Properties of 3,5mDBFP2Py>>

Figure 33A:
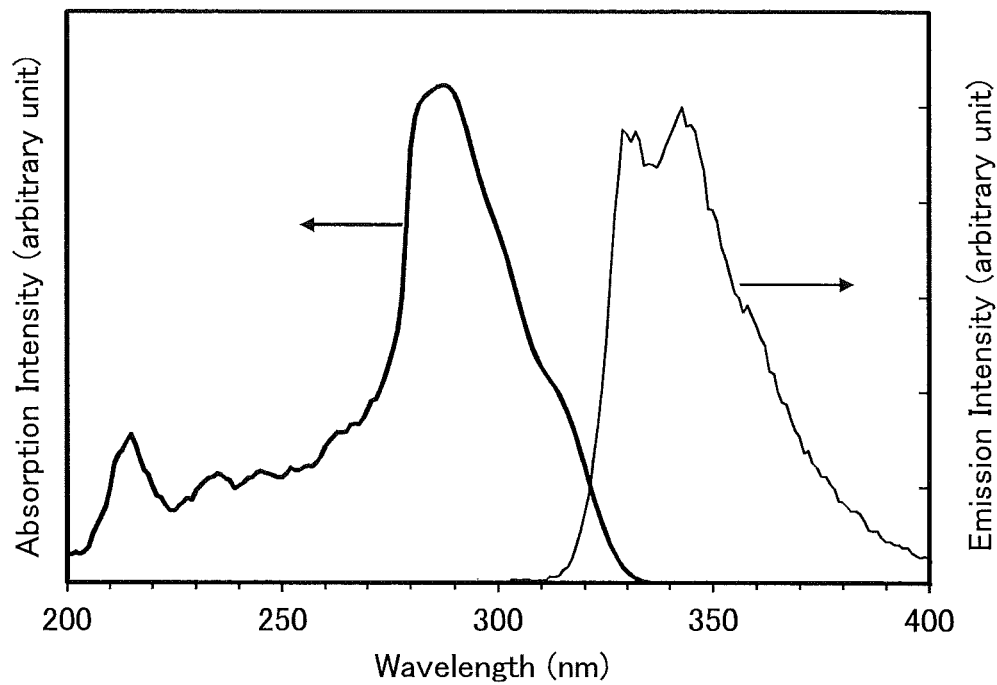
FIGS. 33A and 33B show absorption spectra and emission spectra of 3,5mDBFP2Py.
Figure 33B:
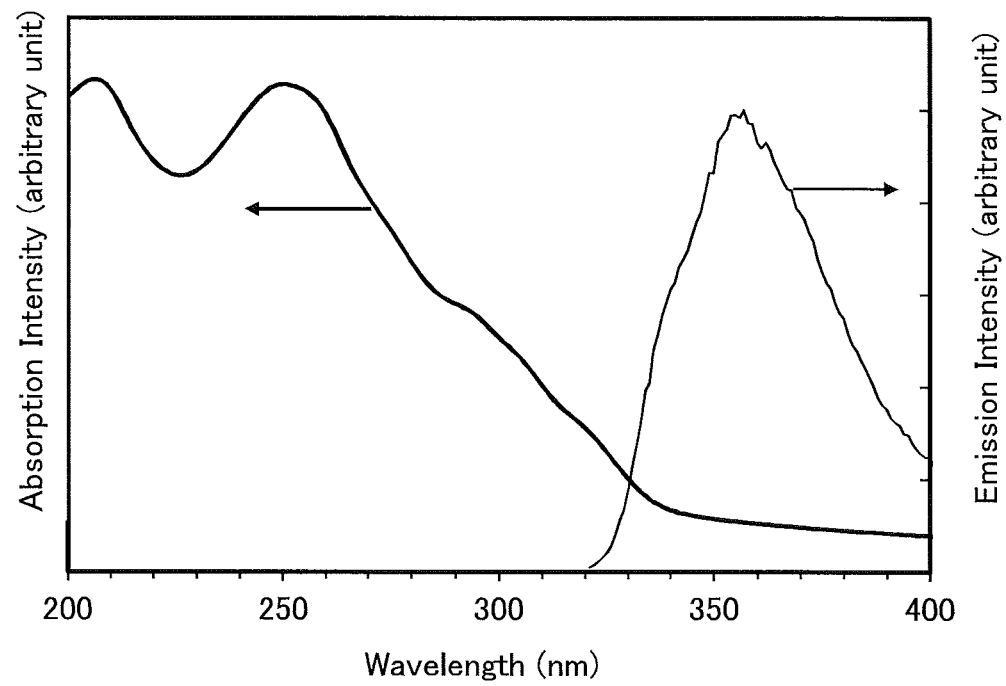

FIG. 33A shows an absorption spectrum and an emission spectrum of a toluene solution of 3,5mDBFP2Py, and FIG. 33B shows an absorption spectrum and an emission spectrum of a thin film of 3,5mDBFP2Py. The spectra were measured with a UV-visible spectrophotometer (V550, produced by JASCO Corporation). The spectra of the toluene solution were obtained with the toluene solution of 3,5mDBFP2Py put in a quartz cell. The spectra of the thin film were measured with a sample prepared by deposition of 3,5mDBFP2Py on a quartz substrate by evaporation. Note that in the case of the absorption spectrum of the toluene solution of 3,5mDBFP2Py, the absorption spectrum obtained by subtraction of the absorption spectra of the quartz cell and toluene from the raw spectra is illustrated. In the case of the absorption spectrum of the thin film of 3,5mDBFP2Py, the absorption spectrum obtained by subtraction of the absorption spectrum of the quartz substrate from the raw spectra is illustrated.

As shown in FIG. 33A, in the case of 3,5mDBFP2Py in the toluene solution, absorption peaks were observed at approximately 314 nm and 288 nm, and emission peaks were observed at approximately 342 nm and 332 nm (excitation wavelength: 292 nm). As shown in FIG. 33B, in the case of the thin film of 3,5mDBFP2Py, absorption peaks were observed at approximately 316 nm, 304 nm, 293 nm, 272 nm, 250 nm, and 206 nm, and emission peaks were observed at approximately 356 nm and 341 nm (excitation wavelength: 305 nm). Thus, it was found that absorption and emission of 3,5mDBFP2Py occur in extremely short wavelength regions.

The ionization potential of 3,5mDBFP2Py in a thin film state was measured by a photoelectron spectrometer (AC-3, manufactured by Riken Keiki, Co., Ltd.) in the air. The obtained value of the ionization potential was converted into a negative value, so that the HOMO level of 3,5mDBFP2Py was −6.49 eV. From the data of the absorption spectrum of the thin film in FIG. 33B, the absorption edge of 3,5mDBFP2Py, which was obtained from Tauc plot with an assumption of direct transition, was 3.69 eV. Therefore, the optical band gap of 3,5mDBFP2Py in a solid state was estimated to be 3.69 eV; from the values of the HOMO level obtained above and this band gap, the LUMO level of 3,5mDBFP2Py was estimated to be −2.80 eV. The above results show that 3,5mDBFP2Py in the solid state has a band gap as wide as 3.69 eV.

Phosphorescence of 3,5mDBFP2Py was measured. The measurement was performed by using a PL microscope, LabRAM HR-PL, produced by HORIBA, Ltd., a He—Cd laser (325 nm) as excitation light, and a CCD detector at a measurement temperature of 10 K. For the measurement, a thin film as a sample was formed over a quartz substrate to a thickness of approximately 50 nm and another quartz substrate was attached to the deposition surface in a nitrogen atmosphere. The results showed that the peak on the shortest wavelength side of a phosphorescence spectrum of 3,5mDBFP2Py is at 467 nm, which means that 3,5mDBFP2Py has a high $T_1$ level.

EXAMPLE 7

This example will describe blue-emissive phosphorescent light-emitting elements in which 3,5-bis[3-(dibenzothiophen-4-yl)phenyl]pyridine (abbreviation: 3,5mDBTP2Py) or 3,5-bis[3-(dibenzofuran-4-yl)phenyl]pyridine (abbreviation: 3,5mDBFP2Py) was used as a host material and an electron-transport material (a light-emitting element 5 and a light-emitting element 6).

Molecular structures of organic compounds that were used in this example are shown by Structural Formulae (i), (ii), (v), (viii), (ix), and (x). The element structure in FIG. 1A was employed.

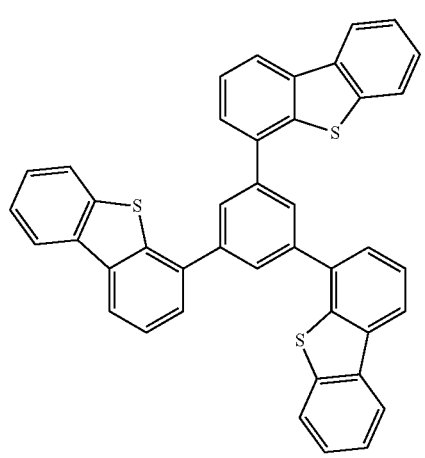

DBT3P-II (i)

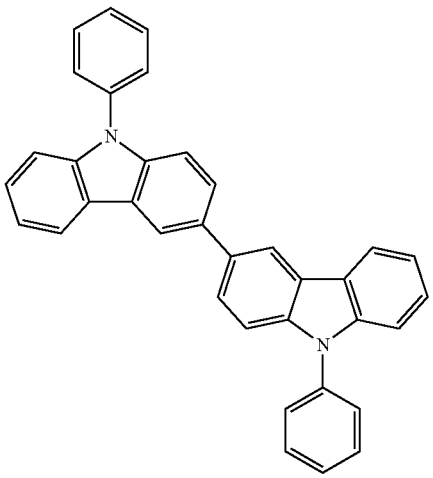

PCCP (ii)

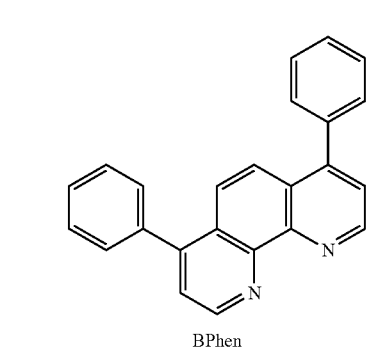

BPhen (v)

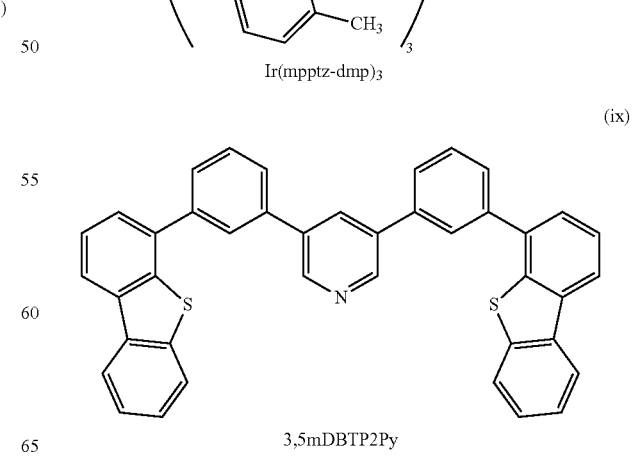

Ir(mpptz-dmp)₃ (viii)

3,5mDBTP2Py (ix)

-continued

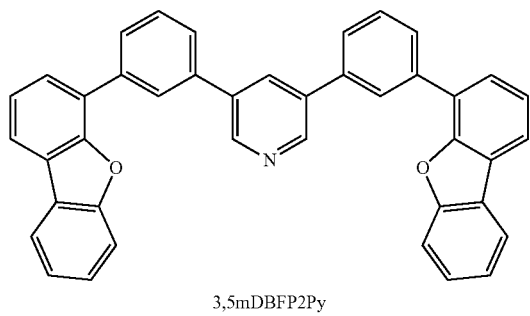

3,5mDBFP2Py

<<Fabrication of Light-Emitting Element 5>>

First, a glass substrate, over which a film of indium tin oxide containing silicon (ITSO) was formed to a thickness of 110 nm as the first electrode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, 4,4',4"-(benzene-1,3,5-triyl)tri(dibenzothiophene) (abbreviation: DBT3P-II) represented by Structural Formula (i) and molybdenum(VI) oxide were deposited by co-evaporation so that the weight ratio of DBT3P-II to molybdenum oxide was 4:2, whereby the hole-injection layer 111 was formed. The thickness was set to 60 nm. Note that co-evaporation is an evaporation method in which a plurality of different substances are concurrently vaporized from respective different evaporation sources.

Next, 3,3'-bis(9-phenyl-9H-carbazole) (abbreviation: PCCP) represented by Structural Formula (ii) was deposited by evaporation to a thickness of 20 nm, whereby the hole-transport layer 112 was formed.

Moreover, 3,5-bis[3-(dibenzothiophen-4-yl)phenyl]pyridine (abbreviation: 3,5mDBTP2Py) represented by Structural Formula (ix), PCCP, and tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]) represented by Structural Formula (viii) were co-deposited by evaporation to a thickness of 30 nm on the hole-transport layer 112 so that PCCP:3,5mDBTP2Py:[Ir(mpptz-dmp)$_3$]=1:0.3:0.06 (weight ratio), and then, 3,5mDBTP2Py and [Ir(mpptz-dmp)$_3$] were co-deposited by evaporation to a thickness of 10 nm so that 3,5mDBTP2Py:[Ir(mpptz-dmp)$_3$]=1:0.06 (weight ratio), whereby the light-emitting layer 113 was formed.

Next, 3,5mDBTP2Py was deposited by evaporation to a thickness of 10 nm, and then bathophenanthroline (abbreviation: BPhen) represented by Structural Formula (v) was deposited by evaporation to a thickness of 15 nm, whereby the electron-transport layer 114 was formed.

Then, lithium fluoride was deposited by evaporation to a thickness of 1 nm on the electron-transport layer 114, whereby the electron-injection layer 115 was formed. Lastly, a film of aluminum was formed to a thickness of 200 nm as the second electrode 102 which serves as a cathode. Thus, the light-emitting element 5 was completed. Note that in all the above evaporation steps, evaporation was performed by a resistance-heating method.

<<Fabrication of Light-Emitting Element 6>>

The light-emitting element 6 was fabricated in a manner similar to that of the light-emitting element 5 except that 3,5-bis[3-(dibenzofuran-4-yl)phenyl]pyridine (abbreviation: 3,5mDBFP2Py) represented by Structural Formula (x) was used instead of 3,5mDBTP2Py.

<<Operation Characteristics of Light-Emitting Element 5 and Light-Emitting Element 6>>

The light-emitting element 5 and the light-emitting element 6 obtained as described above were sealed in a glove box containing a nitrogen atmosphere so as not to be exposed to the air (specifically, a sealant was applied onto an outer edge of each element, and heat treatment at 80° C. for 1 hour and UV treatment were performed at the time of sealing). Then, the operating characteristics of the light-emitting elements were measured. Note that the measurement was carried out at room temperature (in an atmosphere kept at 25° C.).

Figure 34:
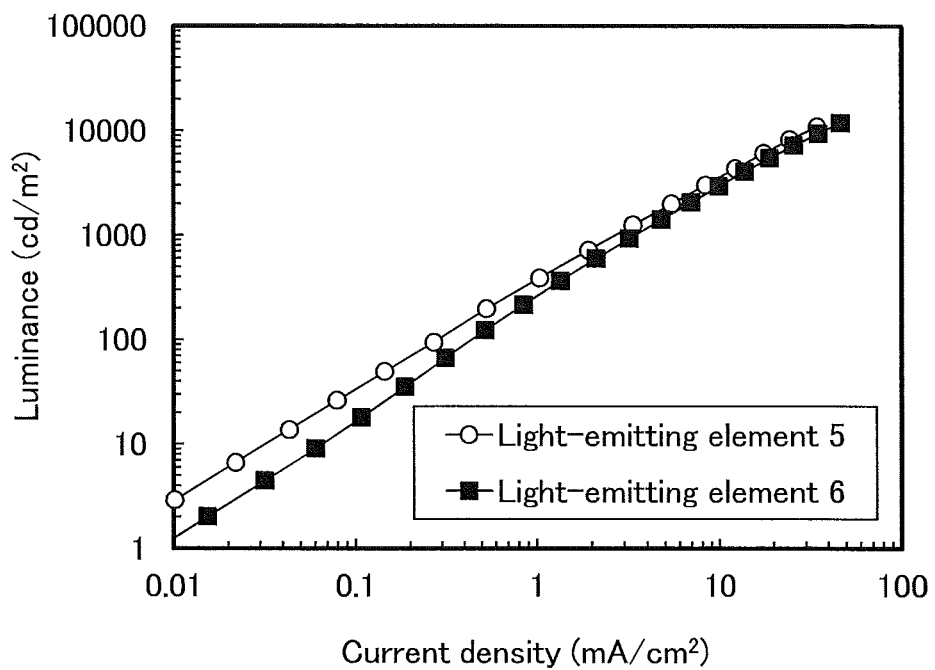
FIG. 34 shows luminance-current density characteristics of a light-emitting element 5 and a light-emitting element 6.
Figure 35:
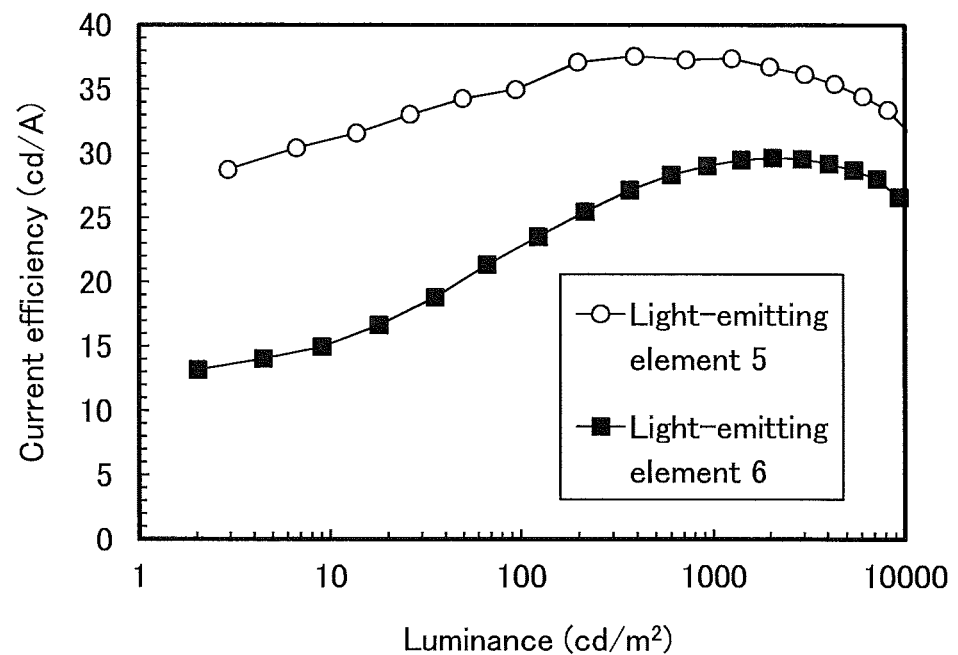
FIG. 35 shows current efficiency-luminance characteristics of a light-emitting element 5 and a light-emitting element 6.
Figure 36:
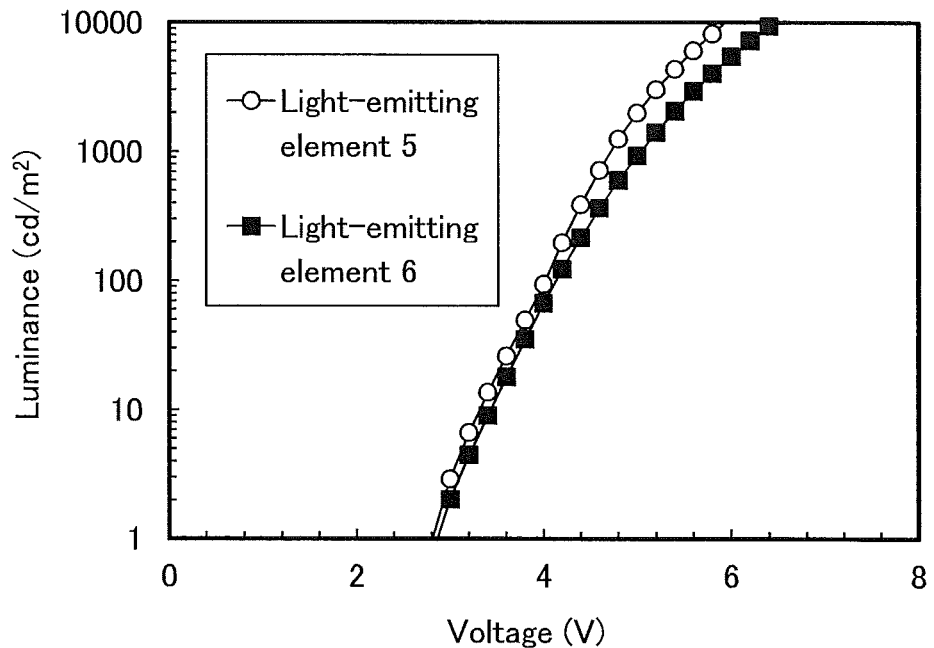
FIG. 36 shows luminance-voltage characteristics of a light-emitting element 5 and a light-emitting element 6.
Figure 37:
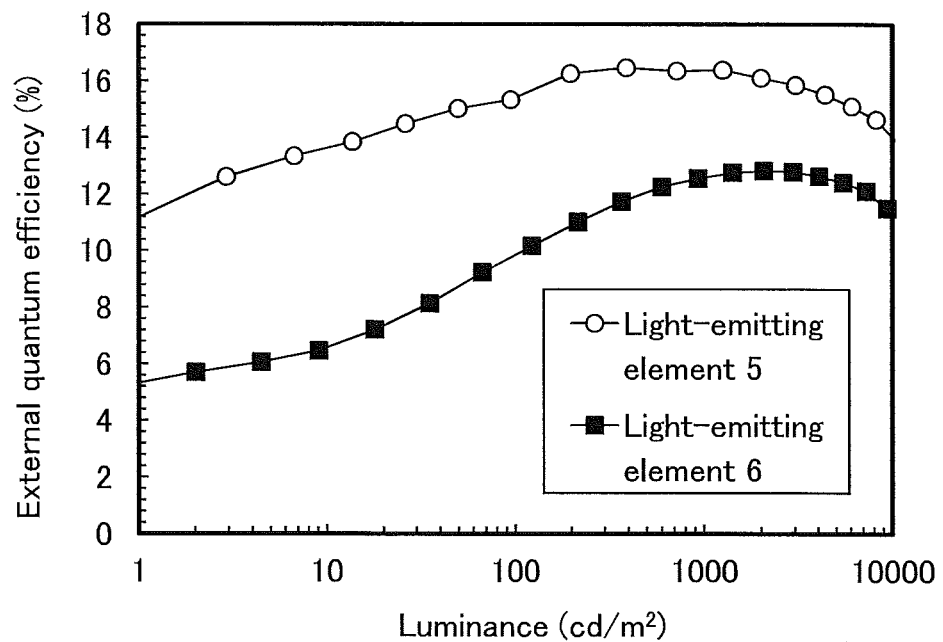
FIG. 37 shows external quantum efficiency-luminance characteristics of a light-emitting element 5 and a light-emitting element 6.

FIG. 34 shows the luminance-current density characteristics of the light-emitting element 5 and the light-emitting element 6; FIG. 35 shows the current efficiency-luminance characteristics thereof; FIG. 36 shows the luminance-voltage characteristics thereof; and FIG. 37 shows the external quantum efficiency-luminance characteristics thereof.

FIG. 35 shows that the light-emitting element 5 and the light-emitting element 6 have favorable current efficiency-luminance characteristics and thus have a high emission efficiency. Accordingly, 3,5mDBTP2Py and 3,5mDBFP2Py have a high triplet level and a wide band gap, and allow even a light-emitting substance emitting blue phosphorescence to be effectively excited. Similarly, as shown in FIG. 37, the light-emitting element 5 and the light-emitting element 6 have favorable external quantum efficiency-luminance characteristics. Moreover, FIG. 36 shows that the light-emitting element 5 and the light-emitting element 6 have favorable luminance-voltage characteristics and thus have low driving voltage. This means that 3,5mDBTP2Py and 3,5mDBFP2Py have a high carrier-transport property. FIG. 34 also shows that the light-emitting element 5 and the light-emitting element 6 have favorable luminance-current density characteristics.

Figure 38:
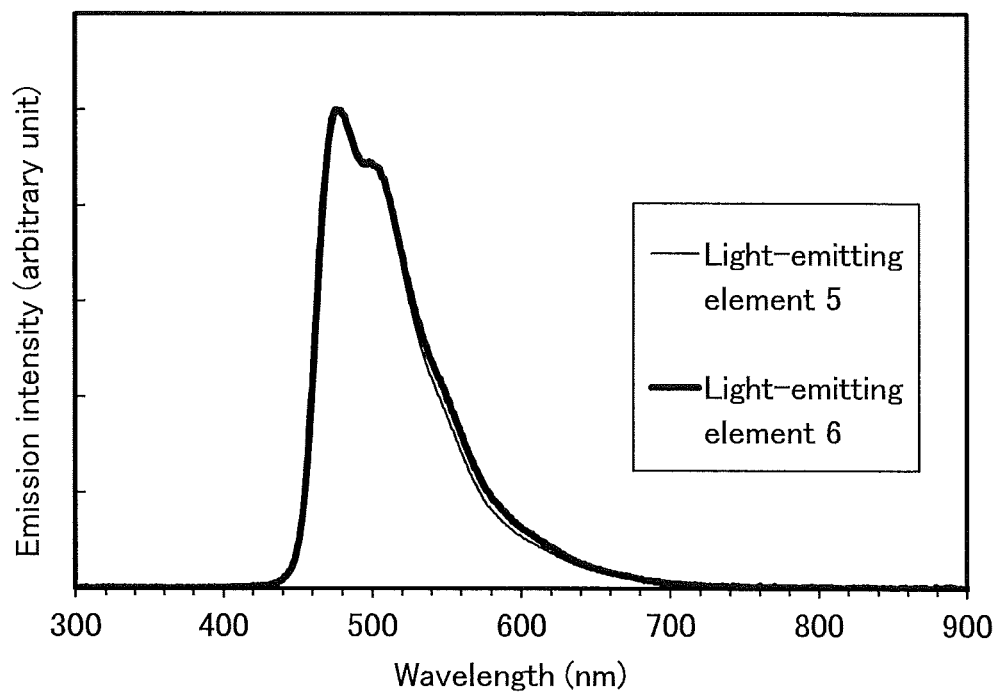
FIG. 38 shows emission spectra of a light-emitting element 5 and a light-emitting element 6.

FIG. 38 shows emission spectra at the time when a current of 0.1 mA was made to flow in the light-emitting element 5 and the light-emitting element 6. FIG. 38 shows that the light-emitting element 5 and the light-emitting element 6 emit blue light originating from [Ir(mpptz-dmp)$_3$], which is the emission center substance.

A comparative light-emitting element 2 was also fabricated in which 3,5mDBTP2Py in the light-emitting element 5 was replaced with an organic compound having the same structure as 3,5mDBTP2Py except that it has a pyrimidine skeleton instead of a pyridine skeleton. The external quantum efficiency of the light-emitting element 5 was higher than that of the comparative light-emitting element 2. The light-emitting element 5 also exhibited a sharp spectrum, which means that it has high color purity.

EXAMPLE 8

This example will describe green-emissive phosphorescent light-emitting elements in which 3,5-bis[3-(dibenzothiophen-4-yl)phenyl]pyridine (abbreviation: 3,5mDBTP2Py) or 3,5-bis[3-(dibenzofuran-4-yl)phenyl]pyridine (abbreviation: 3,5mDBFP2Py) was used as a host material and an electron-transport material (a light-emitting element 7 and a light-emitting element 8).

Molecular structures of organic compounds that were used in this example are shown by Structural Formulae (i), (ii), (iv), (v), (ix), (x), and (xii). The element structure in FIG. 1A was employed.

(i)

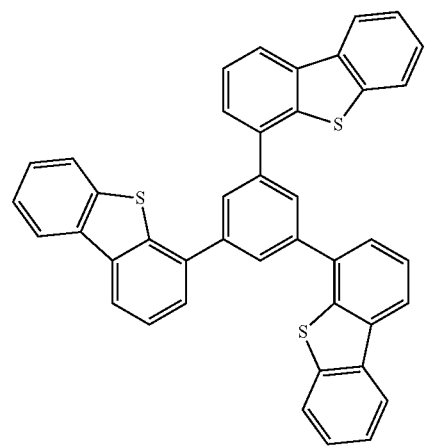

DBT3P-II (ii)

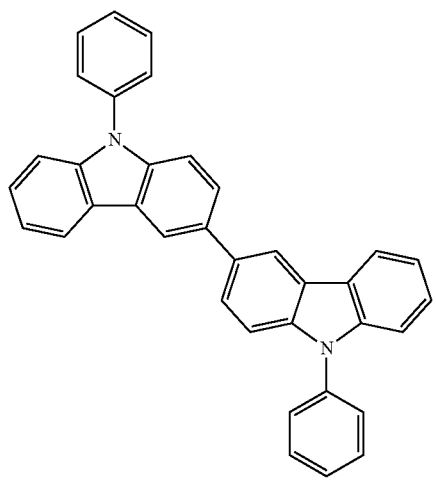

PCCP (iv)

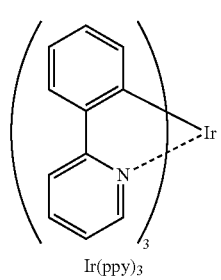

Ir(ppy)₃

(v)

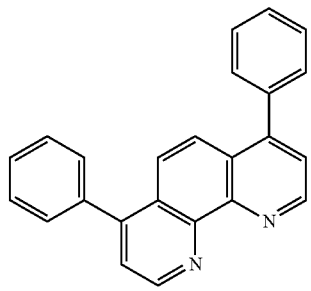

BPhen (ix)

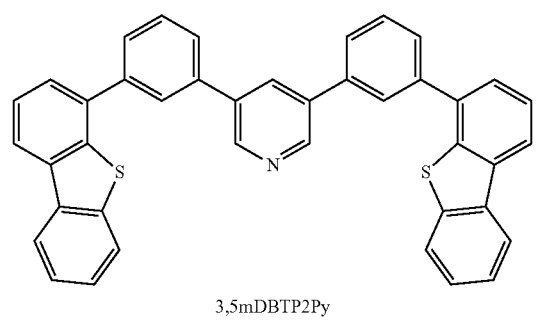

3,5mDBTP2Py (x)

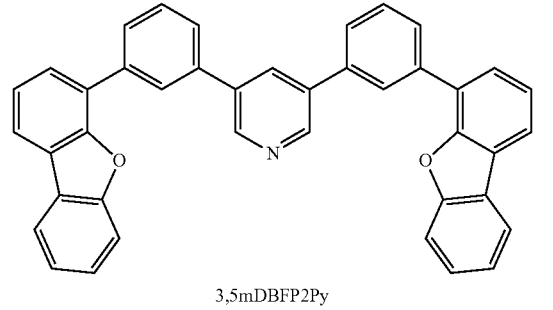

3,5mDBFP2Py (xii)

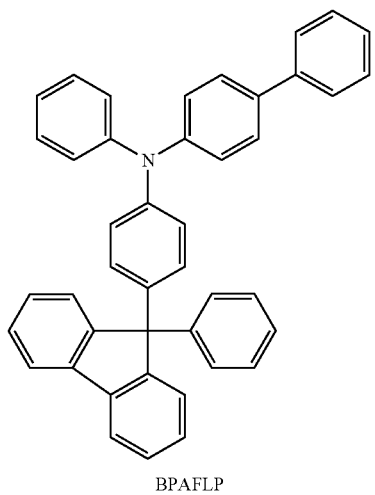

BPAFLP

<<Fabrication of Light-Emitting Element 7>>

First, a glass substrate, over which a film of indium tin oxide containing silicon (ITSO) was formed to a thickness of 110 nm as the first electrode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, 4,4',4''-(benzene-1,3,5-triyl)tri(dibenzothiophene) (abbreviation: DBT3P-II) represented by Structural Formula (i) and molybdenum(VI) oxide were deposited by co-evaporation so that the weight ratio of DBT3P-II to molybdenum oxide was 4:2, whereby the hole-injection layer 111 was formed. The thickness was set to 60 nm.

Next, 4-phenyl-4'-(9-phenylfluoren-9-yl)triphenylamine (abbreviation: BPAFLP) represented by Structural Formula (xii) was deposited by evaporation to a thickness of 20 nm, whereby the hole-transport layer 112 was formed.

Moreover, 3,5-bis[3-(dibenzothiophen-4-yl)phenyl]pyridine (abbreviation: 3,5mDBTP2Py) represented by Structural Formula (ix), 3,3'-bis(9-phenyl-9H-carbazole) (abbreviation: PCCP) represented by Structural Formula (ii), and fac-tris(2-phenylpyridine)iridium (abbreviation: [Ir(ppy)$_3$]) represented by Structural Formula (iv) were co-deposited by evaporation to a thickness of 40 nm on the hole-transport layer 112 so that 3,5mDBTP2Py:PCCP:[Ir(ppy)$_3$]=0.8:0.2:0.06 (weight ratio), whereby the light-emitting layer 113 was formed.

Next, 3,5mDBTP2Py was deposited by evaporation to a thickness of 10 nm, and then bathophenanthroline (abbreviation: BPhen) represented by Structural Formula (v) was deposited by evaporation to a thickness of 15 nm, whereby the electron-transport layer 114 was formed.

Then, lithium fluoride was deposited by evaporation to a thickness of 1 nm on the electron-transport layer 114, whereby the electron-injection layer 115 was formed. Lastly, a film of aluminum was formed to a thickness of 200 nm as the second electrode 102 which serves as a cathode. Thus, the light-emitting element 7 was completed. Note that in all the above evaporation steps, evaporation was performed by a resistance-heating method.

<<Fabrication of Light-Emitting Element 8>>

The light-emitting element 8 was fabricated in a manner similar to that of the light-emitting element 7 except that 3,5-bis[3-(dibenzofuran-4-yl)phenyl]pyridine (abbreviation: 3,5mDBFP2Py) represented by Structural Formula (x) was used instead of 3,5mDBTP2Py.

<<Operation Characteristics of Light-Emitting Element 7 and Light-Emitting Element 8>>

The light-emitting element 7 and the light-emitting element 8 obtained as described above were sealed in a glove box containing a nitrogen atmosphere so as not to be exposed to the air (specifically, a sealant was applied onto an outer edge of each element, and heat treatment at 80° C. for 1 hour and UV treatment were performed at the time of sealing). Then, the operating characteristics of the light-emitting elements were measured. Note that the measurement was carried out at room temperature (in an atmosphere kept at 25° C.).

Figure 39:
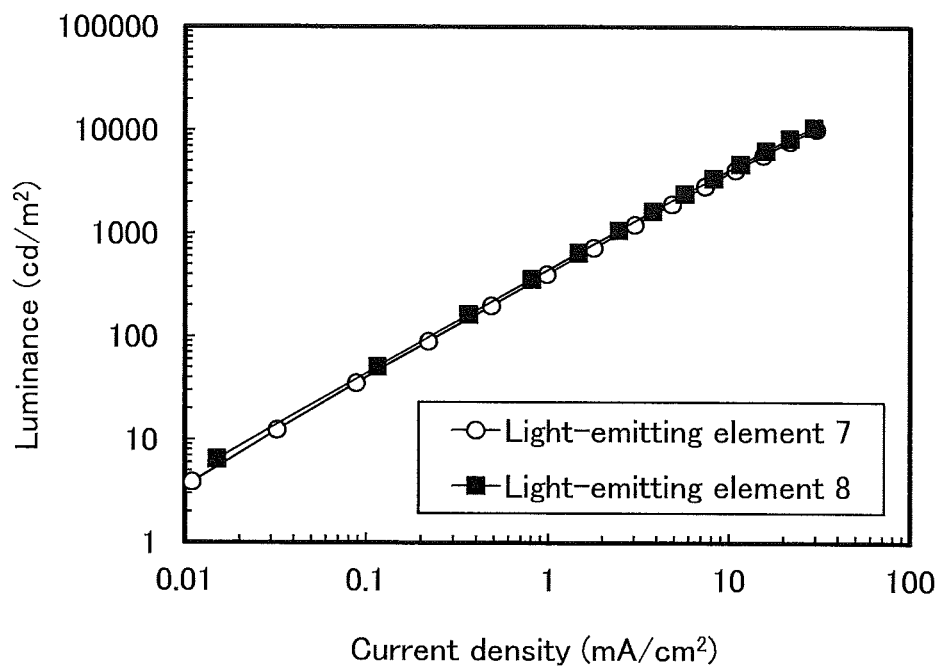
FIG. 39 shows luminance-current density characteristics of a light-emitting element 7 and a light-emitting element 8.
Figure 40:
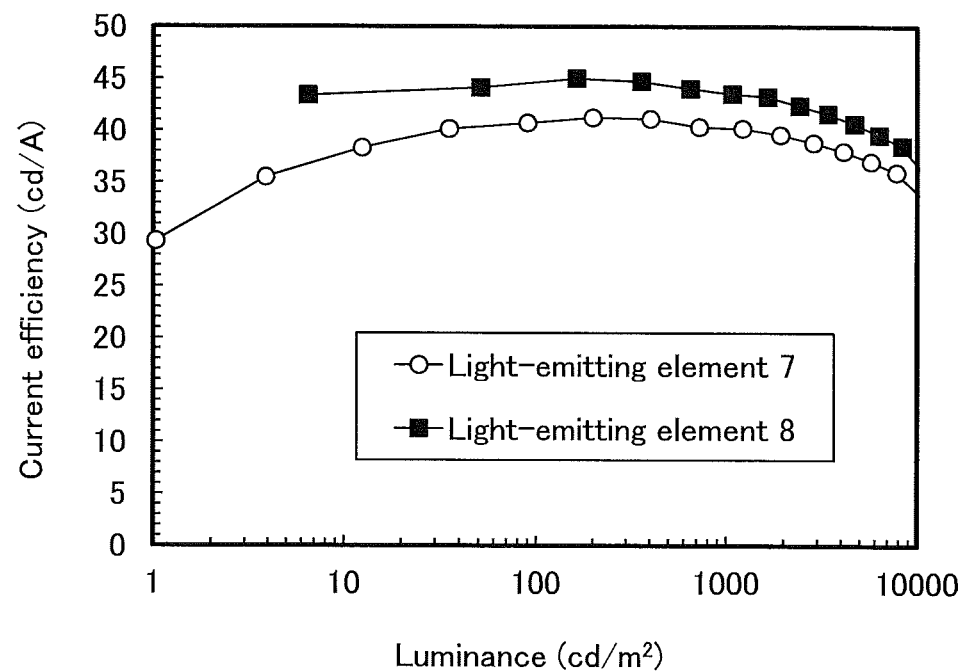
FIG. 40 shows current efficiency-luminance characteristics of a light-emitting element 7 and a light-emitting element 8.
Figure 41:
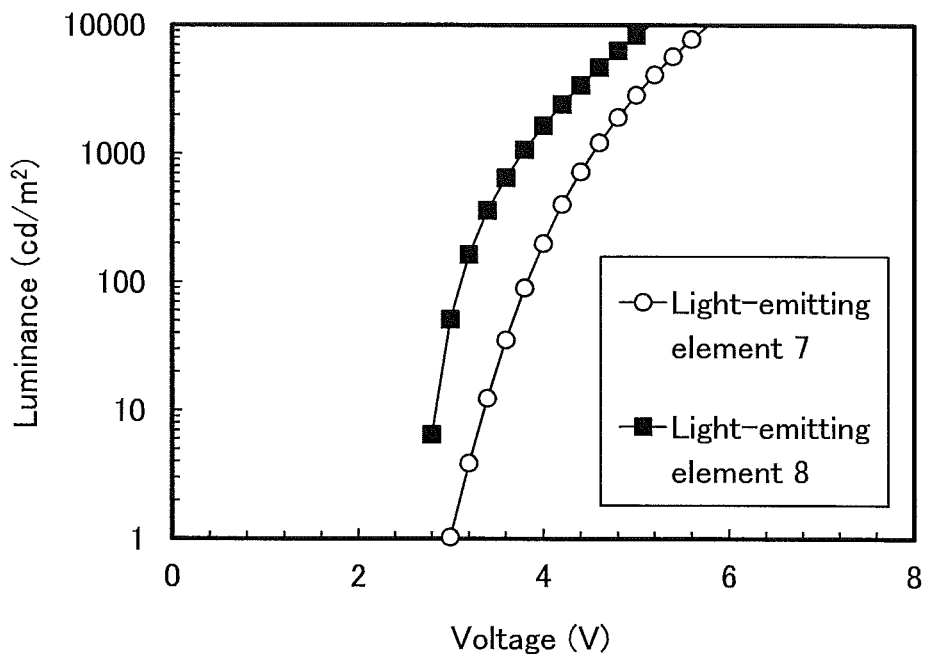
FIG. 41 shows luminance-voltage characteristics of a light-emitting element 7 and a light-emitting element 8.
Figure 42:
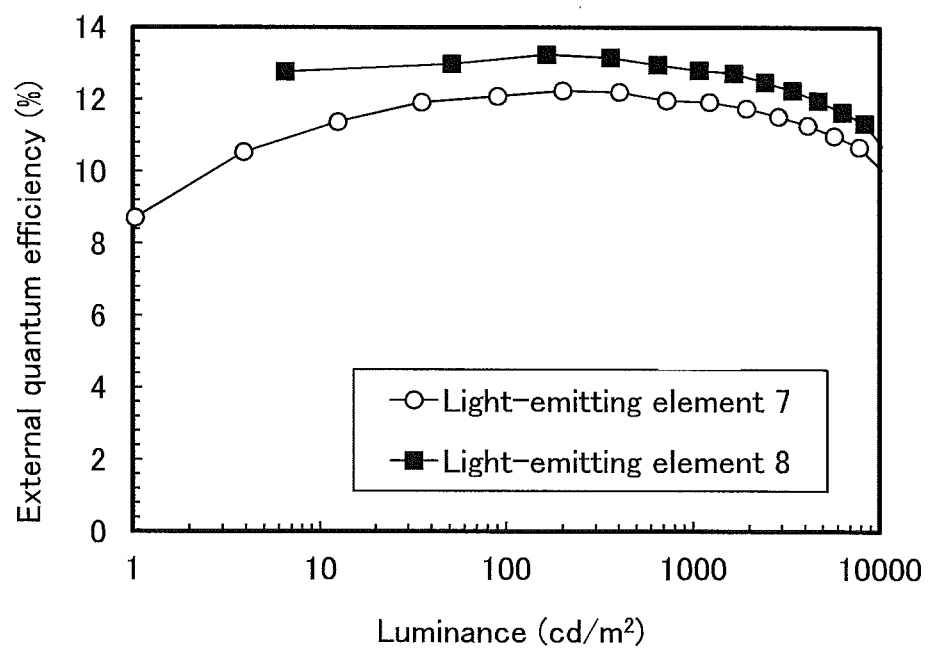
FIG. 42 shows external quantum efficiency-luminance characteristics of a light-emitting element 7 and a light-emitting element 8.

FIG. 39 shows the luminance-current density characteristics of the light-emitting element 7 and the light-emitting element 8; FIG. 40 shows the current efficiency-luminance characteristics thereof; FIG. 41 shows the luminance-voltage characteristics thereof; and FIG. 42 shows the external quantum efficiency-luminance characteristics thereof.

FIG. 40 shows that the light-emitting element 7 and the light-emitting element 8 have favorable current efficiency-luminance characteristics and thus have a high emission efficiency. Accordingly, 3,5mDBTP2Py and 3,5mDBFP2Py have a high triplet level and a wide band gap, and allow even a light-emitting substance emitting green phosphorescence to be effectively excited. Similarly, as shown in FIG. 42, the light-emitting element 7 and the light-emitting element 8 have favorable external quantum efficiency-luminance characteristics. Moreover, FIG. 41 shows that the light-emitting element 7 and the light-emitting element 8 have favorable luminance-voltage characteristics and thus have low driving voltage. This means that 3,5mDBTP2Py and 3,5mDBFP2Py have a high carrier-transport property. FIG. 39 also shows that the light-emitting element 7 and the light-emitting element 8 have favorable luminance-current density characteristics.

The above results show that the light-emitting element 7 that contains 3,5mDBTP2Py and the light-emitting element 8 that contains 3,5mDBFP2Py have favorable characteristics including a high emission efficiency.

Figure 43:
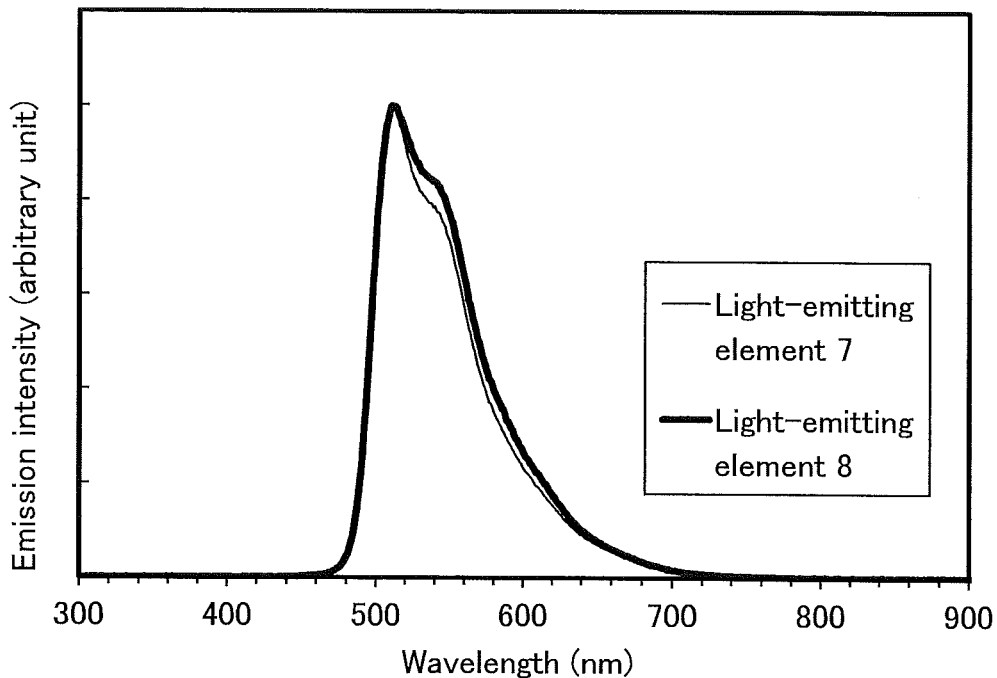
FIG. 43 shows emission spectra of a light-emitting element 7 and a light-emitting element 8.

FIG. 43 shows emission spectra at the time when a current was made to flow in the fabricated light-emitting elements at a current density of 2.5 mA/cm$^2$. FIG. 43 shows that the light-emitting element 7 and the light-emitting element 8 emit green light originating from [Ir(ppy)$_3$], which is the emission center substance.

Figure 44:
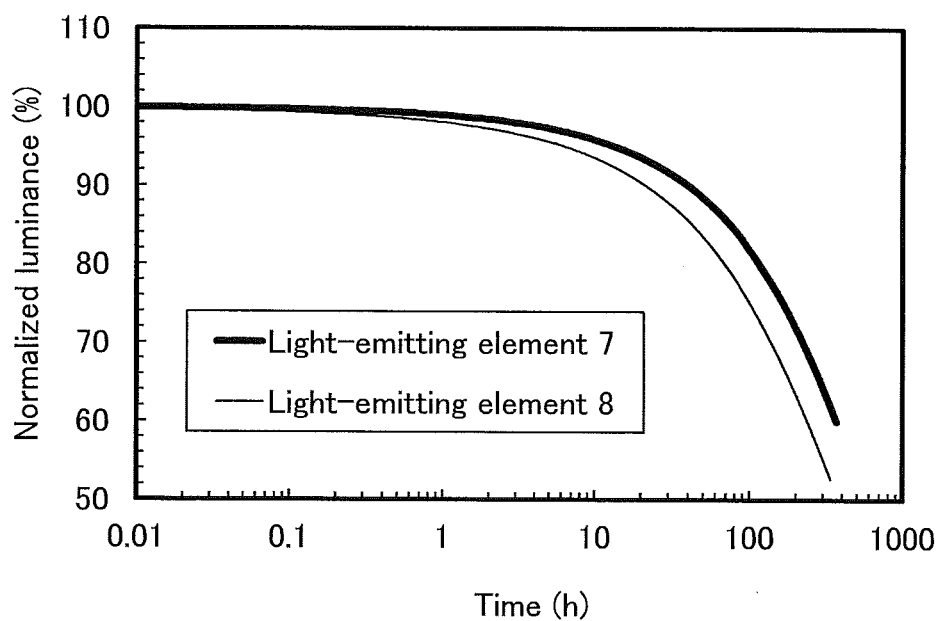
FIG. 44 shows time dependence of normalized luminance of a light-emitting element 7 and a light-emitting element 8.

Next, these light-emitting elements were subjected to reliability tests. In the reliability tests, a change in luminance (normalized luminance) over driving time was measured with an initial luminance taken as 100% under the conditions where the initial luminance was 5000 cd/m$^2$ and the current density was constant. FIG. 44 shows the results. The above results show that the light-emitting element 7 and the light-emitting element 8 have high reliability.

EXAMPLE 9

This example will describe the reliability of light-emitting elements (light-emitting elements 9 to 13 and comparative light-emitting elements 3 and 4), which are different in a material of a hole-transport layer, a host material of a light-emitting layer, and a material of an electron-transport layer.

Molecular structures of organic compounds that were used in this example are shown by Structural Formulae (i), (ii), (iv), (v), (ix), (x), (xii), and (xiii). The element structure in FIG. 1A was employed.

(i)
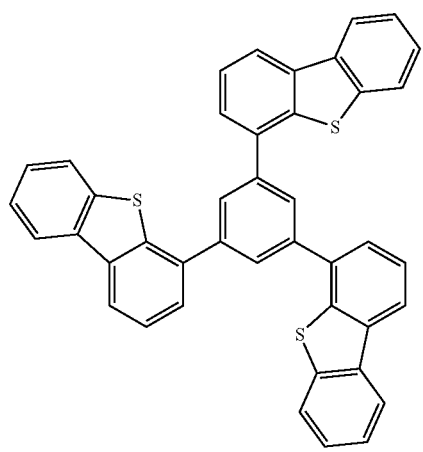
DBT3P-II (ii)
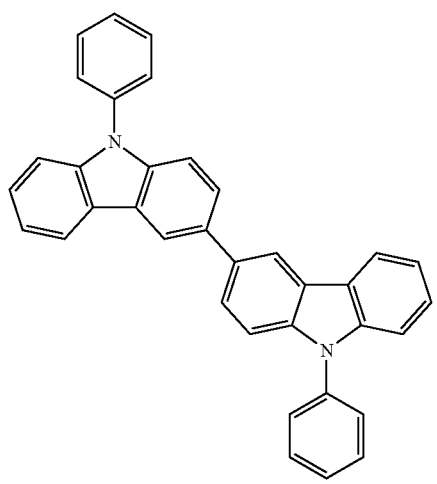
PCCP (iii)
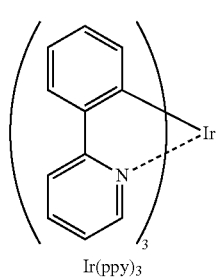
Ir(ppy)₃

(v)
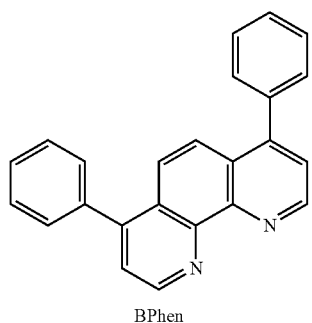
BPhen

-continued (ix)
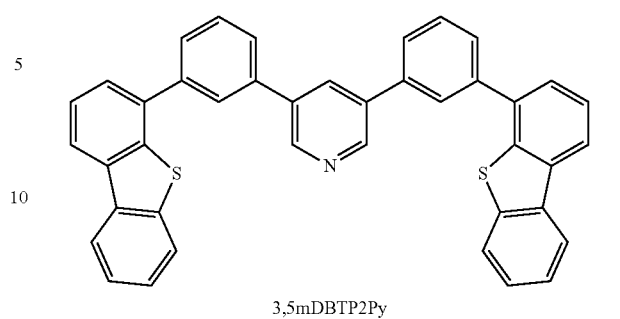
3,5mDBTP2Py (x)
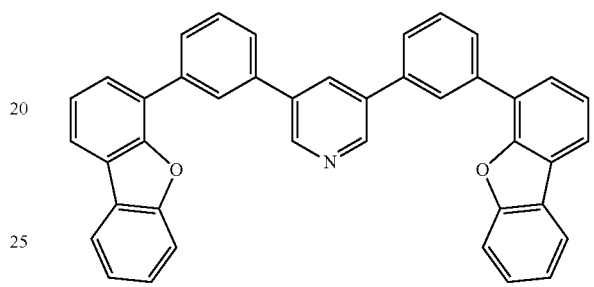
3,5mDBFP2Py (xii)
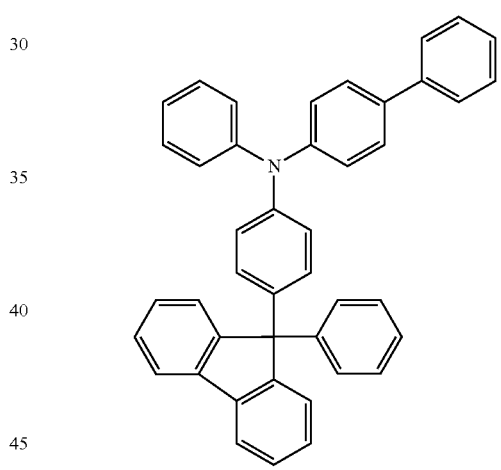
BPAFLP (xiii)
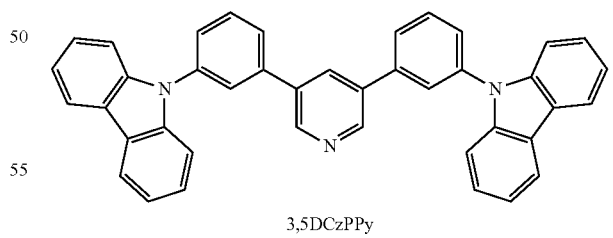
3,5DCzPPy <<Fabrication of Light-Emitting Element 9>>

First, a glass substrate, over which a film of indium tin oxide containing silicon (ITSO) was formed to a thickness of 110 nm as the first electrode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, 4,4',4''-(benzene-1,3,5-triyl)tri(dibenzothiophene) (abbreviation: DBT3P-II) represented by Structural Formula (i) and molybdenum(VI) oxide were deposited by co-evaporation so that the weight ratio of DBT3P-II to molybdenum oxide was 4:2, whereby the hole-injection layer 111 was formed. The thickness was set to 60 nm.

Next, 3,3'-bis(9-phenyl-9H-carbazole) (abbreviation: PCCP) represented by Structural Formula (ii) was deposited by evaporation to a thickness of 20 nm, whereby the hole-transport layer 112 was formed.

Moreover, 3,5-bis[3-(dibenzothiophen-4-yl)phenyl]pyridine (abbreviation: 3,5mDBTP2Py) represented by Structural Formula (ix), PCCP, and fac-tris(2-phenylpyridine)iridium (abbreviation: [Ir(ppy)$_3$]) represented by Structural Formula (iv) were co-deposited by evaporation to a thickness of 40 nm on the hole-transport layer 112 so that 3,5mDBTP2Py:PCCP:[Ir(ppy)$_3$]=0.8:0.2:0.06 (weight ratio), whereby the light-emitting layer 113 was formed.

Next, 3,5mDBTP2Py was deposited by evaporation to a thickness of 10 nm, and then bathophenanthroline (abbreviation: BPhen) represented by Structural Formula (v) was deposited by evaporation to a thickness of 15 nm, whereby the electron-transport layer 114 was formed.

Then, lithium fluoride was deposited by evaporation to a thickness of 1 nm on the electron-transport layer 114, whereby the electron-injection layer 115 was formed. Lastly, a film of aluminum was formed to a thickness of 200 nm as the second electrode 102 which serves as a cathode. Thus, the light-emitting element 9 was completed. Note that in all the above evaporation steps, evaporation was performed by a resistance-heating method.

<<Fabrication of Light-Emitting Element 10>>

The light-emitting element 10 was fabricated in a manner similar to that of the light-emitting element 9 except that in the hole-transport layer, 4-phenyl-4'-(9-phenylfluoren-9-yl)triphenylamine (abbreviation: BPAFLP) represented by Structural Formula (xii) was used instead of PCCP.

<<Fabrication of Light-Emitting Element 11>>

The light-emitting element 11 was fabricated in a manner similar to that of the light-emitting element 9 except that 3,5-bis[3-(dibenzofuran-4-yl)phenyl]pyridine (abbreviation: 3,5mDBFP2Py) represented by Structural Formula (x) was used instead of 3,5mDBTP2Py.

<<Fabrication of Light-Emitting Element 12>>

The light-emitting element 12 was fabricated in a manner similar to that of the light-emitting element 10 except that 3,5-bis[3-(dibenzofuran-4-yl)phenyl]pyridine (abbreviation: 3,5mDBFP2Py) represented by Structural Formula (x) was used instead of 3,5mDBTP2Py.

<<Fabrication of Comparative Light-Emitting Element 3>>

The comparative light-emitting element 3 was fabricated in a manner similar to that of the light-emitting element 9 except that 3,5-bis[3-(9H-carbazol-9-yl)phenyl]pyridine (abbreviation: 35DCzPPy) represented by Structural Formula (xiii) was used instead of 3,5mDBTP2Py.

<<Fabrication of Comparative Light-Emitting Element 4>>

The comparative light-emitting element 4 was fabricated in a manner similar to that of the light-emitting element 10 except that 3,5-bis[3-(9H-carbazol-9-yl)phenyl]pyridine (abbreviation: 35DCzPPy) represented by Structural Formula (xiii) was used instead of 3,5mDBTP2Py.

The table below lists the materials used in the hole-transport layers of the light-emitting elements 9 to 12 and the comparative light-emitting elements 3 and 4, the host materials used in the light-emitting layers thereof, and the materials used in the electron-transport layers thereof.

TABLE 1

|  | Hole-transport Layer | Host Material and Electron-transport Layer |
|---|---|---|
| Light-emitting Element 9 | PCCP | 3,5mDBTP2Py |
| Light-emitting Element 10 | BPAFLP | 3,5mDBTP2Py |
| Light-emitting Element 11 | PCCP | 3,5mDBFP2Py |
| Light-emitting Element 12 | BPAFLP | 3,5mDBFP2Py |
| Comparative Light-emitting Element 3 | PCCP | 35DCzPPy |
| Comparative Light-emitting Element 4 | BPAFLP | 35DCzPPy |

Figure 45:
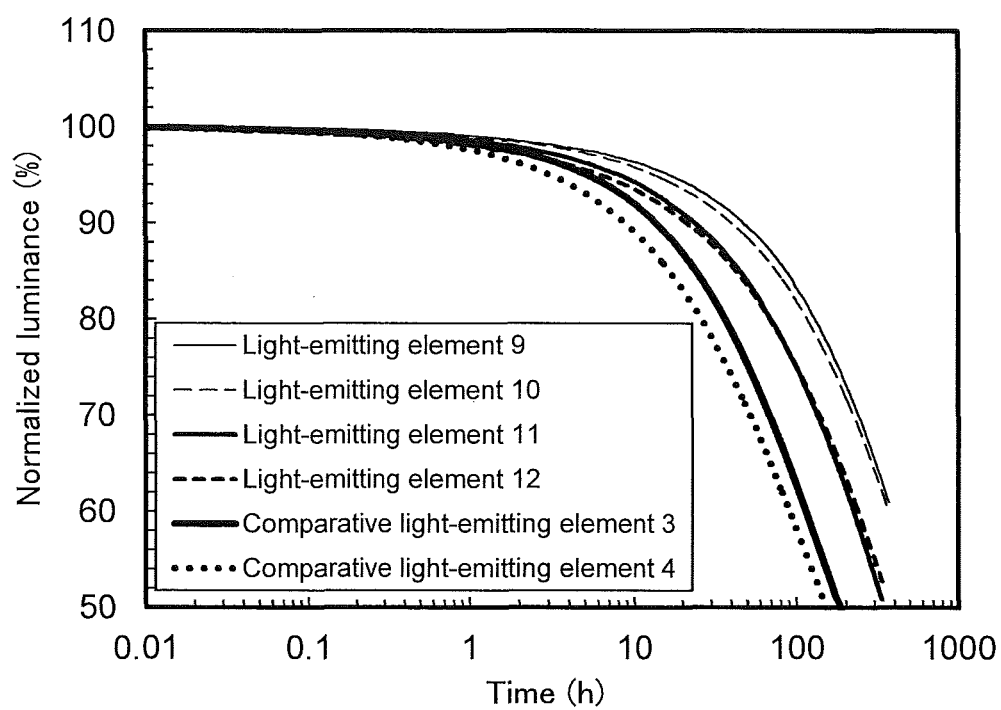
FIG. 45 shows time dependence of normalized luminance of light-emitting elements 9 to 12 and comparative light-emitting elements 3 and 4.

Next, these light-emitting elements were subjected to reliability tests. In the reliability tests, a change in luminance (normalized luminance) over driving time was measured with an initial luminance taken as 100% under the conditions where the initial luminance was 5000 cd/m$^2$ and the current density was constant. FIG. 45 shows the results.

The luminance of the comparative light-emitting elements 3 and 4 decreased to 50% of the initial luminance in 190 hours and 150 hours, respectively. Meanwhile, the light-emitting elements 9 and 10 respectively kept 61% and 60% of the initial luminance after 370 hours elapsed, and the light-emitting elements 11 and 12 respectively kept 51% and 53% of the initial luminance after 340 hours elapsed. The results revealed that a light-emitting element that uses the organic compound of one embodiment of the present invention is highly reliable.

This application is based on Japanese Patent Application serial no. 2013-150305 filed with Japan Patent Office on Jul. 19, 2013, the entire contents of which are hereby incorporated by reference.

What is claimed is:

1. An organic compound represented by General Formula (G0),

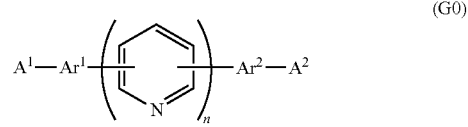

wherein A$^1$ and A$^2$ separately represent any one of a dibenzofuranyl group and a dibenzothiophenyl group,
wherein Ar$^1$ and Ar$^2$ separately represent an arylene group having 6 to 13 carbon atoms, and
wherein n is 2.

2. The organic compound according to claim 1, wherein the organic compound is represented by General Formula (G2),

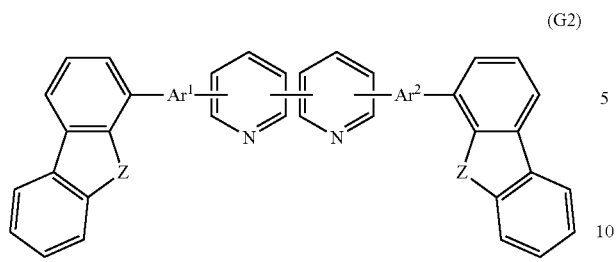

wherein Z represents any one of an oxygen atom and a sulfur atom.

3. The organic compound according to claim 1, wherein the organic compound is represented by Structural Formula (100),

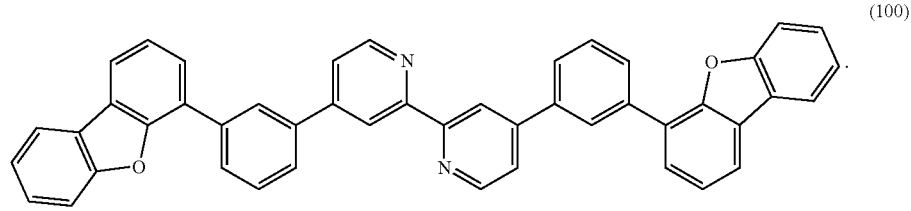 [SMILES: c1cc(-c2ccnc(-c3cc(-c4cccc(-c5cccc6c5oc5ccccc56)c4)ccn3)c2)cc(-c2cccc3c2oc2ccccc23)c1 ; "."]

4. The organic compound according to claim 1, wherein the organic compound is represented by Structural Formula (200),

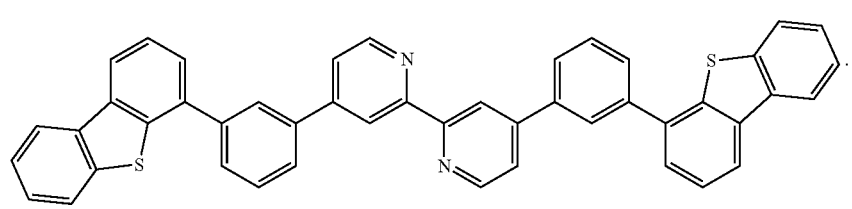

5. A light-emitting element comprising:
a pair of electrodes; and
a layer comprising the organic compound according to claim 1 between the pair of electrodes.

6. The light-emitting element according to claim 5, wherein the layer comprises at least a light-emitting layer, and
wherein the light-emitting layer comprises the organic compound.

7. A display module comprising the light-emitting element according to claim 5.

8. A lighting module comprising the light-emitting element according to claim 5.

9. An electronic device comprising the light-emitting element according to claim 5.

10. A light-emitting device comprising:
the light-emitting element according to claim 5; and
a unit for controlling the light-emitting element.

11. A display device comprising:
the light-emitting element according to claim 5 in a display portion; and
a unit for controlling the light-emitting element.

12. A lighting device comprising:
the light-emitting element according to claim 5 in a lighting portion; and
a unit for controlling the light-emitting element.

13. An organic compound represented by General Formula (G3),

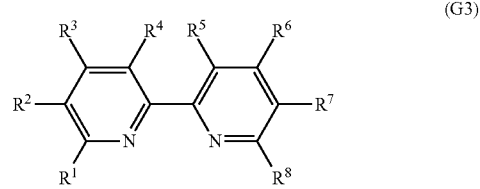

wherein one of $R^1$ to $R^4$ is a group represented by General Formula (A-1), wherein the others of $R^1$ to $R^4$ separately represent any one of hydrogen, an alkyl group having 1 to 6 carbon atoms, and an aryl group having 6 to 13 carbon atoms, wherein one of $R^5$ to $R^8$ is a group represented by General Formula (A-2), wherein the others of $R^5$ to $R^8$ separately represent any one of hydrogen, an alkyl group having 1 to 6 carbon atoms, and an aryl group having 6 to 13 carbon atoms,

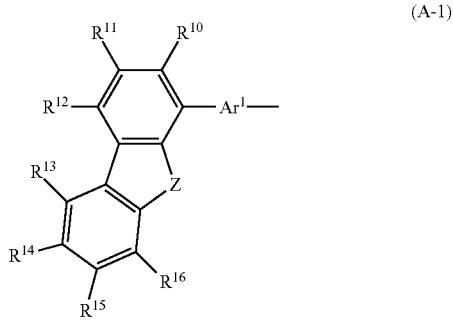

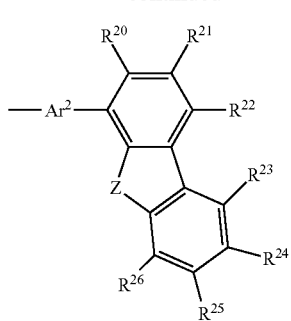

(A-2)

wherein $R^{10}$ to $R^{16}$ and $R^{20}$ to $R^{26}$ separately represent any one of hydrogen, an alkyl group having 1 to 6 carbon atoms, and an aryl group having 6 to 13 carbon atoms, wherein $Ar^1$ and $Ar^2$ separately represent an arylene group having 6 to 13 carbon atoms, and wherein Z represents any one of an oxygen atom and a sulfur atom.

14. The organic compound according to claim 13, wherein the organic compound is represented by General Formula (G4),

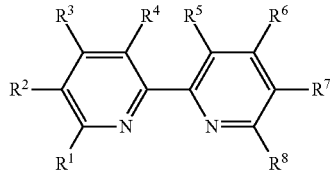

(G4)

wherein one of $R^1$ to $R^4$ is a group represented by General Formula (A-3), wherein the others of $R^1$ to $R^4$ separately represent any one of hydrogen, an alkyl group having 1 to 6 carbon atoms, and an aryl group having 6 to 13 carbon atoms, wherein one of $R^5$ to $R^8$ is a group represented by General Formula (A-4), wherein the others of $R^5$ to $R^8$ separately represent any one of hydrogen, an alkyl group having 1 to 6 carbon atoms, and an aryl group having 6 to 13 carbon atoms,

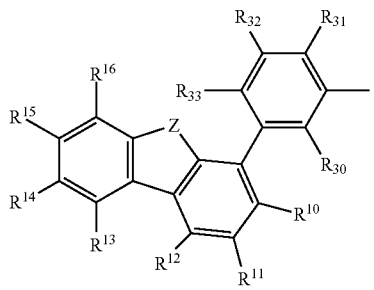

(A-3)

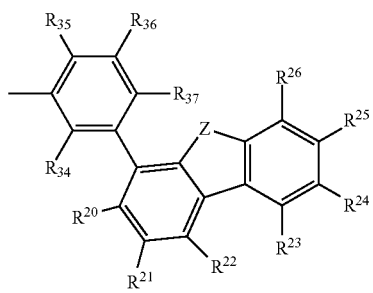

(A-4)

wherein $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms, and wherein Z represents any one of an oxygen atom and a sulfur atom.

15. The organic compound according to claim 13, wherein the organic compound is represented by General Formula (G5),

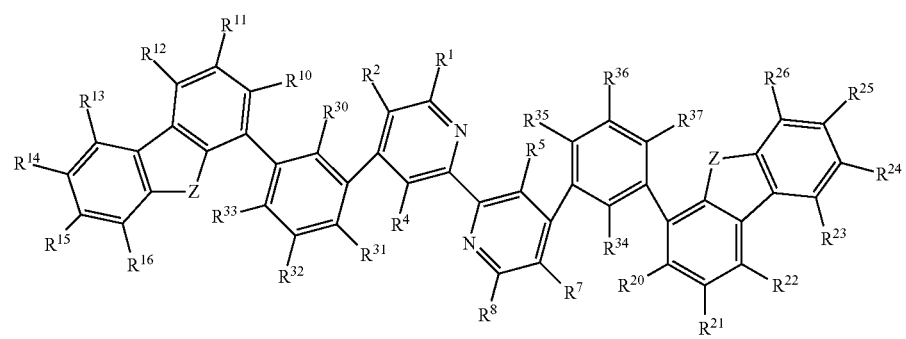

(G5)

wherein $R^1$, $R^2$, $R^4$, $R^5$, $R^7$, $R^8$, $R^{10}$ to $R^{16}$, $R^{20}$ to $R^{26}$, and $R^{30}$ to $R^{37}$ separately represent any one of hydrogen, an alkyl group having 1 to 6 carbon atoms, and an aryl group having 6 to 13 carbon atoms, and wherein Z represents any one of an oxygen atom and a sulfur atom.

16. A light-emitting element comprising:

a pair of electrodes; and a layer comprising the organic compound according to claim 13 between the pair of electrodes.

17. A light-emitting device comprising:

the light-emitting element according to claim 16; and a unit for controlling the light-emitting element.

18. A display device comprising:

the light-emitting element according to claim 16 in a display portion; and a unit for controlling the light-emitting element.

19. A lighting device comprising:

the light-emitting element according to claim 16 in a lighting portion; and a unit for controlling the light-emitting element.

* * * * *